(12) United States Patent
Sinha et al.

(10) Patent No.: US 8,219,941 B2
(45) Date of Patent: Jul. 10, 2012

(54) RANGE PATTERN DEFINITION OF SUSCEPTIBILITY OF LAYOUT REGIONS TO FABRICATION ISSUES

(75) Inventors: Subarnarekha Sinha, Menlo Park, CA (US); Charles C. Chiang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 559 days.

(21) Appl. No.: 12/362,490

(22) Filed: Jan. 29, 2009

(65) Prior Publication Data

US 2009/0132980 A1    May 21, 2009

Related U.S. Application Data

(62) Division of application No. 11/394,466, filed on Mar. 31, 2006, now Pat. No. 7,703,067.

(51) Int. Cl.
 *G06F 17/50* (2006.01)
(52) U.S. Cl. ............................................. 716/51; 716/52
(58) Field of Classification Search .................. 716/52, 716/54, 55, 56, 106, 51
See application file for complete search history.

(56) References Cited

U.S. PATENT DOCUMENTS

| | | | |
|---|---|---|---|
| 5,252,508 A | 10/1993 | Masuda | |
| 5,546,225 A | 8/1996 | Shiraishi | |
| 6,004,701 A | 12/1999 | Uno et al. | |
| 6,077,310 A | 6/2000 | Yamamoto et al. | |
| 6,282,696 B1 | 8/2001 | Garza et al. | |
| 6,324,675 B1 | 11/2001 | Dutta et al. | |
| 6,349,403 B1 | 2/2002 | Dutta et al. | |
| 6,470,489 B1 | 10/2002 | Chang et al. | |
| 6,553,559 B2 | 4/2003 | Liebmann et al. | |
| 6,598,218 B2 | 7/2003 | Lin | |
| 6,770,403 B2 | 8/2004 | Park et al. | |
| 6,787,459 B2 | 9/2004 | Moniwa et al. | |
| 6,915,493 B2 | 7/2005 | Moulding et al. | |
| 6,952,818 B2 | 10/2005 | Ikeuchi | |
| 6,998,205 B2 | 2/2006 | Huang | |
| 7,001,693 B2 | 2/2006 | Liebmann et al. | |
| 7,032,194 B1 | 4/2006 | Hsueh et al. | |
| 7,147,976 B2 | 12/2006 | Liebmann et al. | |
| 7,346,865 B2 | 3/2008 | Su et al. | |
| 7,503,029 B2 | 3/2009 | Sinha et al. | |

(Continued)

OTHER PUBLICATIONS

Office Action dated Jun. 9, 2008 in U.S. Appl. No. 11/394,466, 9 pages.

(Continued)

*Primary Examiner* — Vuthe Siek

(74) *Attorney, Agent, or Firm* — Fenwick & West LLP

(57) ABSTRACT

A memory is encoded with a data structure that represents a pattern having a range for one or more dimensions and/or positions of line segments therein. The data structure identifies two or more line segments that are located at a boundary of the pattern. The data structure also includes at least one set of values that identify a maximum limit and a minimum limit (i.e. the range) between which relative location and/or dimension of an additional line segment of the pattern in a portion of a layout of an integrated circuit (IC) chip, represents a defect in the IC chip when fabricated. In most embodiments, multiple ranges are specified in such a range defining pattern for example a width range is specified for the width of a trace of material in the layout and a spacing range is specified for the separation distance between two adjacent traces in the layout.

22 Claims, 41 Drawing Sheets

U.S. PATENT DOCUMENTS

| | | | |
|---|---|---|---|
| 7,703,067 B2 | 4/2010 | Sinha et al. | |
| 2004/0248043 A1 | 12/2004 | Shiraishi | |
| 2005/0086618 A1 | 4/2005 | Ito et al. | |
| 2005/0106473 A1 | 5/2005 | Huang | |
| 2006/0046160 A1 | 3/2006 | Wallace et al. | |
| 2006/0123380 A1 | 6/2006 | Ikeuchi | |
| 2006/0262977 A1* | 11/2006 | Mitsui | 382/209 |
| 2007/0128526 A1 | 6/2007 | Wallace et al. | |
| 2007/0230770 A1 | 10/2007 | Kulkarni et al. | |
| 2007/0294648 A1 | 12/2007 | Allen et al. | |
| 2008/0005704 A1 | 1/2008 | Miloslavsky et al. | |
| 2008/0076036 A1 | 3/2008 | Haffner | |
| 2009/0138835 A1 | 5/2009 | Sinha et al. | |
| 2010/0131909 A1 | 5/2010 | Miloslavsky et al. | |

OTHER PUBLICATIONS

Amendment dated Oct. 9, 2008 in U.S. Appl. No. 11/394,466, 18 pages.
Office Action dated Dec. 17, 2008 in U.S. Appl. No. 11/394,466, 4 pages.
Amendment dated Jan. 5, 2009 in U.S. Appl. No. 11/394,466, 8 pages.
Office Action dated Mar. 16, 2009 in U.S. Appl. No. 11/394,466, 9 pages.
Amendment dated Jul. 16, 2009 in U.S. Appl. No. 11/394,466, 20 pages.
Notice of Allowance dated Dec. 3, 2009 in U.S. Appl. No. 11/394,466, 4 pages.
Office Action dated Jun. 9, 2008 in U.S. Appl. No. 11/395,006, 5 pages.
Amendment dated Oct. 9, 2008 in U.S. Appl. No. 11/395,006, 12 pages.
Notice of Allowance dated Jan. 12, 2009 in U.S. Appl. No. 11/395,006, 6 pages.
Office Action dated Nov. 30, 2007 in U.S. Appl. No. 11/479,422, 8 pages.
Amendment dated Mar. 31, 2008 in U.S. Appl. No. 11/479,422, 27 pages.
Final Office Action dated Jul. 3, 2008 in U.S. Appl. No. 11/479,422, 8 pages.
Amendment dated Oct. 31, 2008 in U.S. Appl. No. 11/479,422, 17 pages.
Office Action dated Jan. 15, 2009 in U.S. Appl. No. 11/479,422, 9 pages.
Amendment dated May 15, 2009 in U.S. Appl. No. 11/479,422, 14 pages.
Office Action dated Aug. 31, 2009 in U.S. Appl. No. 11/479,422, 7 pages.
Amendment dated Sep. 26, 2009 in U.S. Appl. No. 11/479,422, 10 pages.
Final Office Action dated Dec. 9, 2009 in U.S. Appl. No. 11/479,422, 12 pages.
Amendment dated Mar. 9, 2010 in U.S. Appl. No. 11/479,422, 15 pages.
Office Action dated Dec. 8, 2010 in U.S. Appl. No. 12/696,427, 11 pages.
Amendment dated Mar. 8, 2011 in U.S. Appl. No. 12/696,427, 16 pages.
U.S. Appl. No. 11/479,422, 59 pages.
U.S. Appl. No. 12/696,427, 59 pages.
Entire Prosecution History of U.S. Appl. No. 11/394,466, filed Mar. 31, 2006 by Subarnarekha Sinha et al.
Entire Prosecution History of U.S. Appl. No. 11/395,006, filed Mar. 31, 2006 by Subarnarekha Sinha et al. issued as US Patent 7,503,029.
Entire Prosecution History of U.S. Appl. No. 12/362,721, filed Jan. 30, 2009 by Subarnarekha Sinha et al.
Charras, C. et al. "Handbook of Exact String-Matching Algorithms", 2004, London: King's College, pp. 1-17.
Gupta, P. et al., "Manufacturing-Aware Physical Design", Computer Aided Design, 2003 International Conference on ICCAD-2003, 2003, pp. 681-687.
Author unknown, Knuth-Morris-Pratt string matching, ICS 161: Design and Analysis of Algorithms Lecture notes for Feb. 27, 1996, 12 pgs.
Huang, L-D. et al. Optical Proximity Correction (OPC)—Friendly Maze Routing, DAC 2004, Jun. 7-11, San Diego, CA, pp. 186-191.
Boyer, R. S. et al. "A fast string matching algorithm", Communications of ACM, vol. 20, 1977, pp. 762-772.
Franek, F. et al. "A Simple Fast Hybrid Pattern—Matching Algorithm", Sixteenth Annual Symposium on Combinatorial Pattern Matching (CPM 2005), Lecture Notes in Computer Science, vol. 3537, pp. 288-297.
Cormen, T. H. et al., "Introduction to Algorithms", 1989, The MIT Press, Cambridge, Massachusetts London, England; McGraw-Hill Book Company, New York St. Louis San Francisco Montreal Toronto, 15 pgs.
Pan, D. Z. et al., "Manufacturability—Aware Physical Layout Optimizations", 2005, 5 pgs.
Mitra, J. et al., "RADAR: RET-Aware Detailed Routing Using Fast Lithography Simulations", DAC 2005, Jun. 13-17, 2005, Anaheim, CA, pp. 369-372.
Xu, G. et al., "Redundant—Via Enhanced Maze Routing for Yield Improvement", Proc. Of Asia and South Pacific Design Automation Conference, 2005, 4 pgs.
Kyoh, S. et al., "Lithography oriented DfM for 65nm and beyond", Design and Process Integration for Microelectronic Manufacturing IV, Proc. of SPIE, 2006, vol. 6156, 9 pgs.
Kotani, T. et al., "Development of Hot Spot Fixer (HSF)", Design and Process Integration for Microelectronic Manufacturing IV, Proc. of SPIE, 2006, vol. 6156, 8 pgs.
Kim, J. et al., "Hotspot Detection on Post-OPC Layout Using Full Chip Simulation Based Verification Tool: A Case Study with Aerial Image Simulation", Proceedings of SPIE, 2003, vol. 5256, Bellingham, WA, pp. 919-925.
Lucas K. et al., "Logic Design for Printability Using OPC Methods", Design & Test of Computer, IEEE, Jan.-Feb. 2006, vol. 23, Issue 1, pp. 30-37.
U.S. Appl. No. 11/394,466, 118 pages.
U.S. Appl. No. 11/395,006, 116 pages.
U.S. Appl. No. 12/362,721, 105 pages.
Entire Prosecution History of U.S. Appl. No. 11/479,422, Jun. 30, 2006.
United States Office Action, U.S. Appl. No. 12/696,427, Jun. 6, 2011, 11 pages.
United States Office Action, U.S. Appl. No. 12/362,721, Jul. 13, 2011, 9 pages.

* cited by examiner

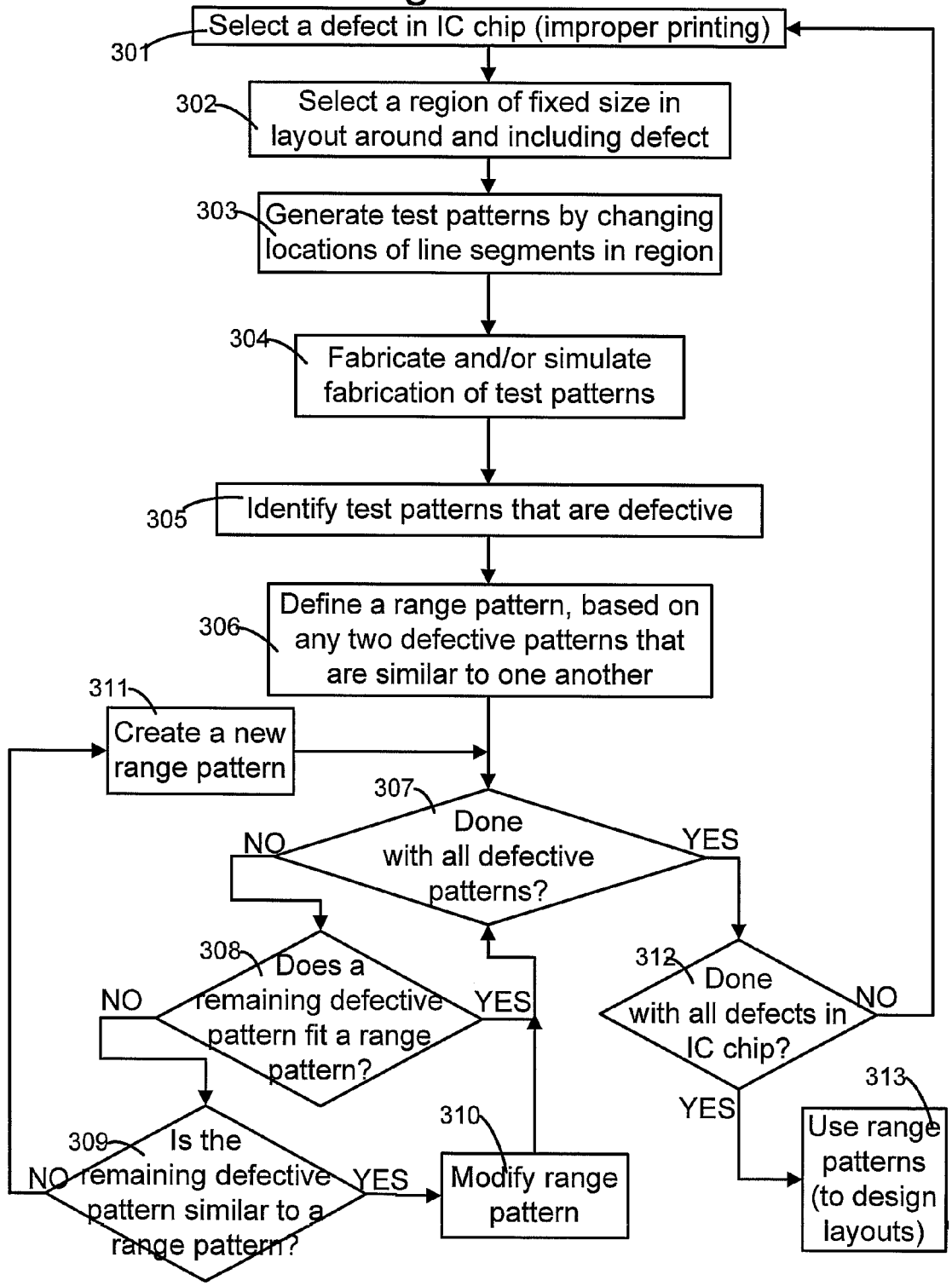

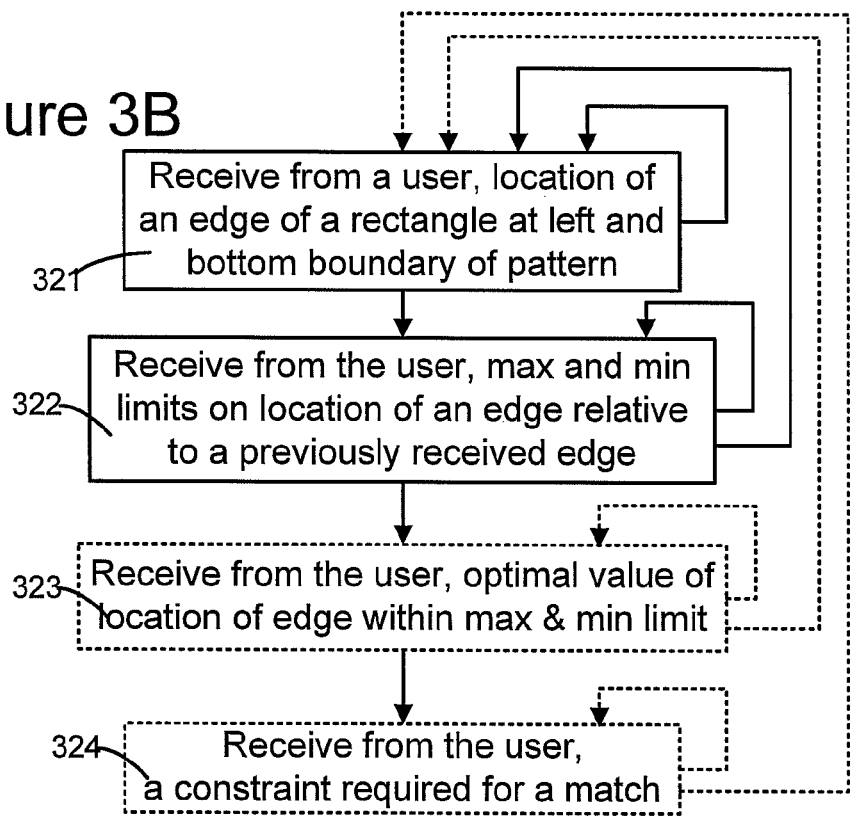
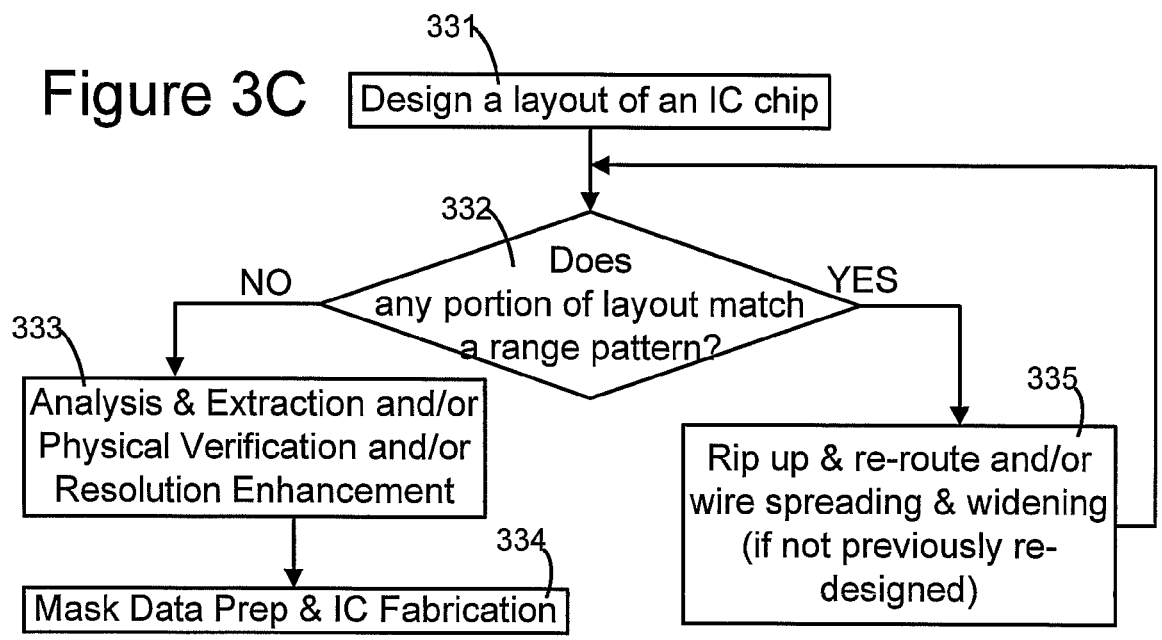

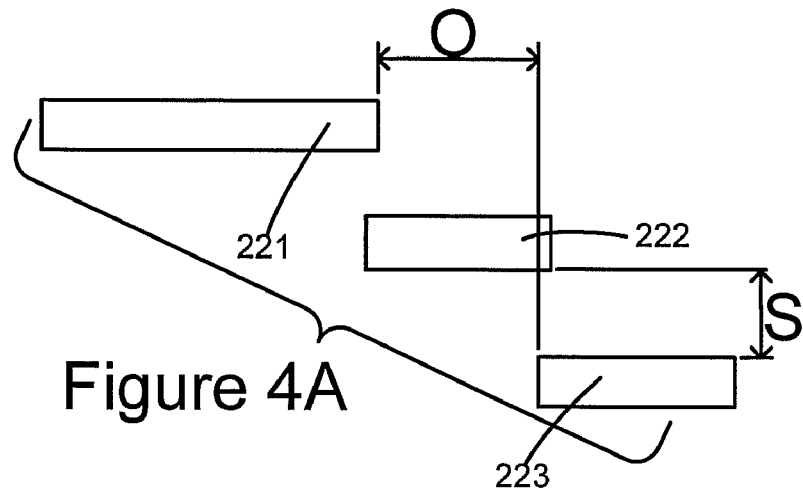
Figure 4A
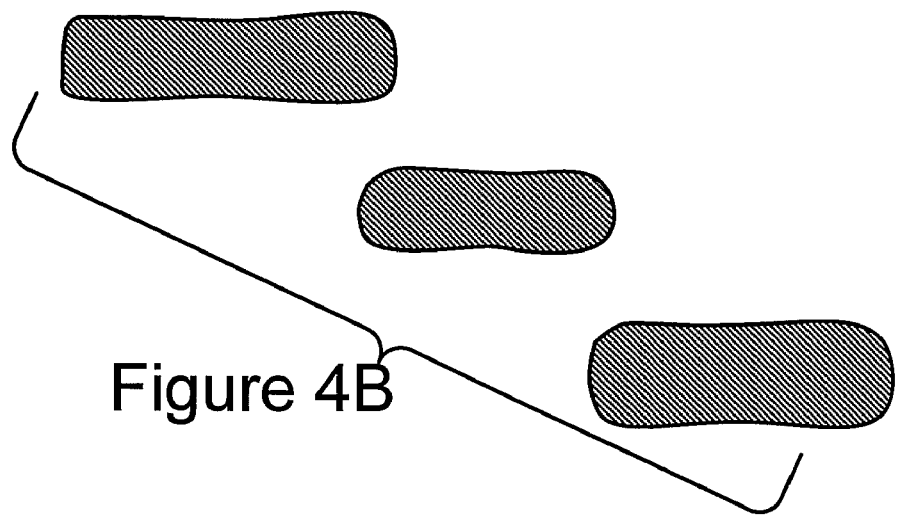
Figure 4B
Figure 5A
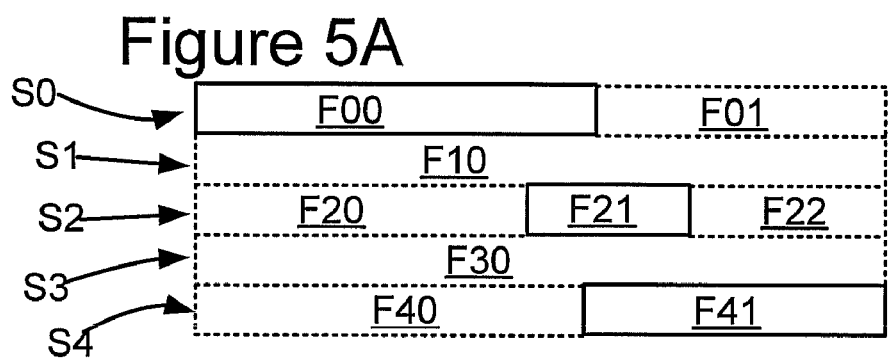

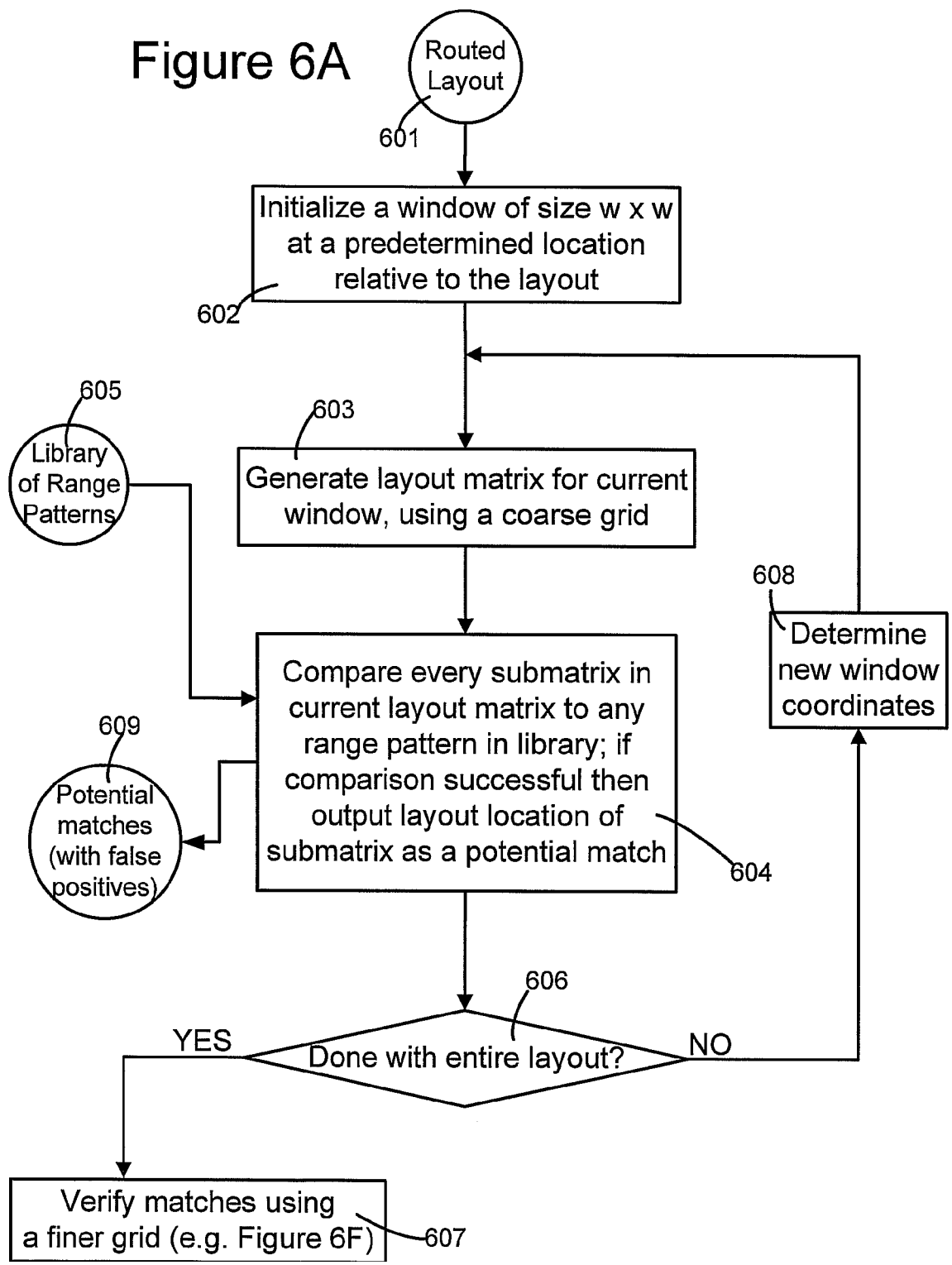

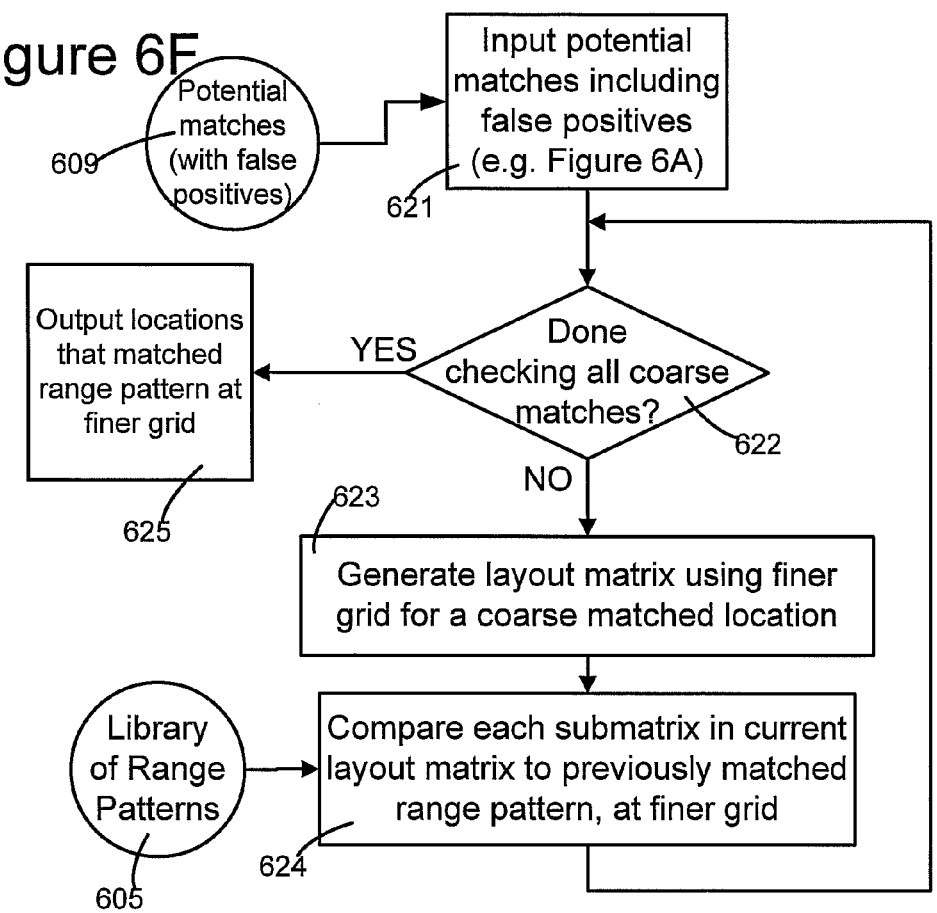
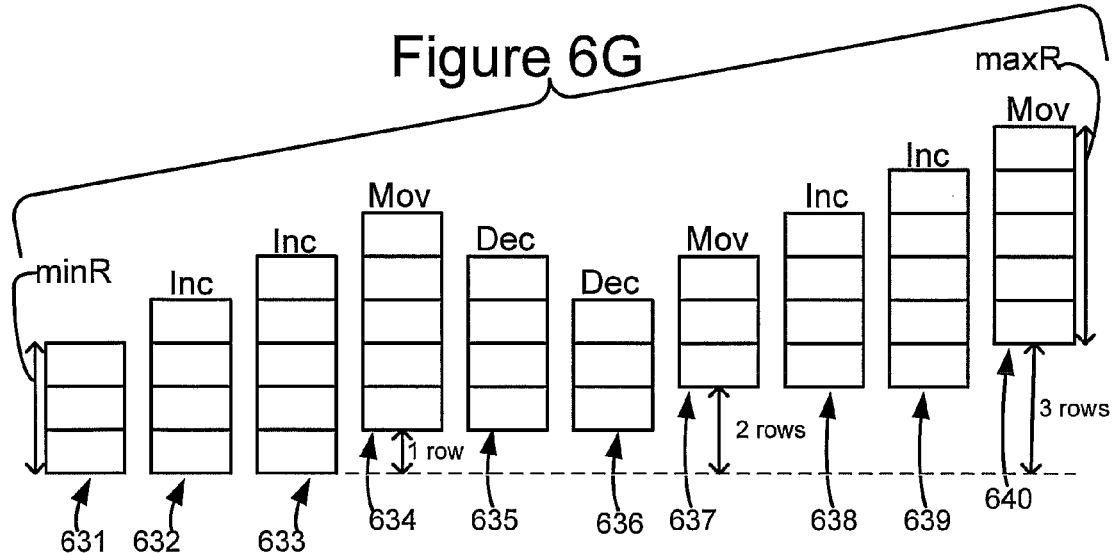

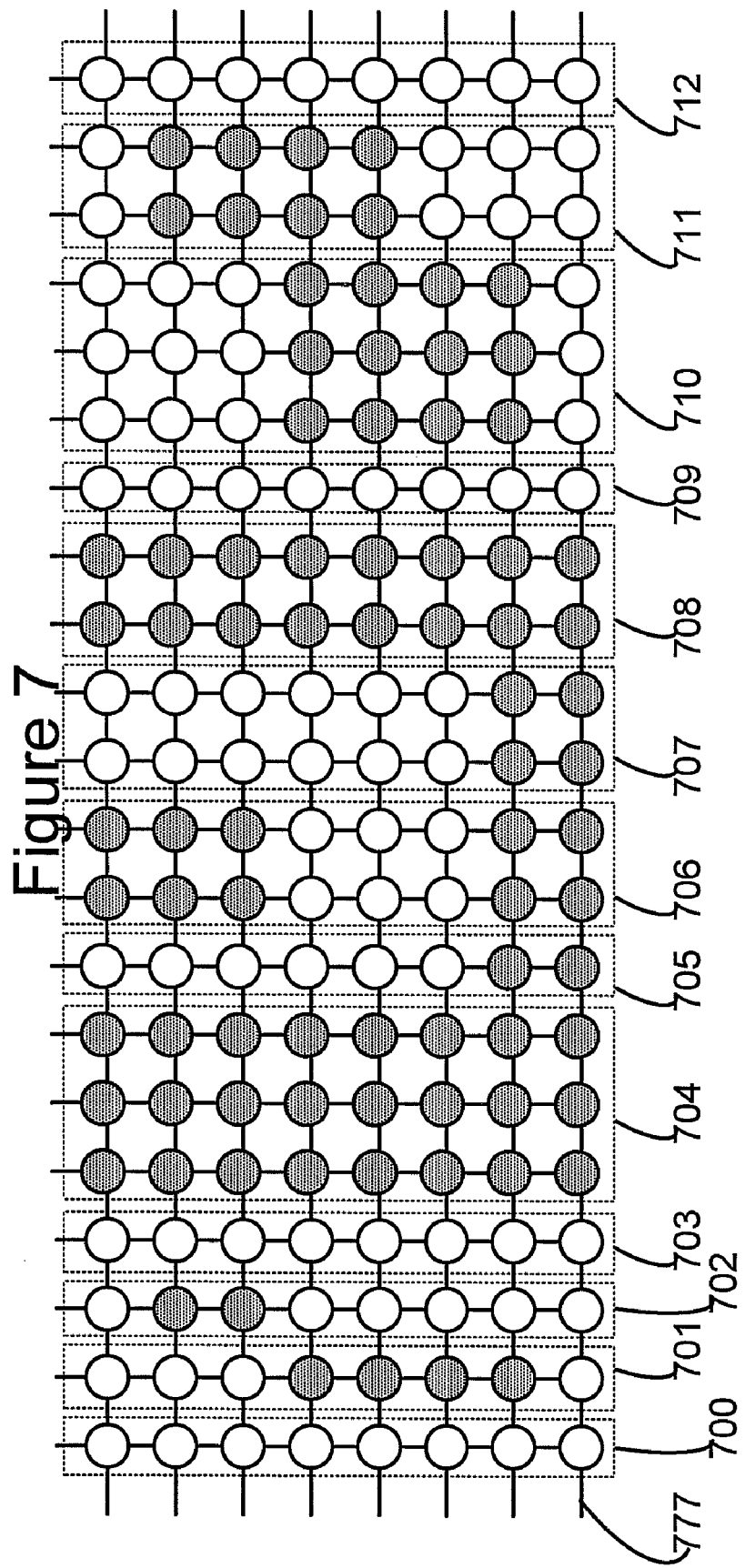

Figure 8C

|      | R0.l           | R0.r           | R1.l           | R1.r           | R2.l           | R2.r           |
|------|----------------|----------------|----------------|----------------|----------------|----------------|
| R0.l | (MN,MX)[MN]    | (MN,MX)[MN]    | (10,50)[MN]    | (MN,MX)[MN]    | (MN,MX)[MN]    | (MN,MX)[MN]    |
| R0.r | (MN,MX)[MN]    | (MN,MX)[MN]    | (MN,-1)[MN]    | (1,MX)[MN]     | (-50,MX)[MN]   | (MN,MX)[MN]    |
| R1.l | (-50,-10)[MN]  | (1,MX)[MN]     | (MN,MX)[MN]    | (200,500)[MN]  | (1,MX)[MN]     | (MN,MX)[MN]    |
| R1.r | (MN,-1)[MN]    | (MN,-1)[MN]    | (-500,-200)[MN]| (MN,MX)[MN]    | (MN,-1)[MN]    | (10,50)[MN]    |
| R2.l | (MN,MX)[MN]    | (MN,50)[MN]    | (MN,-1)[MN]    | (1,MX)[MN]     | (MN,MX)[MN]    | (MN,MX)[MN]    |
| R2.r | (MN,MX)[MN]    | (MN,MX)[MN]    | (MN,MX)[MN]    | (-50,-10)[MN]  | (MN,MX)[MN]    | (MN,MX)[MN]    |

Figure 8D

|      | R0.b             | R0.t           | R1.b             | R1.t             | R2.b             | R2.t             |
|------|------------------|----------------|------------------|------------------|------------------|------------------|
| R0.b | (MN,MX)[MN]      | (90,150)[90]   | (MN,MX)[MN]      | (-150,-90)[-90]  | (MN,MX)[MN]      | (MN,MX)[MN]      |
| R0.t | (-150,-90)[-90]  | (MN,MX)[MN]    | (MN,MX)[MN]      | (90,150)[90]     | (MN,MX)[MN]      | (MN,MX)[MN]      |
| R1.b | (MN,MX)[MN]      | (MN,MX)[MN]    | (MN,MX)[MN]      | (MN,MX)[MN]      | (MN,MX)[MN]      | (-150,-90)[-90]  |
| R1.t | (90,150)[90]     | (MN,MX)[MN]    | (-150,-90)[-90]  | (MN,MX)[MN]      | (-150,-90)[-90]  | (MN,MX)[MN]      |
| R2.b | (MN,MX)[MN]      | (MN,MX)[MN]    | (MN,MX)[MN]      | (90,150)[90]     | (MN,MX)[MN]      | (90,150)[90]     |
| R2.t | (MN,MX)[MN]      | (MN,MX)[MN]    | (90,150)[90]     | (MN,MX)[MN]      | (MN,MX)[MN]      | (MN,MX)[MN]      |

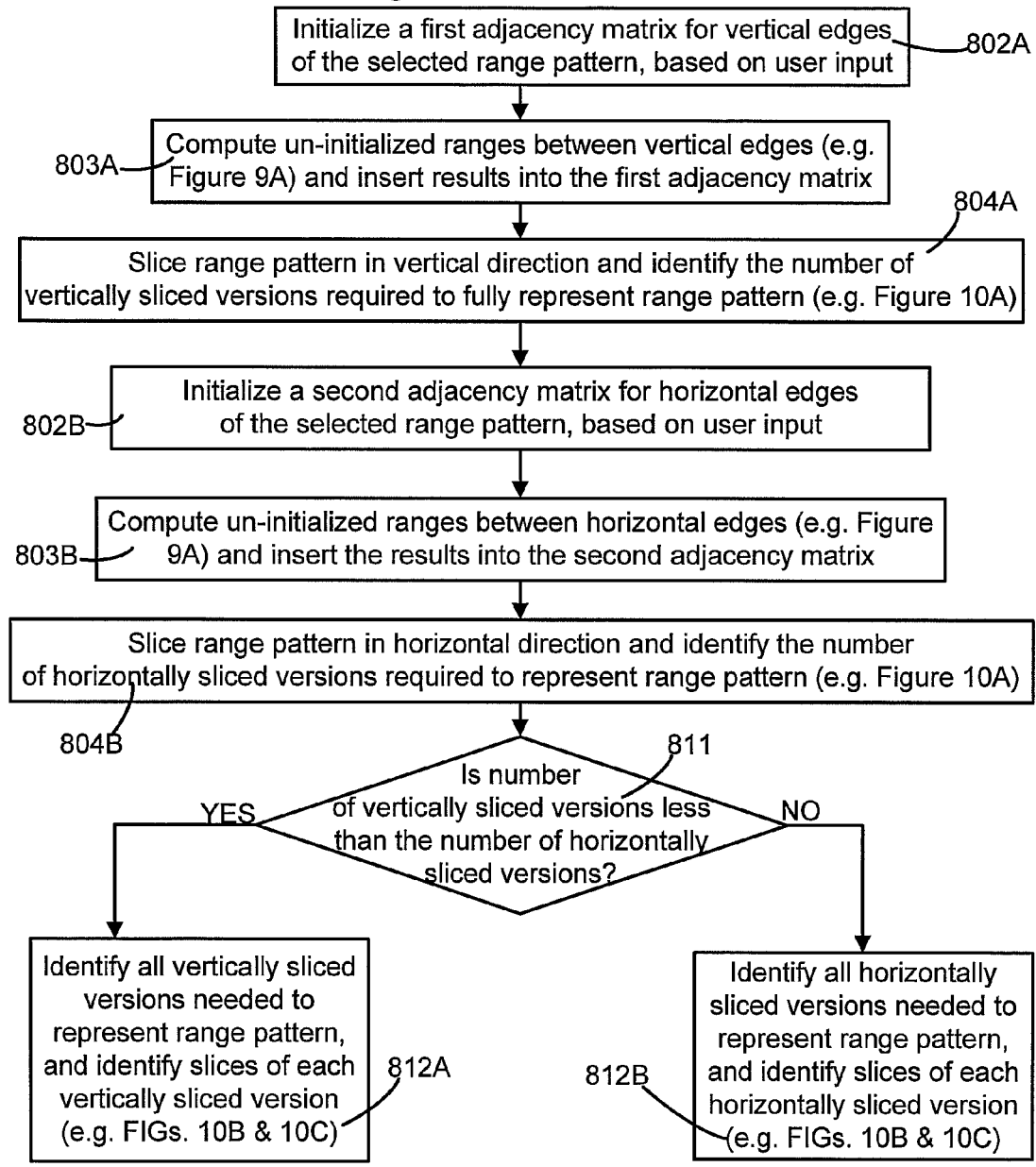

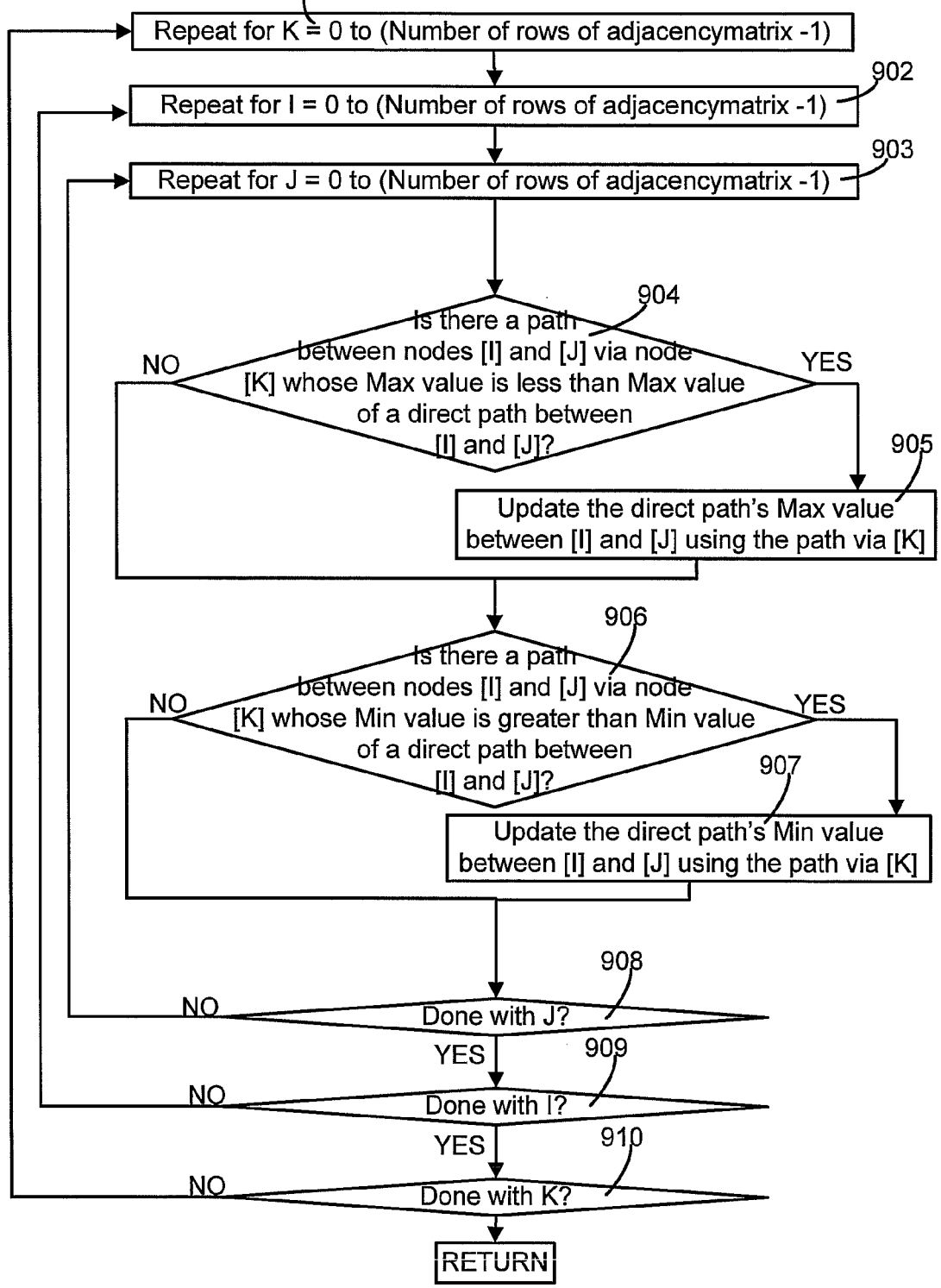

Figure 9B

|      | R0.l          | R0.r          | R1.l          | R1.r           | R2.l          | R2.r          |
|------|---------------|---------------|---------------|----------------|---------------|---------------|
| R0.l | [MN,MX)[MN]   | (11,549)[MN]  | (10,50)[MN]   | (210,550)[MN]  | (11,549)[MN]  | (220,600)[MN] |
| R0.r | (-549,-11)[MN]| [MN,MX)[MN]   | (-499,-1)[MN] | (1,499)[MN]    | (-50,498)[MN] | (11,549)[MN]  |
| R1.l | (-50,-10)[MN] | (1,499)[MN]   | [MN,MX)[MN]   | (200,500)[MN]  | (1,499)[MN]   | (210,550)[MN] |
| R1.r | (-550,-210)[MN]| (-499,-1)[MN]| (-500,-200)[MN]| [MN,MX)[MN]   | (-499,-1)[MN] | (10,50)[MN]   |
| R2.l | (-549,-11)[MN]| (-498,50)[MN] | (-499,-1)[MN] | (1,499)[MN]    | [MN,MX)[MN]   | (11,549)[MN]  |
| R2.r | (-600,-220)[MN]| (-549,-11)[MN]| (-550,-210)[MN]| (-50,-10)[MN] | (-549,-11)[MN]| [MN,MX)[MN]   |

Figure 9C

|      | R0.b          | R0.t          | R1.b           | R1.t           | R2.b           | R2.t           |
|------|---------------|---------------|----------------|----------------|----------------|----------------|
| R0.b | [MN,MX)[MN]   | (90,150)[90]  | (-300,-180)[-180]| (-150,-90)[-90]| (-600,-360)[-360]| (-450,-270)[-270]|
| R0.t | (-150,-90)[-90]| [MN,MX)[MN]  | (-450,-270)[-270]| (-300,-180)[-180]| (-750,-450)[-450]| (-600,-360)[-360]|
| R1.b | (180,300)[180]| (270,450)[270]| [MN,MX)[MN]    | (90,150)[90]   | (-300,-180)[-180]| (-150,-90)[-90] |
| R1.t | (90,150)[90]  | (180,300)[180]| (-150,-90)[-90]| [MN,MX)[MN]    | (-450,-270)[-270]| (-300,-180)[-180]|
| R2.b | (360,600)[360]| (450,750)[450]| (180,300)[180] | (270,450)[270] | [MN,MX)[MN]    | (90,150)[90]   |
| R2.t | (270,450)[270]| (360,600)[360]| (90,150)[90]   | (180,300)[180] | (-150,-90)[-90]| [MN,MX)[MN]    |

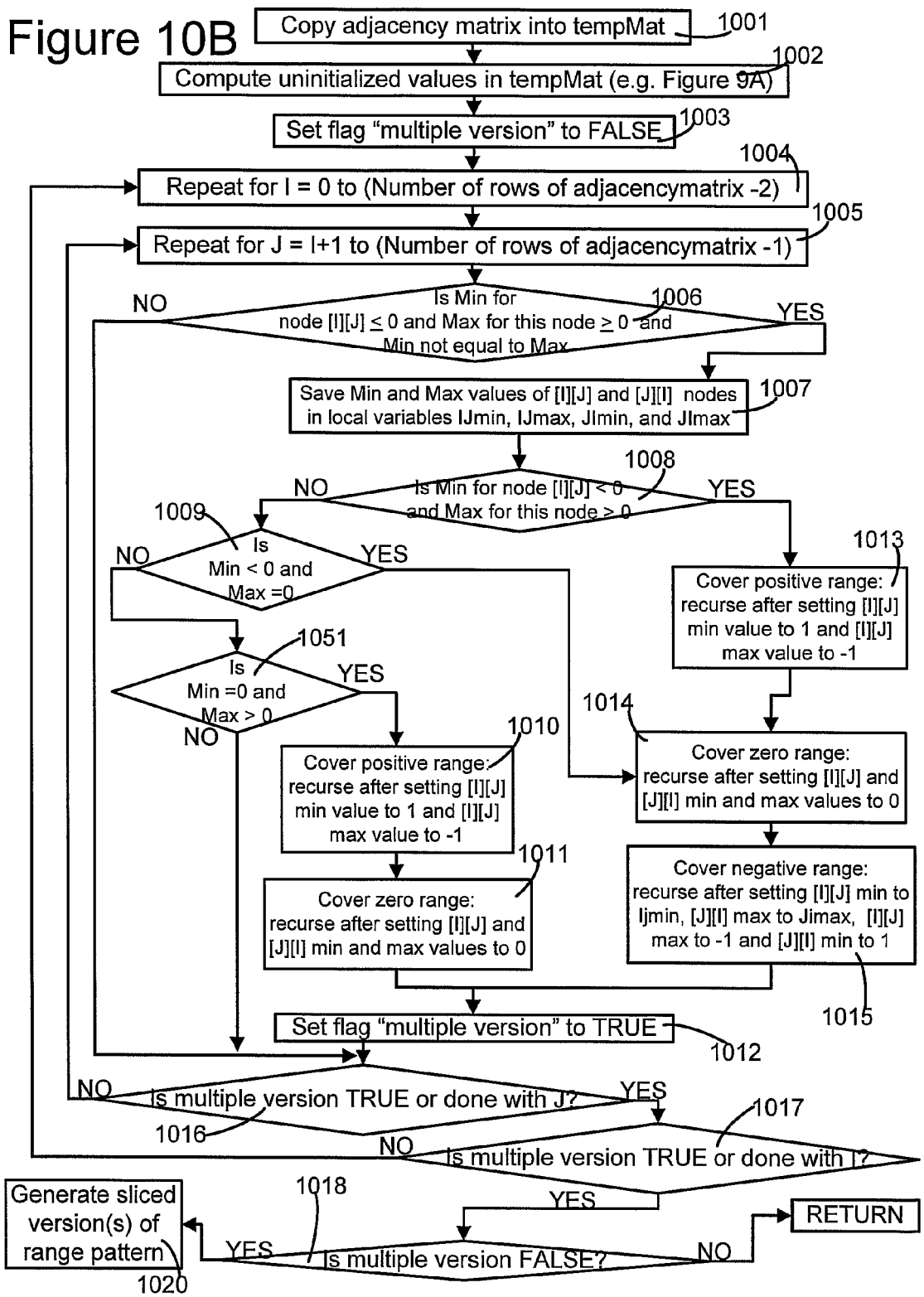

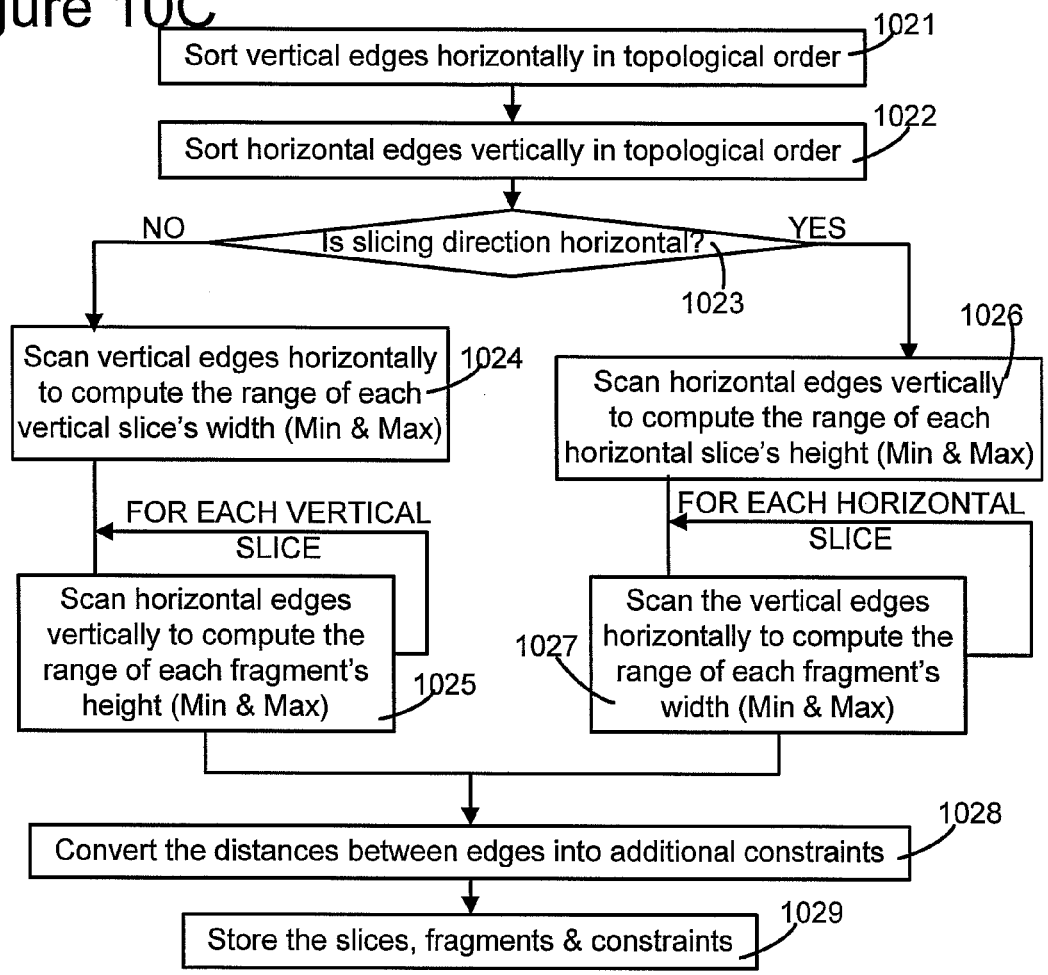
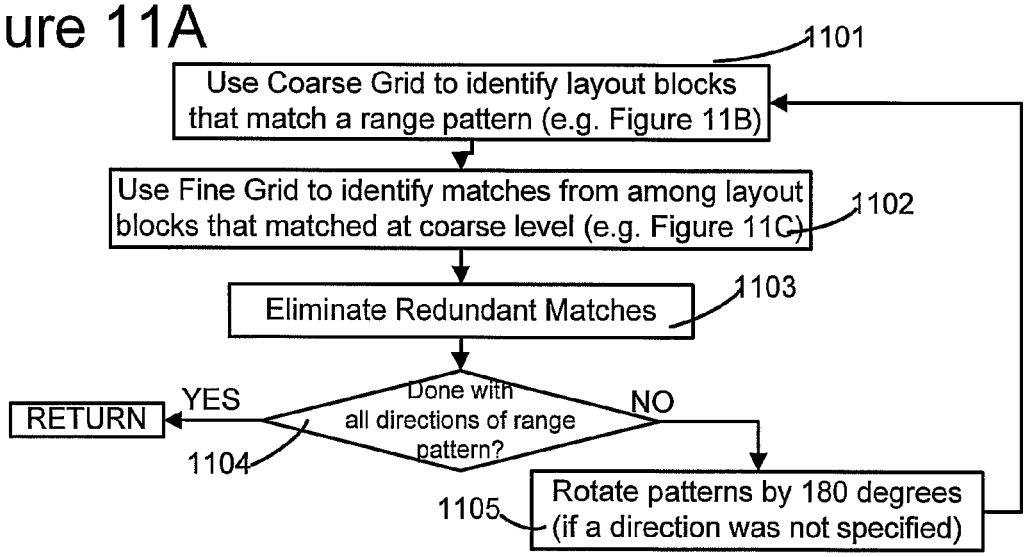

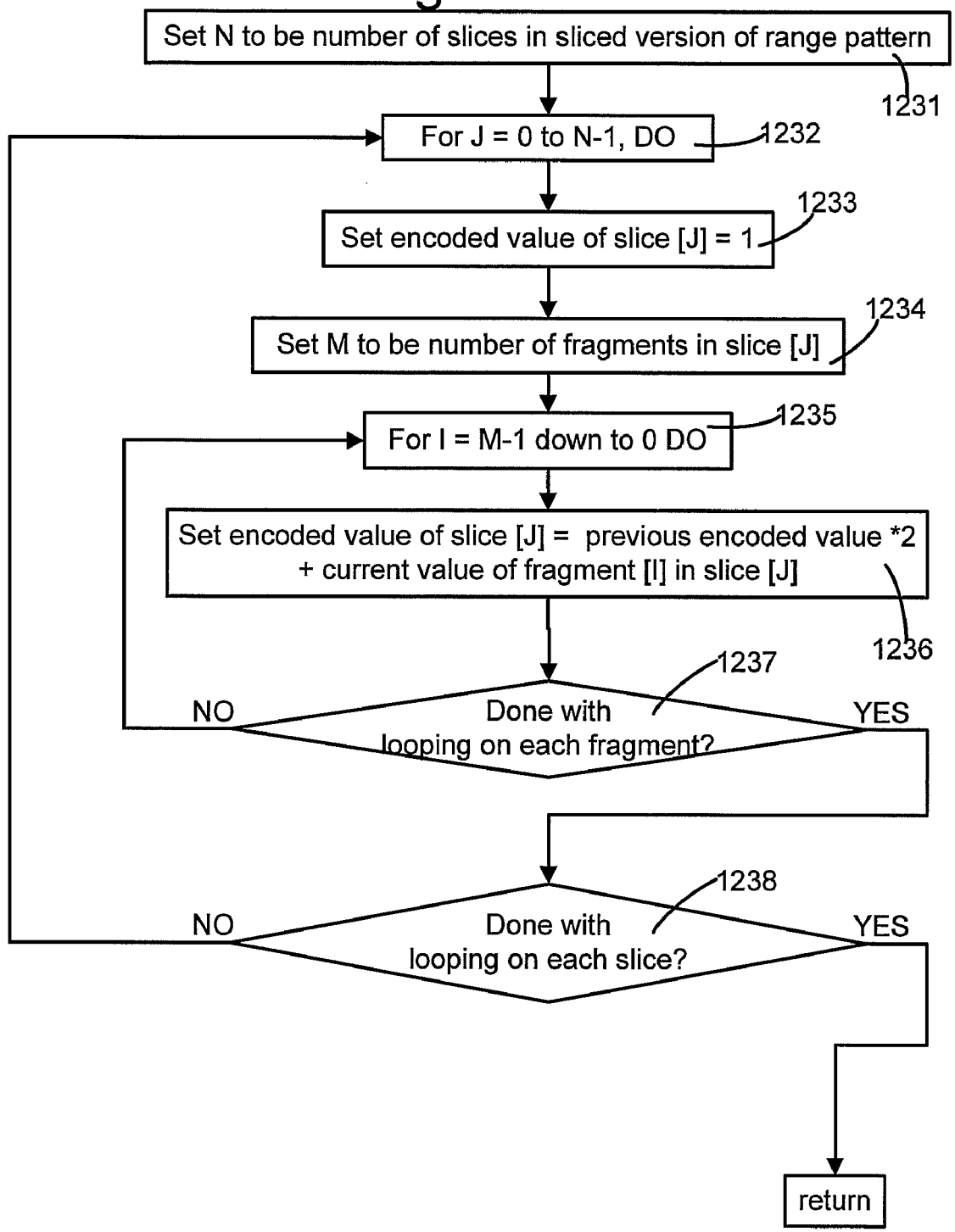

Figure 15A

```
DIR 1 //the pattern can be found in vertical layout
SN 5 //totally 5 slices
S 0 //line 1
  W O 90 R 90,150
  VN 2
    V 1 D
    V 0 D
  EV
S 1 //spacing between line 1 and line 2
  W O 90 R 90,150
  VN 1
    V 0 D
  EV
S 2 //line 2
  W O 90 R 90,150
  VN 3 //3 different values
    V 0 U 90 //minimum spacing below line 2
    V 1 R 200,500 //length of line 2
    V 0 U 90 //minimum spacing above line 2
  EV
S 3
  W O 90 R 90,150
  VN 1
    V 0 D
  EV
S 4
  W O 90 R 90,150
  VN 2
    V 0 D
    V 1 D
  EV
ES //end of slice section
```

Figure 15B

```
CN 3 //3 additional constraints
C 0
  VN 2
    V C 4,0 1
    V C 0,0 -1
  EV
  G -50 //overlap between line 1 and 3 can not exceed 50
C 1
  VN 2
    V C 0,0 1
    V C 2,0 -1
  EV
  G 10 //there is overlap between line 1 and 2
C 2
  VN 2
    V C 4,1 1
    V C 2,2 -1
  EV
  G 10 //there is overlap between line 2 and 3
EC //end of constraint section
BC //boundary constraint
  L 1
    C 0,0 //left boundary constraint on line 1
  R 1
    C 4,1 //right boundary constraint on line 3
  B 0 //no bottom boundary constraint
  T 0 //no top boundary constraint
EB //end of boundary constraint
```

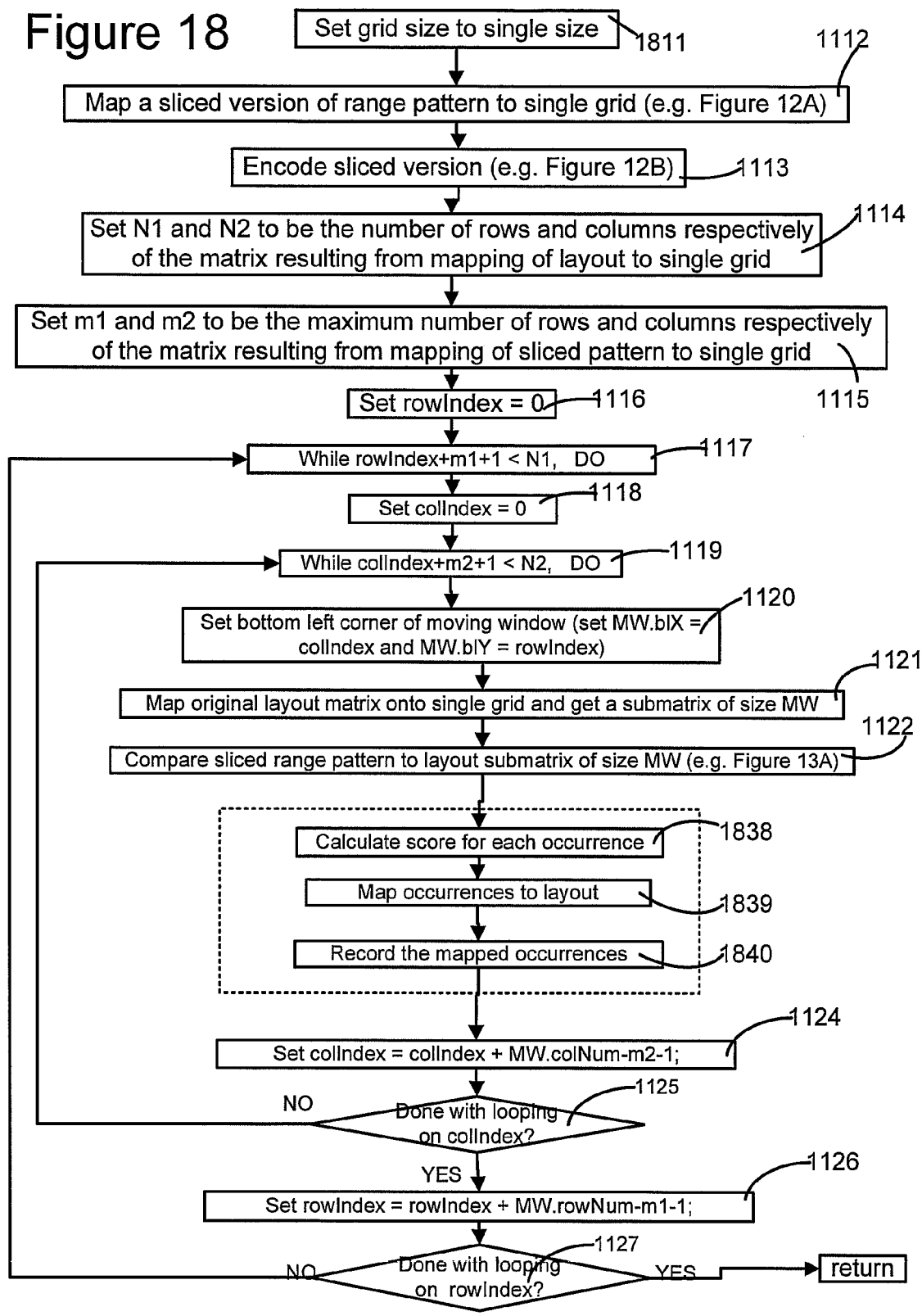

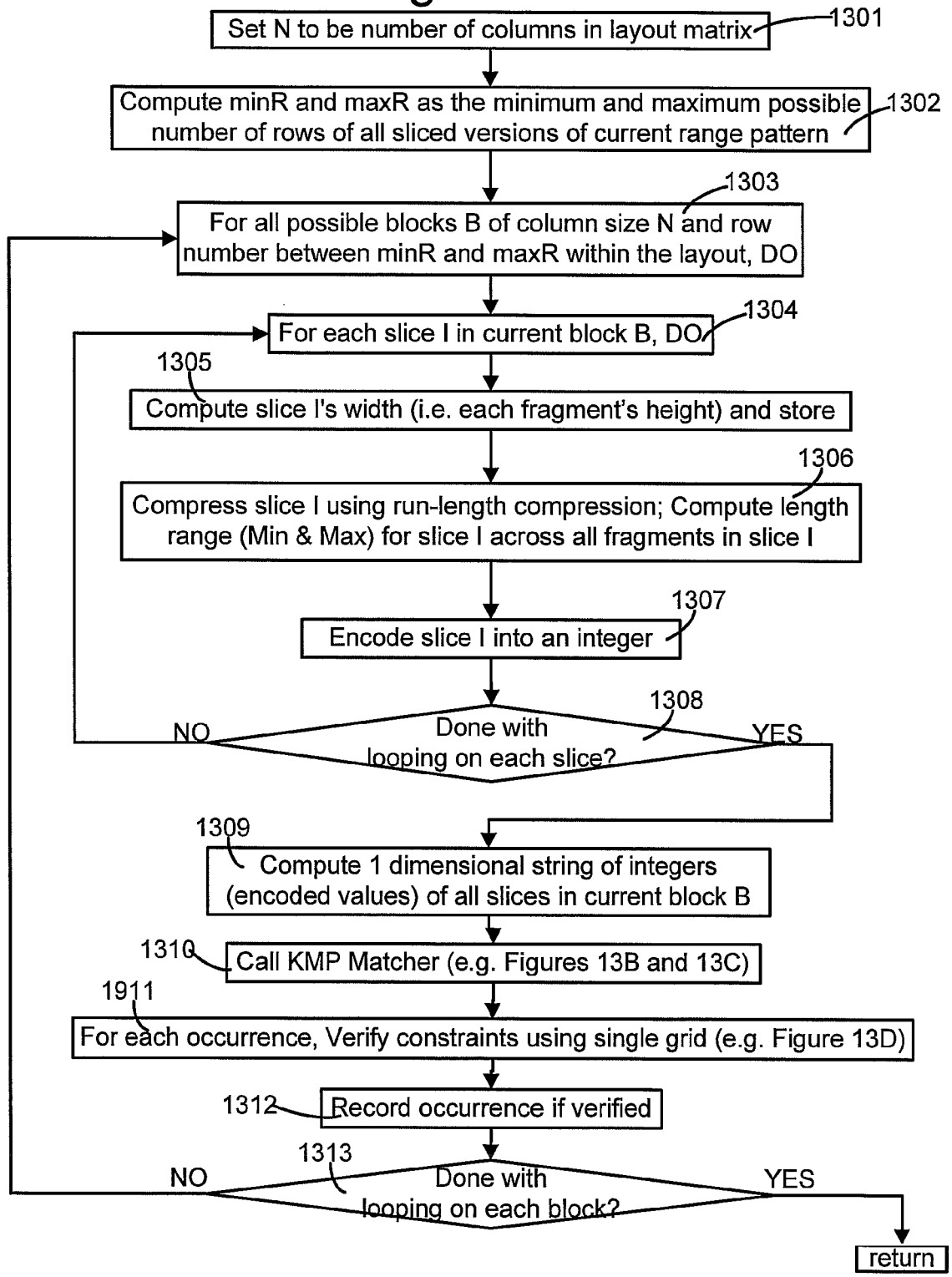

RANGE PATTERN DEFINITION OF SUSCEPTIBILITY OF LAYOUT REGIONS TO FABRICATION ISSUES

CROSS-REFERENCE TO PARENT APPLICATION

This application is a divisional application of U.S. patent application Ser. No. 11/394,466 filed on Mar. 31, 2006 now U.S. Pat. No. 7,703,067 entitled "A RANGE PATTERN DEFINITION OF SUSCEPTIBILITY OF LAYOUT REGIONS TO FABRICATION ISSUES" by Subarnarekha Sinha and Charles C. Chiang. U.S. patent application Ser. No. 11/394,466 is incorporated by reference herein in its entirety.

CROSS-REFERENCE TO RELATED APPLICATION

This application is related to and incorporates by reference herein in its entirety U.S. patent application Ser. No. 11/395,006 entitled "IDENTIFYING LAYOUT REGIONS SUSCEPTIBLE TO FABRICATION ISSUES BY USING RANGE PATTERNS" filed on Mar. 31, 2006 by Subarnarekha Sinha, Hailong Yao, and Charles C. Chiang.

BACKGROUND

1. Field of the Invention

The invention relates to design of layouts used in fabrication of semiconductor wafers. More specifically, the invention relates to a method and an apparatus for representing several patterns, which are similar to one another and that may be improperly fabricated in an integrated circuit (IC) chip, as a data structure ("range pattern") containing a pattern having range(s) on dimension(s) of the pattern.

2. Related Art

In the manufacture of integrated circuit (IC) chips, minimum feature sizes have been shrinking according to Moore's law. Currently the minimum feature size is smaller than the wavelength of light used in the optical imaging system. Accordingly it has become increasingly difficult to achieve reasonable fidelity (including resolution and depth of focus) between (a) a layout as designed in a computer and (b) shapes of circuit elements formed in a wafer after fabrication (which normally involves a number of processes such as photolithography followed by Cu deposition and chemical mechanical polishing). A number of reticle enhancement technologies (RET) such as optical proximity correction (OPC), phase shifting masks (PSM), and sub-resolution assist features (SRAF) are unable to overcome such fabrication issues. For example, even after a layout (FIG. 1A and FIG. 1D) is OPC corrected (FIGS. 1B and 1E), the resulting shape in a fabricated wafer (FIGS. 1C and 1F) may have one or more defects (e.g. Wpinch falls below a minimum limit, and causes an open circuit failure in the IC chip).

Current technology (prior to the invention described below) addresses such fabrication issues by application of design rules that are typically specified by a fabrication facility ("fab"). However, use of such fab-specified design rules can result in over-specification of the design or an unnecessarily large number of defects from fabrication thereby reducing yield. The following two articles have attempted to quantify the amount of RET (e.g. in the form of OPC) that a routed layout requires and modify the routing such that the burden of mask synthesis tools is reduced: [1] L-D. Huang, M. D. F. Wong: Optical Proximity Correction (OPC)—Friendly Maze Routing, DAC 2004; and [2] J. Mitra, P. Yu, D. Pan: RADAR: RET-aware detailed routing using fast lithography simulations, DAC 2005.

In such a framework, it is typical for regions of a layout that require large amounts of RET to be tagged as hotspots. Since it is very time consuming to accurately estimate the amount of RET that a particular routed layout needs without performing the actual operation on designs (performing RET takes about 20-30 hours of simulation time for a 1-million gate design, when using a personal computer (PC) with a central processing unit (CPU) operating at 1 GHz and equipped with 1 GB memory), such methods typically use a simple aerial image simulator to find geometric shapes in the layout that are expected to print badly. Consequently, these methods lack the ability to factor in RET information when identifying potential hotspots.

Inventors of the invention described below have realized that current methods overestimate the number of hotspots due to failure to use RET information as well as failure to use details of mask synthesis (which may not be available due to intellectual property (IP) issues from use of third party designs, e.g. if hard IP cores are present in an IC design). Hence, layout geometries that can be easily corrected in a RET stage and/or mask synthesis stage typically get tagged by current methods as hotspots to be corrected during the layout routing stage. Correcting all the tagged hotspots in the layout routing stage results in overly-conservative, less than optimal routing design.

SUMMARY

A computer, when appropriately programmed in accordance with the invention, contains in its memory at least one data structure (also called "range pattern") representing an arrangement of line segments relative to one another and a range for the position and/or dimension of one or more line segments. For example, a width range and/or a length range for a rectangle is a range on the corresponding dimension (width and/or length) of a line segment whereas a spacing range is an example of a range on the position of one line segment relative to another line segment. Specifically, in several embodiments of the invention, at least one such data structure identifies at least two line segments that are located at two fixed boundaries of the range pattern and are oriented perpendicular to one another (e.g. left and bottom boundaries). In addition, the data structure includes at least one pair of values that identify a maximum limit and a minimum limit (i.e. a range). If an additional line segment in the range pattern is positioned between these limits (relative to one of the line segments in the range pattern) in a portion of a layout of an integrated circuit (IC) chip, then that portion represents a region susceptible to fabrication issues in the IC chip. In most embodiments of the data structure, multiple ranges are specified for corresponding multiple dimensions and/or multiple relative positions of line segments in the range pattern, for example a width range is specified for the width of a trace in the range pattern and a spacing range is specified for a distance between two traces adjacent to one another in the range pattern.

Many embodiments of a method and apparatus in accordance with the invention use a single range pattern of the type described above to compactly represent numerous patterns in an IC layout that are similar to one another in many respects but differ from one another in the position of a small number of line segments. Specifically, appropriate ranges are selected for appropriate dimensions (either manually or automatically), to define a single range pattern (or a handful of range patterns) to compactly represent said numerous patterns (without explicitly describing each of the numerous patterns individually). Grouping of multiple patterns into a single range pattern eliminates the need for memory otherwise required in the prior art to represent each pattern individually.

BRIEF DESCRIPTION OF THE DRAWINGS

FIGS. 1A and 1B illustrate a prior art layout after routing and after optical proximity correction (OPC) while

FIG. 3A illustrates, in a flow chart, a process of creating a range pattern in accordance with the invention.

FIG. 3B illustrates, in a flow chart, an alternative to the process in FIG. 3A, whereby a human who is experienced in IC fabrication, supplies to a computer the data for creating a range pattern based on the human's experience.

FIG. 3C illustrates, in a flow chart, a method for performing lithography aware routing by using one or more range pattern (s), in some embodiments of the invention.

FIG. 4A illustrates a re-routed layout in a location that previously had a lithography hotspot in the form of a staircase pattern that matched the range pattern illustrated in FIG. 2I.

FIG. 4B illustrates traces that result from fabrication of the re-routed layout of FIG. 4A.

FIG. 5A illustrates slicing of the staircase range pattern of FIG. 2I.

FIGS. 6A and 6F illustrate, in flow charts of some embodiments, two methods of matching layout blocks to range patterns that are performed in a hierarchical manner, using a coarse grid and a fine grid respectively.

FIG. 6G illustrates, in a graph, worm-like movement of a layout block in some embodiments of the invention.

FIG. 7 illustrates slicing of a block of a layout in some embodiments of the invention.

FIGS. 8C and 8D illustrate matrices of adjacency data ("adjacency matrix") for horizontal and vertical edges respectively of a sliced version of a range pattern generated from user-provided data which is supplied as input to the method of FIG. 9A FIG. 8E illustrates one specific embodiment of the method in shown in FIG. 8A.

FIG. 9A illustrates, in a flow chart, a method of computing a range for the distance between one or more pairs of line segments in a pattern, by use of the Floyd Warshall algorithm.

FIGS. 9B and 9C illustrate adjacency matrices for horizontal and vertical edges that are output by the method of FIG. 9A based on corresponding inputs shown in FIGS. 8C and 8D.

FIGS. 10A and 10B illustrate, in flow charts, methods for counting and enumerating the number of cutting slices of a range pattern.

FIG. 10C illustrates, in a flow chart, a method of computing ranges of dimensions of slices in a sliced version of a range pattern.

FIG. 11A illustrates, in a flow chart, a method for matching a range pattern to an IC layout.

FIG. 12B illustrates, in a flow chart, a method of encoding a cutting slice, in some embodiments of the invention.

FIGS. 15A and 15B together illustrate a pattern format file that is used in some embodiments of the invention, to specify a pattern in the cutting slice representation.

FIGS. 16-19 illustrate, in flow charts, acts performed by a single grid method in some embodiments of the invention

DETAILED DESCRIPTION

Figure 2A:
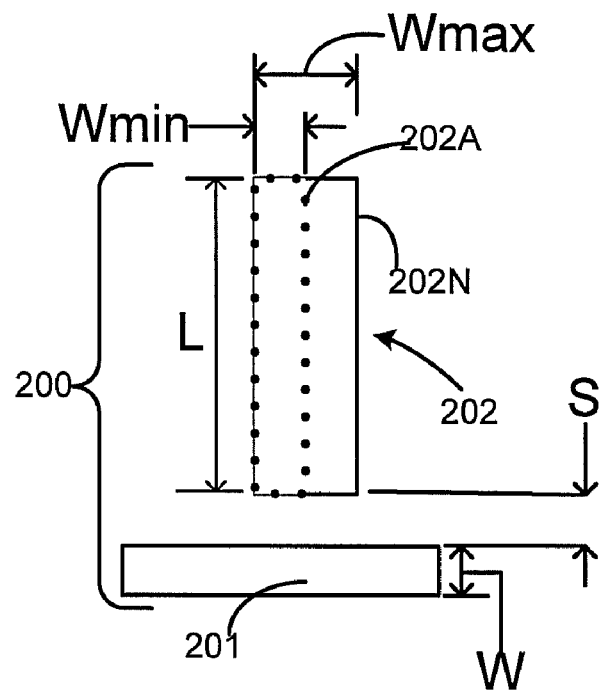
FIGS. 2A-2C illustrate a "drill" range pattern that, in accordance with the invention, has a width range (Wmin, Wmax) and a spacing S.

A computer, when appropriately programmed in accordance with the invention, contains in memory at least one data structure to represent numerous patterns compactly. The data structure (called "range pattern") typically identifies the relative location of pairs of line segments in the patterns using a range, such as a width range for a rectangle in the pattern, as illustrated in FIG. 2A. In the example illustrated in FIG. 2A, a range pattern 200 represents an arrangement of two traces oriented perpendicular to one another, in the form of an inverted letter "T" of the English Alphabet with the two traces separated from one another by a spacing distance S. The horizontal trace in this example is represented in range pattern 200 by a rectangle 201 of fixed dimensions. The vertical trace in this example is represented by a rectangle 202 of fixed length L but the width of rectangle 202 can be any value within the range (called "width range") defined by two values, namely a minimum limit Wmin and a maximum limit Wmax. For this reason, rectangle 202 can be either one of two rectangles 202A and 202N in FIG. 2A that have the respective widths Wmin and Wmax, and hence range pattern 200 represents at least two patterns, namely a first pattern formed by rectangles 201 and 202A and a second pattern formed by rectangles 201 and 202B.

Figure 2B:
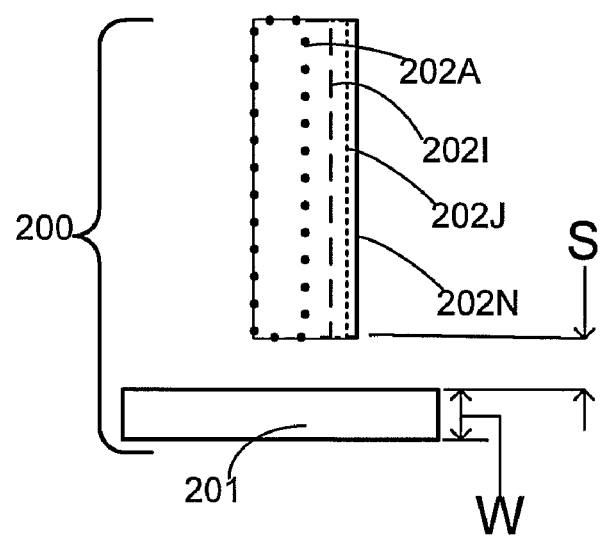

In fact, as illustrated in FIG. 2B, the vertical rectangle 202 in the just-described range pattern 200 represents a number of additional rectangles 202I-202J whose width W is between Wmin and Wmax, wherein $A \leq I \leq J \leq N$. N being the total number of rectangles represented in the range pattern; note that N is theoretically infinite but in practice is limited by the smallest dimension obtainable from IC fabrication. This smallest dimension in turn depends on the size of the manufacturing grid of an integrated circuit's layout.

Figure 2C:
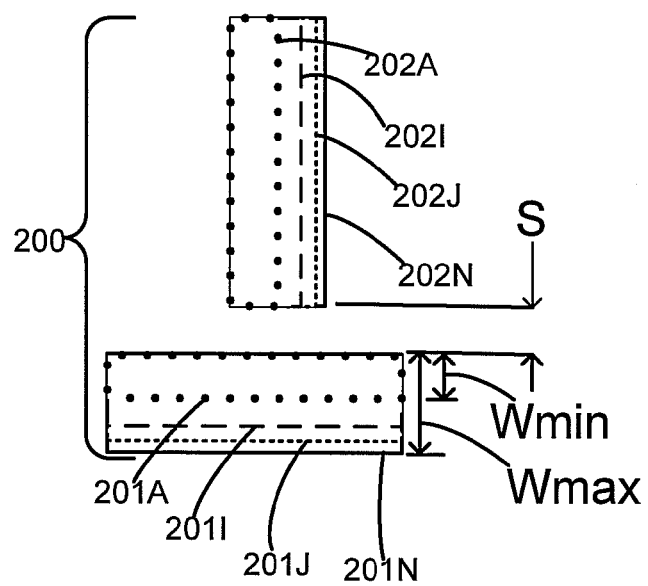

Note that although a single range has been described above in reference to the range pattern illustrated in FIGS. 2A and 2B, most embodiments of range patterns have more than one range, for example as illustrated in FIG. 2C by width ranges on each of the rectangles in the range pattern. In this example shown in FIG. 2C, all dimensions are same as in FIGS. 2A and 2B except that the width of the horizontal rectangle is now defined to have the same range as the vertical rectangle, i.e. between minimum limit Wmin and maximum limit Wmax. Therefore, in a manner similar to coverage of N vertical rectangles 202A-202N by the width range on the vertical rectangle, the newly defined width range on the horizontal rectangle now covers N horizontal rectangles 201A-201N. Hence, the range pattern illustrated in FIG. 2C now covers all possible pairs of horizontal and vertical rectangles that have widths in the range Wmin and Wmax, i.e. a total of N×N patterns.

Figure 2D:
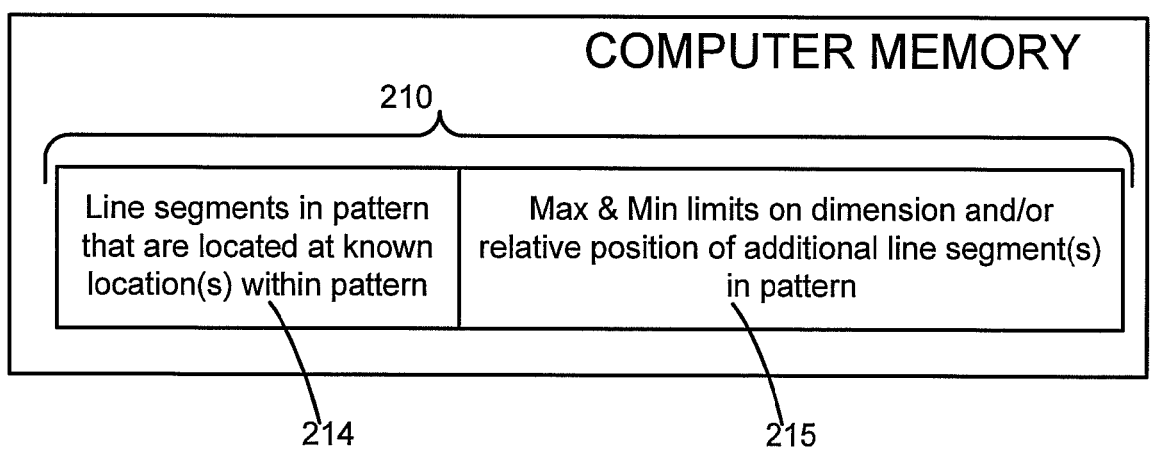
FIG. 2D illustrates, in a block diagram, a data structure 210 for a range pattern in a computer memory in accordance with the invention.
Figure 2E:
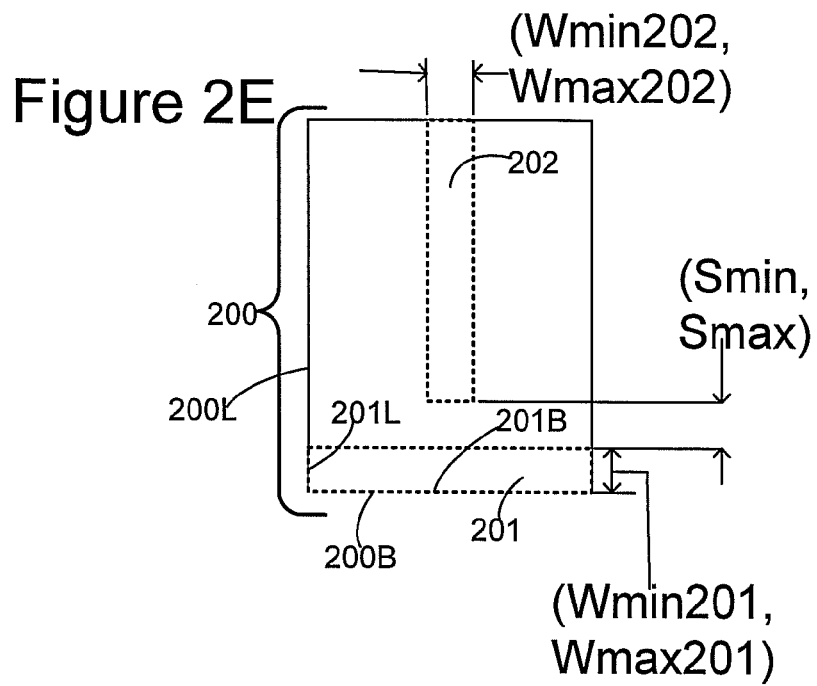
FIG. 2E illustrates the drill range pattern (shown in dotted lines) of FIGS. 2A-2C with additional ranges.

The variability of width of both the horizontal rectangle and the vertical rectangle in the pattern 200 as illustrated in FIG. 2C is captured in some embodiments by use of a data structure 210 to access computer memory illustrated in FIG. 2D that (a) identifies one or more line segments that are located at one or more known locations within the range pattern in a store 214 and (b) identifies a range (of minimum and maximum limits on the dimension or relative position) for an additional line segment in the range pattern in another store 215. Note that the relative position of the additional line segment is with respect to one of the line segments in the range pattern. Furthermore, dimensions of the range pattern other than width may also have ranges specified thereon, e.g. a spacing range is illustrated in FIG. 2E. Also, each range in a range pattern may be specified independent of another range in the range pattern, e.g. as illustrated in FIG. 2E by one width range between Wmin201 to Wmax201 for horizontal rectangle 201 and another width range between Wmin202 to Wmax202 for vertical rectangle 202. In some other embodiments, ranges can be specified on the distance between sets of line segments.

Figure 2F:
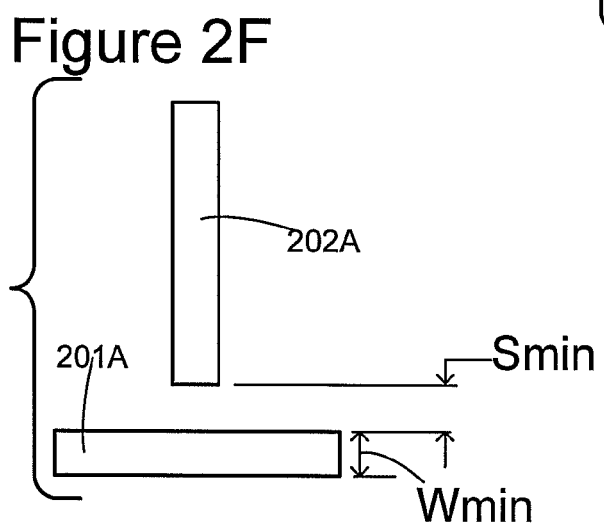
FIGS. 2F and 2G illustrate two patterns covered by the drill range pattern of FIG. 2E.
Figure 2G:
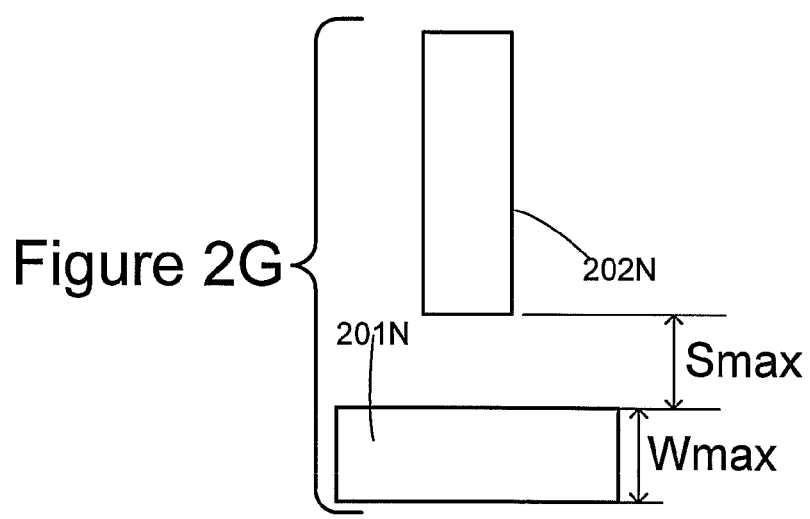

The just-described known location(s) can be based on any property that is normally inherent in a pattern, such as a pattern's center or a pattern's boundary depending on the embodiment. Also depending on the embodiment, the pattern (which is used to define the known location) can be selected (based on respective ranges in the range pattern) to have minimum dimensions or maximum dimensions or average dimensions (e.g. a minimum pattern as illustrated in FIG. 2F or a maximum pattern as illustrated in FIG. 2G, or an average pattern which is not shown). The ranges may be identified, relative to any known location(s) by identifying one or more line segments of the range pattern, and determining how they vary relative to the known location(s).

Figure 2H:
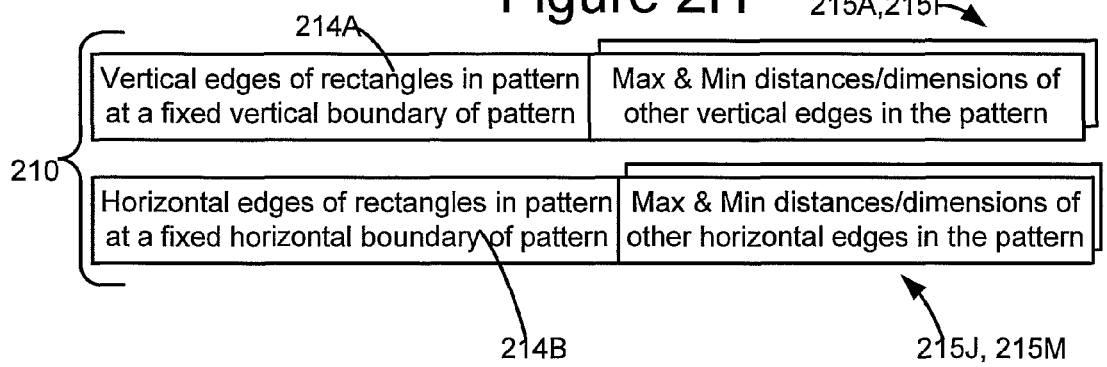
FIGS. 2H and 2J illustrate, in block diagrams, two embodiments of the data structure of FIG. 2D.

As noted elsewhere, stores 214 and 215 are included in a memory of a computer in accordance with the invention. Each of stores 214 and 215 may contain several storage locations, depending on the embodiment. In some embodiments, at least two perpendicular boundaries of the range pattern e.g. at least one vertical line segment and at least one horizontal line segment are identified in respective storage locations 214A and 214B in store 214 as illustrated in FIG. 2H. In this example, ranges of all remaining vertical line segments are identified in storage locations 215A-215I, and ranges of all remaining horizontal line segments are identified in storage locations 215J-215M (wherein $A \leq I \leq J \leq M$, M+2 being the total number of line segments in the range pattern). Note that in these embodiments, stores 214 and 215 together identify the locations and ranges of all line segments in a range pattern.

Some embodiments identify all vertical line segments in range pattern 200 relative to a left boundary 200L (which is therefore a vertical reference edge) and all horizontal line segments relative to a bottom boundary 200B (which is therefore a horizontal reference edge) of range pattern 200. Therefore, in the example illustrated in FIG. 2E, a line segment 201L of rectangle 201 is identified as the vertical line segment at left boundary 200L (i.e. the vertical reference edge) and another line segment 201B also of rectangle 201 is identified as the horizontal line segment at bottom boundary 200B (i.e. the horizontal reference edge) of range pattern 200. Hence, two reference edges in the form of line segments 201L and 201B are identified in respective storage locations 214A and 214B in store 214, and ranges for all remaining line segments in range pattern 200 are identified relative to these two reference edges, in storage locations 215A-215M.

Note that it is not necessary for two reference edges of a range pattern to belong to a single rectangle in the range pattern. Specifically, whether or not line segments identified in store 214 as being reference edges are from a common rectangle as illustrated in FIG. 2E depends on a specific arrangement of line segments that is unique to each range pattern. For example, in FIG. 2I, a line segment 221L of rectangle 221 is identified as the vertical line segment at left boundary 220L and another line segment 223B of another rectangle 223 is identified as the horizontal line segment at bottom boundary 220B of range pattern 220. Hence, in FIG. 2I, the two reference edges do not belong to the same rectangle.

Figure 2I:
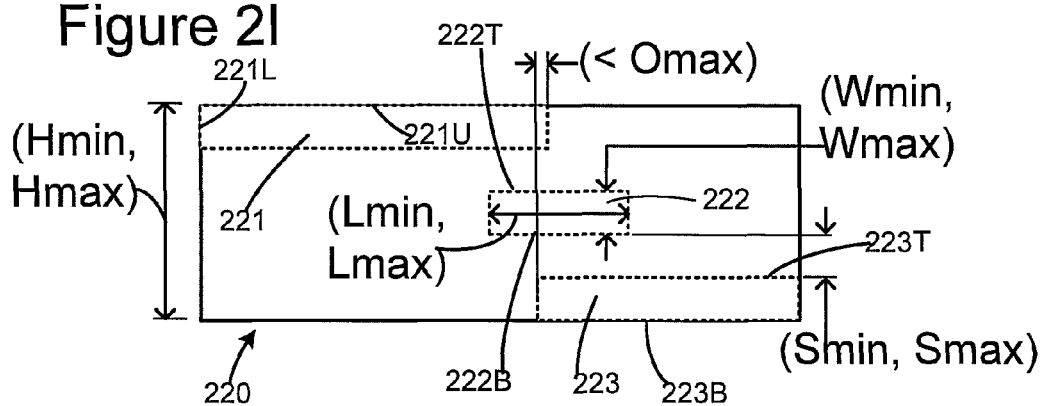
FIG. 2I illustrates a "staircase" range pattern in accordance with the invention that, in addition to width and spacing ranges, has a length range (Lmin, Lmax) for a middle trace, as well as a constraint (<Omax) on overlap between ends of two traces between which the middle trace is located.

In addition to ranges in the vertical direction, such as width range and spacing range described above, range patterns of some embodiments also have ranges on dimensions in the horizontal direction, such as a length range (between Lmin and Lmax) for the length of a trace 222 as illustrated in FIG. 2I. Moreover, in addition to ranges on the distances between any two adjacent line segments as described above, some embodiments support the definition of ranges on distances between any two (or more) specified line segments in the range pattern, regardless of whether or not the specified line segments are adjacent to one another. For example, the height of range pattern 220 (FIG. 2I) may have a range (Hmin, Hmax), which defines the distance between the upper edge 221U of rectangle 221 and the bottom edge 223B of rectangle 223. Such a range may be either manually specified or automatically computed, and is stored in one of storage locations 215A-215M (FIG. 2H). When any range is manually specified, depending on the embodiment, the user may be allowed by an appropriately programmed computer to describe the range of a line segment in a range pattern relative to any other line segment which may, for example, itself be within another range identified in the range pattern.

Also depending on the embodiment, the data structure of a range pattern may contain fields to access additional stores in computer memory other than the above-described stores 214 for line segments at known locations and stores 215 for ranges of remaining line segments. For example, some embodiments support the definition of one or more constraints required to be satisfied by any two (or more) specified line segments in the range pattern, regardless of whether or not such line segments are adjacent to one another. Such constraints are stored, in such embodiments, in the storage locations accessed by fields 216 of the data structure 210 illustrated in FIG. 2J. Similarly some embodiments perform a scoring function which rates the numerous patterns represented by a range pattern for their effect on yield. Performance of such a scoring function requires, in some embodiments, a scoring formula which is held in storage location accessed by field 217 of the data structure 210 (FIG. 2J).

For the "Staircase" pattern, let the parameters a, b and c denote the spacing between the top and the middle rectangles, the spacing between middle and bottom rectangles and the width of the middle rectangle, respectively. Furthermore, let S1, S2 and W denote the minimum possible value of parameters a, b and c, respectively, such that minimum width and spacing rules for the current technology are satisfied. Then, a typical scoring function for the "Staircase" pattern is as follows: $f=100-\alpha*\{(a-S1)+(b-S2)\}-\beta*(c-W)$.
In this equation for "f", certain illustrative exemplary values for $\alpha$ and $\beta$ are in the range of 1 and 2 and for S1, S2 and W are in the range of 90 nm and 150 nm which are based on values of minimum width and minimum spacing.

Figure 2J:
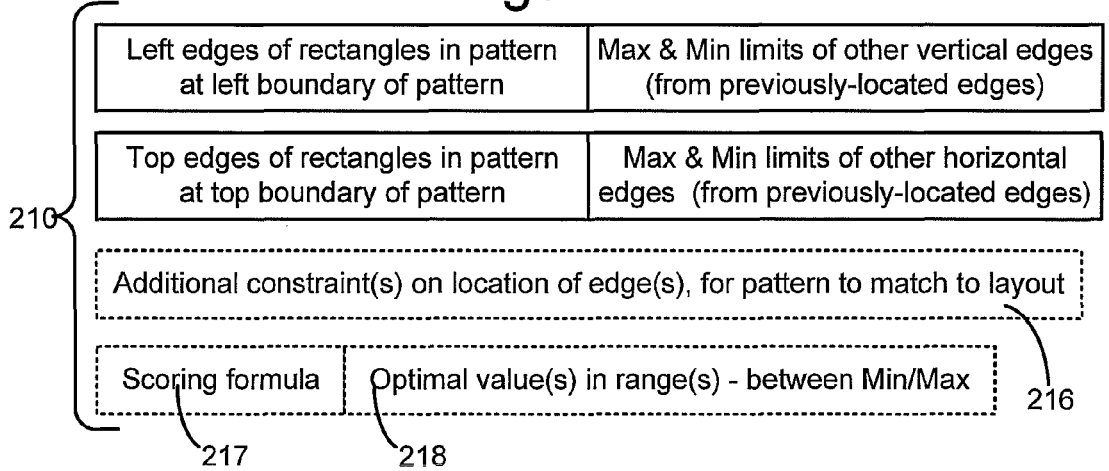

Additionally, or optionally, such embodiments may also store in storage locations accessed by fields 218 in data structure 210 of FIG. 2J, optimal value(s) within corresponding range(s) that result in a local maxima (or local minima, or median) in the score (relative to Max and Min limits in the respective ranges). While range patterns of the type described above can be prepared in any manner that will be apparent to the skilled artisan on studying this disclosure, some embodiments of the invention perform a method of the type illustrated in FIG. 3A. Specifically, a fabrication defect in an IC chip (e.g. known to be caused by improper printing) is selected in an act 301 for use in modeling such defects with one or more range patterns. Next, in act 302, a region of a fixed size in the IC layout around and including the defect's location is selected (e.g. a region of 1 micron size and centered at the defect's location is selected). Note that in many embodiments, the just-described IC layout from which a region is selected is at a stage prior to application of any resolution enhancement technique (RET) such as optical proximity correction (OPC).

Next in act 303 a number of test patterns are generated, by simply changing the relative locations of line segments in the selected region. The amount of change between any two test patterns may be selected to be any amount, although one embodiment uses increments of the minimum feature size of the fabrication process. Changes in the relative locations of line segments are along a single dimension (e.g. width) for a set of test patterns, followed by another dimension (e.g. spacing) for another set of test patterns and so on. Some sets of test patterns may have combinations of changes of multiple line segments (e.g. both width and spacing). Numerous such test patterns are generated in act 303.

In some embodiments of act 303, several possible combinations of each dimension that has a range are prepared into a set of test patterns, wherein each dimension is changed in a predetermined manner, e.g. changed by a predetermined increment, which may be, for example, the minimum feature size or the manufacturing grid size. If there are N legal values for a given dimension within its range (e.g. one value at each multiple of the predetermined increment), and if there are M dimensions that can be changed in a range pattern, then there could be up to $T=N^M$ test patterns for a single range pattern.

As the total number T of test patterns is an exponential function of the number N of legal values (with the number of changeable dimensions being typically fixed for a given range pattern), it is necessary to minimize the number N if the number T is to be kept sufficiently small to be realistically tested. Some embodiments deliberately generate only a limited number of test patterns, e.g. less than 1000. In several such embodiments, an overall limit on total number of test patterns requires using just two values for each dimension in at least some (if not all) range patterns e.g. the two limits (max, min) of each range. In this case N is 2 and typically M is 5 then such embodiments build (or simulate building of) $2^5$ i.e. 32 test patterns, for finding the appropriate dimensions of one exemplary range pattern. If there are 10 range patterns in a library, then they require 320 test patterns total.

Other embodiments may support use of more test patterns, that can be generated by use of, for example, three values for each dimension, such as the two limits described above and a median (or mean). In this case N is 3 and M is typically 5, so there are $3^5$ i.e. 243 test patterns for one such range pattern. If there are 7 range patterns being used in the library of such an embodiment, and if each range pattern requires 243 test patterns, then there are a total of 7*243, i.e. 1701 test patterns.

Thereafter, in act 304 the results of fabrication of the test patterns are obtained, e.g. by actually fabricating an IC chip containing the test patterns and/or by simulating the fabrication. Next, in act 305, one or more test patterns that result in fabrication defects are identified (e.g. one or more manufacturing criteria are applied to decide whether or not the result of each test pattern is acceptable).

Once a number of patterns that result in fabrication defects are identified, then in act 306 two such patterns that are similar to one another are used to define a range pattern. Similarity of two patterns may be judged either manually by human inspection or automatically by a computer determining that almost all (e.g. all but one) dimensions of the two patterns match. Thereafter, in act 307, a check is made if all defective patterns have been represented in a range pattern and if not, then in act 308 a check is made whether a remaining defective pattern fits a previously-defined range pattern. If so, then act 307 (which has been just described) is repeated. If not, then similarity of this defective pattern relative to one of the previously-defined range patterns is determined, and if there is a similarity then the range pattern is modified in act 310, followed by returning to act 307. If there is no similarity, then act 311 is performed to create a new range pattern that covers this defective pattern followed by returning to act 307. In act 307, if there are no more defective patterns left, then act 312 is performed to check if all defects in the IC chip have been modeled by one or more range patterns and if not act 301 is repeated.

In some embodiments, instead of (or in addition to) performing the just-described method of FIG. 3A, a human's experience with IC fabrication is used to receive from the human data required to define a range pattern, as illustrated in FIG. 3B. Specifically, in act 321, the location of an edge of a rectangle at a left boundary of the pattern is received, followed by receiving the location of a rectangle's edge at a bottom boundary of the pattern. Next, act 322 receives a range (i.e. minimum limit and maximum limit) for the location of an edge, relative to any previously-received edge. Each of acts 321 and 322 may be repeated as often as necessary, until the range pattern is fully defined. In some embodiments, as the input is received a graphical display is updated to show the edges of the range pattern that have been received so far. Note that in such a display, all edges may be shown at minimum distances in their respective ranges, with a label at each edge identifying its range (e.g. as shown in FIG. 2E). Moreover, depending on the embodiment, additional data may be received from such a human, e.g. optimal values and/or constraints may be received in respective acts 323 and 324 as illustrated in FIG. 3B. Note also that such acts can be performed in any order relative to one another.

Once a memory contains one or more range patterns of the type described above, a computer containing such memory (or with access to such memory) can be programmed to use the range pattern(s) to avoid one or more fabrication issue(s) as illustrated in FIG. 3C. Specifically, an IC layout is designed in act 331 in the normal manner, followed by such a computer using the range pattern(s) to identify in act 332 any locations in the just-designed IC layout that match the range pattern(s). If there is no match in act 332, then analysis and extraction and/or physical verification and/or resolution enhancement are performed in act 333 in the normal manner, followed by mask data preparation and IC fabrication in act 334. For more details, see FIG. 14B and its description below. If there are one or more matches in act 332, then a region in the layout that contains the matching location is re-designed, e.g. by changing the resources available to a layout router followed by invoking the layout router.

Any prior art method for rip-up and re-route may be used, depending on the embodiment, to correct the IC layout. As many embodiments in the current patent application are primarily directed to novelty related to specification of range patterns and detection of matching regions in a layout, details of correction are not critical to practicing such embodiments of the invention. In some embodiments of the invention, regions requiring re-design are modified using simple techniques such as wire-spreading or wire-widening while other embodiments use more complex rip-up and re-route strategies, and still other embodiments use combinations thereof. For instance, in case of a staircase pattern, some embodiments initially attempt to widen the central line (i.e. middle wire) beyond 150 nm or to increase the spacing between the central line and the top and bottom lines. When such initial attempts fail, these embodiments rip up the entire staircase pattern and new routing for these wires is generated through a place and route tool. To prevent a previously-generated pattern from being re-generated by the place and route tool, new DRC rules are imposed on the tool. The new DRC rules are automatically generated in some embodiments from the range pattern (e.g. DRC rules are created as complements of conditions present in the range pattern) and these new DRC rules are enforced during the new routing (i.e. redesign) in addition to the DRC rules normally used in the place and route tool.

Figure 1A:
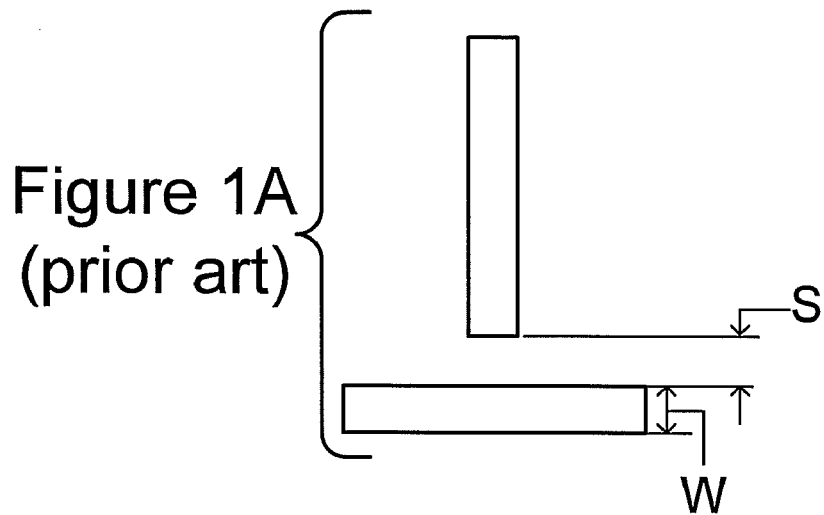
Figure 1B:
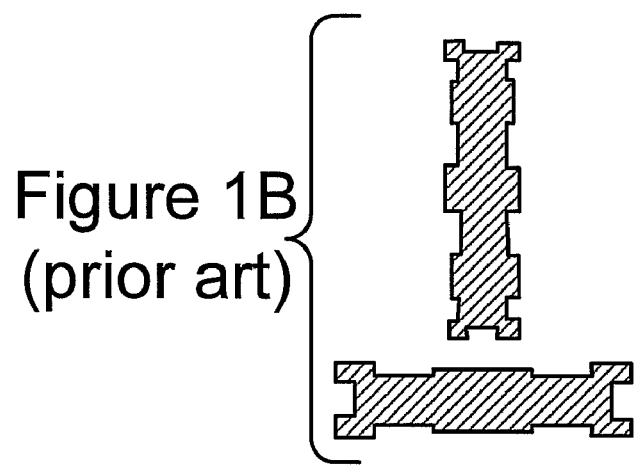
Figure 1C:
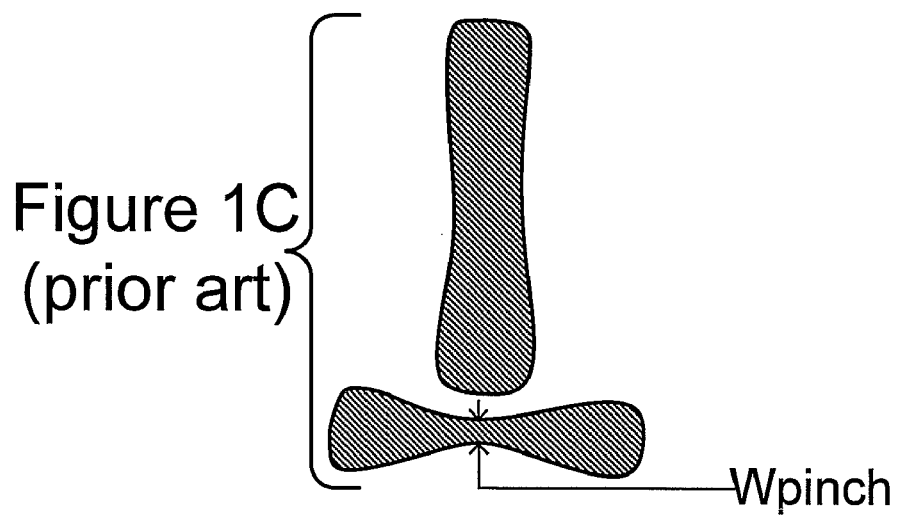
FIG. 1C illustrates a structure resulting after fabrication.
Figure 1D:
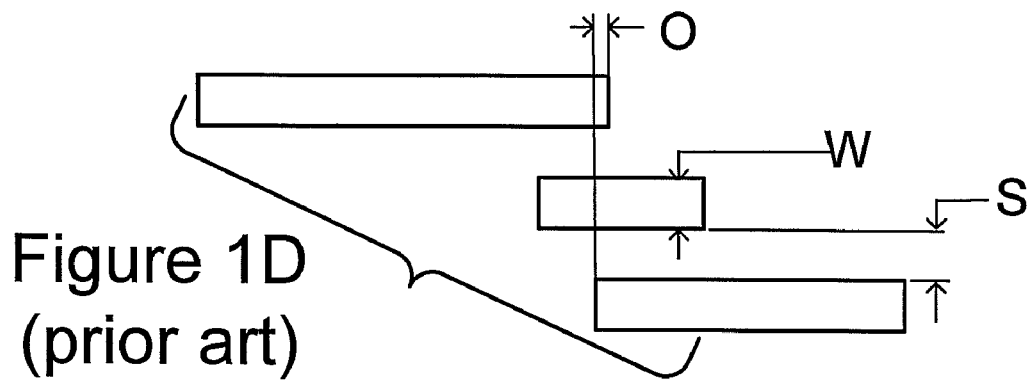
FIGS. 1D, 1E and 1F illustrate the steps of FIGS. 1A-1C for another prior art layout.
Figure 1E:
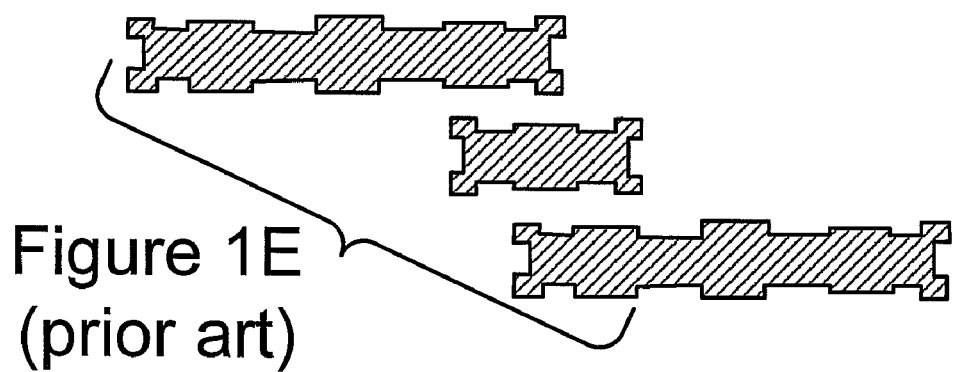
Figure 1F:
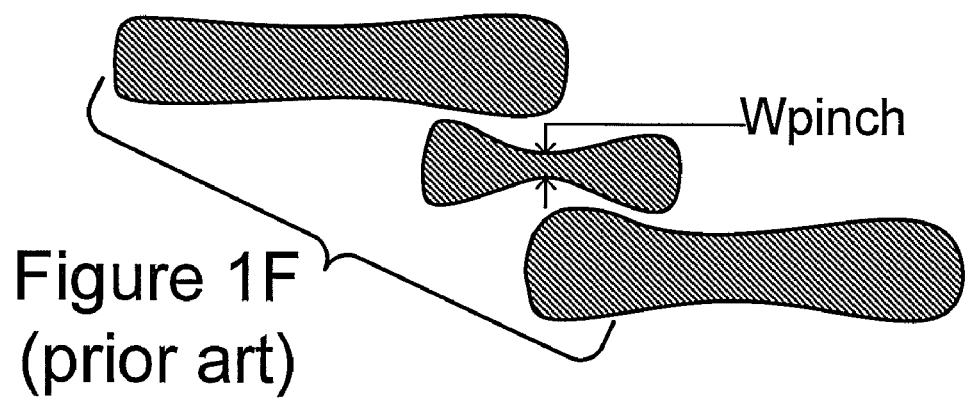

Note that the re-design being done in some embodiments is incremental, i.e. the whole layout is not changed and instead just a small amount of (1) rip up and re-route and/or (2) wire spreading and/or widening is done, typically in a region of a predetermined size that surrounds the layout location which has been identified as being defective by use of a range pattern. For example, when the staircase pattern shown in FIG. 1D is re-designed, a newly-generated pattern is shown in FIG. 4A with the spacing S and the overlap O being much larger than before. Accordingly, the result of fabrication as shown in FIG. 4B avoids the pinching effect shown in FIG. 1F. Note that after such re-designs are done for several defective locations (in some embodiments for all defective locations), act 332 is repeated to identify any defects that may have remained (e.g. if re-design was ineffective) or may have newly arisen (due to the re-design).

In one illustrative embodiment, the memory of a computer is loaded with a range pattern library that contains several range pattern format files which specify different range patterns. A typical range pattern format file contains the following data: (1) Name of the range pattern: valid names can consist of letters and numbers, but may not start with a number; the names are case sensitive. (e.g. Name=Rocket;) (2) In which routing direction can the range pattern be found: valid routing direction can be hor, vert or both. (e.g. Dir=hor;) (3) Number of rectangles in the range pattern: valid number of rectangles is a positive integer. (e.g. RectNum=3;); note that edges of rectangle I are represented as Ri.l (left edge), Ri.r (right edge), Ri.b (bottom edge) or Ri.t (top edge) ( ); (4) Left edges of the rectangles which are on the left boundary of the range pattern. (e.g. LeftBry R0.*l*, R2.*l*;) (5) Bottom edges of the rectangles which are on the bottom boundary of the range pattern. (e.g. BottomBry R2.*b*;); (6) Rectangle edges at the range pattern boundaries which need to be checked to make sure the rectangles cannot extend out of the boundaries (e.g. StrictBryCheck R0.*t*, R2.*b*; or LooseBryCheck R1.*r*;); note that the functions StrictBryCheck and LooseBryCheck denote two different types of rectangle boundary checks as discussed in the next paragraph; (7) Ranges on the distances between the rectangle edges. (e.g. R0.*t*-R0.*b* is (90,150)[90];); note that exemplary distance between R0.*b* and R0.*t* is between 90 and 150 with optimal value 90.

Two types of checks can be performed prior to identifying range-pattern-matched locations of a layout as hotspots, wherein digitized data at the boundary of the layout block is checked to ensure that no material is present, either all around the boundary ("StrictBryCheck") or at least at one location on one or more sides of the boundary ("LooseBryCheck").

Figure 5B:
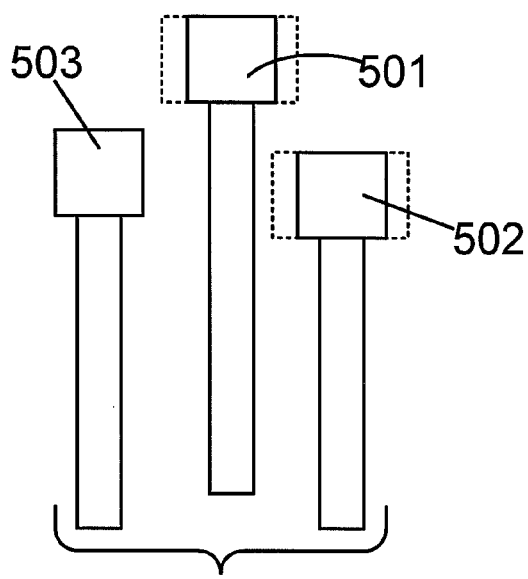
FIG. 5B illustrates a "door" range pattern.

As an example, a user's specification for the Staircase pattern as illustrated in FIG. 1D is given below:
Name=Staircase;
Dir=hor;
RectNum=3;
LeftBry R0.*l*;
BottomBry R2.*b*;
R1.*l*-R0.*l* is (10, 50);
R0.*r*>R1.*l*;
R1.*r*>R0.*r*;
R1.*r*-R1.*l* is (200, 500);

R1.*r*>R2.*l*;
R0.*r*-R2.*l*<=50;
R2.*t*-R2.*b* is (90, 150)[90];
R0.*t*-R0.*b* is (90, 150)[90];
R1.*b*-R2.*t* is (90, 150)[90];
R1.*b*-R2.*t* is (90, 150)[90];
R1.*t*-R1.*b* is (90, 150)[90];
R0.*b*-R1.*t* is (90, 150)[90];

In some embodiments of the invention, the range patterns as well as the layout are sliced as illustrated in FIGS. 5A-5E, and it is the slices (e.g. slices S0-S4 as illustrated in FIG. 5A) which have resulted from slicing that are compared in act 332 (FIG. 3C). Each slice SI of a range pattern is oriented parallel to another slice SJ of the range pattern. Moreover, slices that are adjacent to one another are not equal, in the sense that the presence or absence of material in the layout is at different locations in different slices. Within a given slice SI, in the lateral direction (i.e. in the direction perpendicular to the slicing direction), material is at the same location in the slice SI, although in the longitudinal direction of the slice, the material can be at different locations within the slice SI.

Each slice SI in a sliced version of a pattern typically includes one or more regions wherein material is present in the layout, and/or one or more regions wherein material is absent in the layout (the regions are hereinafter called "fragments"). Specifically, each slice SI may contain one or more fragments FIJ, wherein J identifies the location of the fragment within the slice SI (relative to another fragment within the same slice). For example, slice S2 is illustrated in FIG. 5A as containing three fragments F20, F21 and F22, wherein material is present in fragment F21 while being absent in the two fragments F20 and F22 that are adjacent to fragment F21. As two additional examples shown in FIG. 5A, slice S2 is adjacent to two slices S1 and S3 that respectively consist of the two fragments F10 and F30 (wherein material is absent in this example). Moreover, slices S1 and S3 are respectively adjacent to slices S0 and S4 that respectively contain the pairs of fragments (F00, F01) and (F40, F41).

A specific direction in which a range pattern is sliced (such as the horizontal direction in FIG. 5A) can be different for different range patterns in a library. In the example illustrated in FIG. 5A, the direction of slicing is in the longitudinal direction of the traces F00, F21 and F41, which happens to be horizontal as it is the longitudinal direction of the traces. In this example, each slice has the width of a trace and/or the width of spacing between adjacent traces and hence a single sliced version is adequate to fully represent the range pattern of FIG. 5A.

Note, however, that more than one sliced version may be required to represent the given range pattern, e.g. if in the given range pattern the ranges on multiple dimensions are such that the given range pattern cannot be represented by a single sliced version. When slicing such range patterns, a specific slicing direction is selected in some embodiments to minimize the number of multiple sliced versions that may be required to represent a given range pattern. An example of a range pattern that requires multiple sliced versions, is the door pattern shown in FIG. 5B which requires four sliced versions illustrated in FIGS. 5C-5F.

Figure 5C:
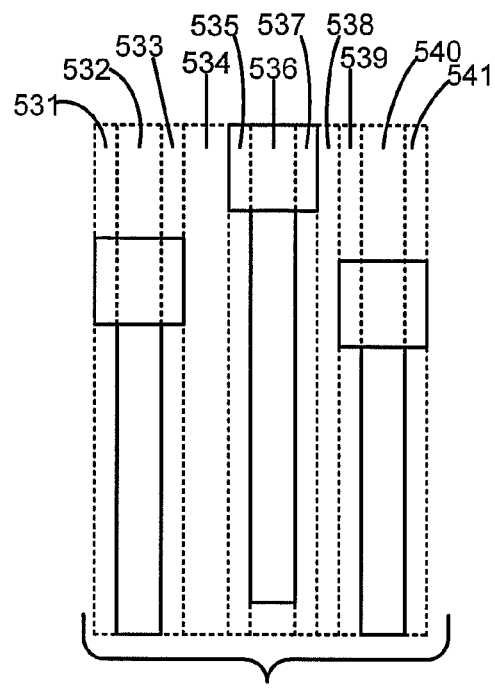
FIGS. 5C-5F illustrate four sliced versions of the range pattern shown in FIG. 5B.
Figure 5D:
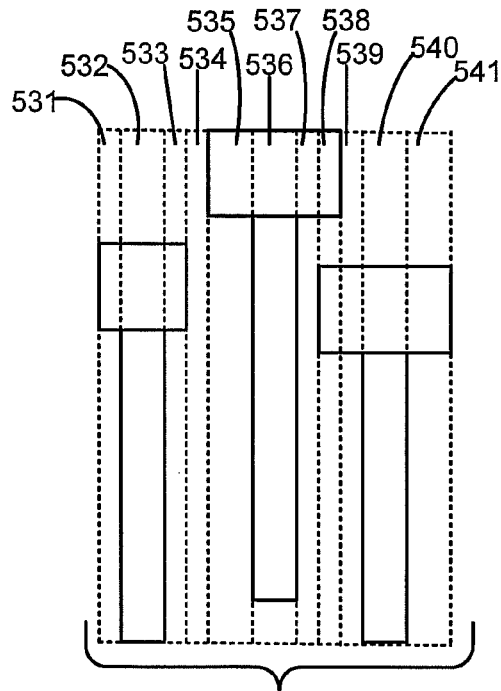
Figure 5E:
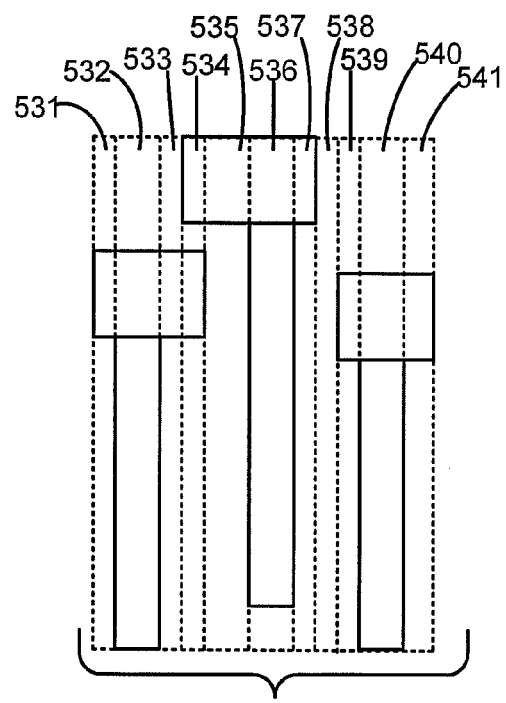
Figure 5F:
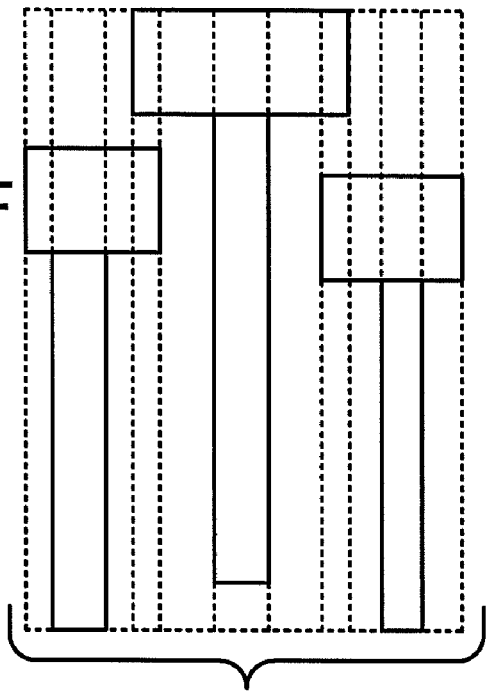

Specifically, the door pattern of FIG. 5B includes two pads 501 and 502 whose widths (in the horizontal direction) may in some cases overlap one another when viewed in the vertical direction (as shown in FIGS. 5D-5F), but not overlap in other cases (as shown in FIG. 5C), depending on the values in the respective width ranges. Specifically, in some cases the right side of pad 501 may be to the right of the left side of pad 502 in which case there is an overlap on the right side as shown in FIG. 5D, and alternatively the right side of pad 501 may be to the left of the left side of pad 502 in which case there is no overlap as shown in FIG. 5C. The just-described two cases are covered by use of two sliced versions illustrated in FIGS. 5C and 5D. A similar situation arises if the width of pad 503 is also variable in a specified range with overlapping pattern shown in FIG. 5E. FIG. 5F shows overlap on both sides of pad 501. Therefore four sliced versions are required to adequately represent the range pattern illustrated in FIG. 5B.

Figure 5G:
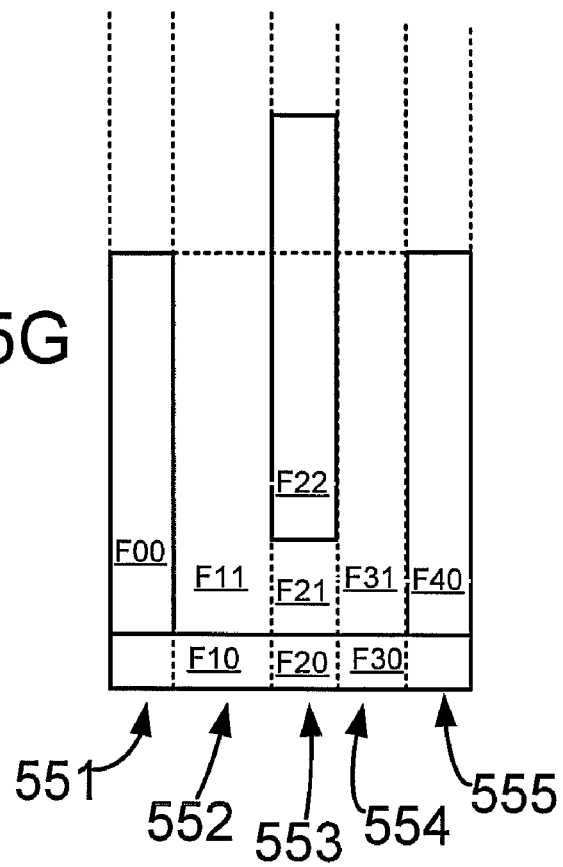
FIG. 5G illustrates, a sliced version of a "mountain" range pattern, in accordance with the invention.

Note that a "mountain" range pattern illustrated in FIG. 5G requires only one sliced version when sliced in the longitudinal direction of the traces, although multiple sliced versions (not shown) are required if sliced laterally. Hence, to minimize the amount of memory required to hold sliced versions of range patterns and to minimize the amount of computation when matching a sliced version to a layout, many embodiments of the invention slice a range pattern in each of lateral direction and the longitudinal direction (relative to traces) and then select whichever slicing direction generates the smallest number of sliced versions. In such embodiments, for the mountain range pattern illustrated in FIG. 5E, the longitudinal direction is selected as the slicing direction and the resulting sliced version is stored in computer memory (FIG. 2D), for use in matching.

Figure 5H:
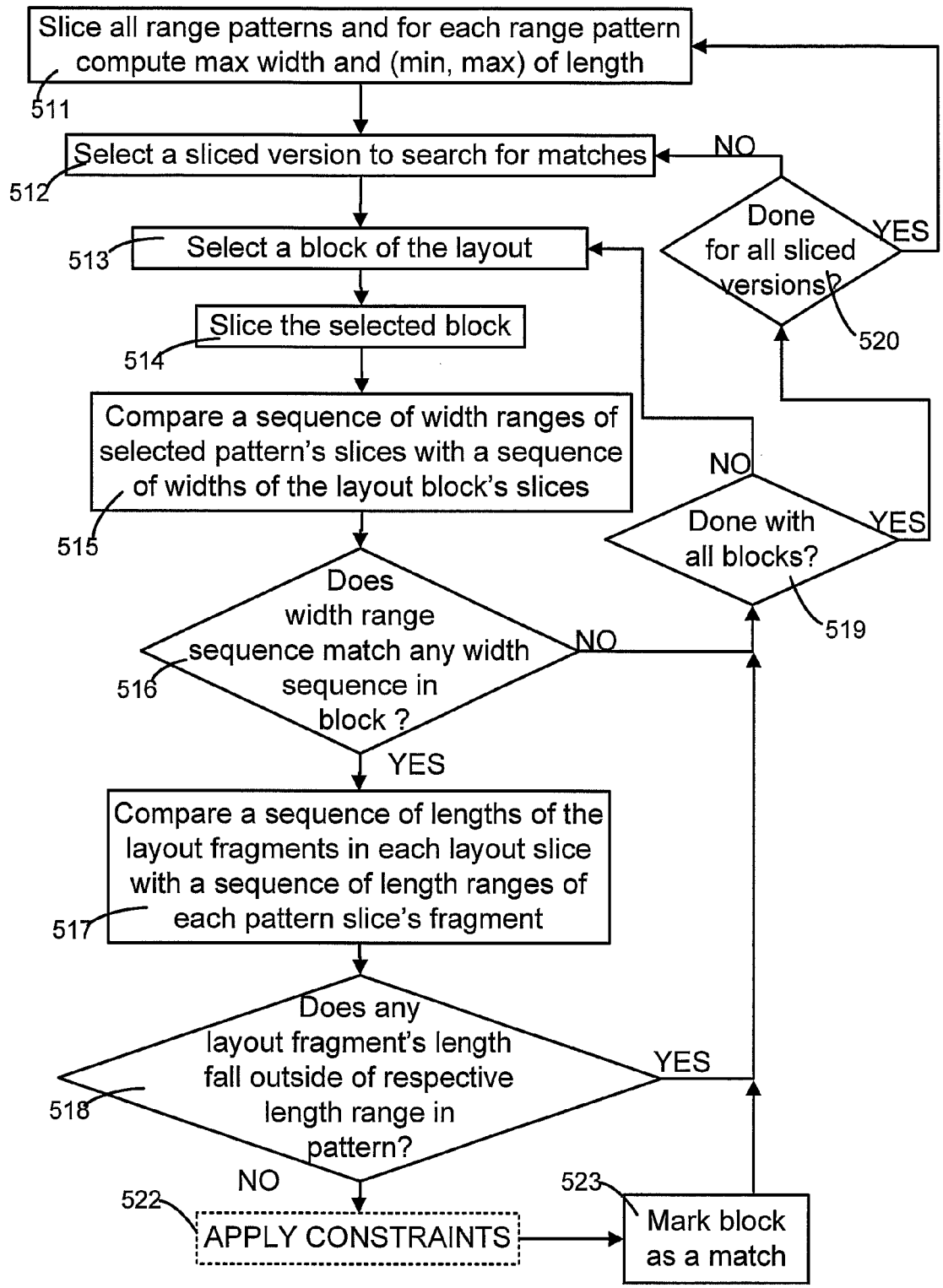
FIG. 5H illustrates, in a flow chart, matching a block of a layout to a sliced version of a range pattern in accordance with the invention.

Some embodiments of the invention perform a method illustrated in FIG. 5H to identify portions of a newly-created layout that match one or more range patterns of the type described above, so that such portions may be re-designed to avoid fabrication issues. Specifically, as illustrated in FIG. 5F, all range patterns in a library are sliced as per act 511. During this act, one or more overall dimensions of each sliced version of each range pattern are also computed. Examples of overall dimensions include the minimum and maximum length as well as the minimum and maximum width of the range pattern. Then, in act 512, a sliced version is selected for comparison to patterns in the layout. Next, in act 513, a block of the layout is selected, for example to have a length same as the minimum length, of the selected sliced version of the range pattern. Thereafter, in act 514, the selected block of the layout is sliced, in a manner similar or identical to slicing of a range pattern as described above in reference to FIGS. 5A-5E.

Figure 5I:
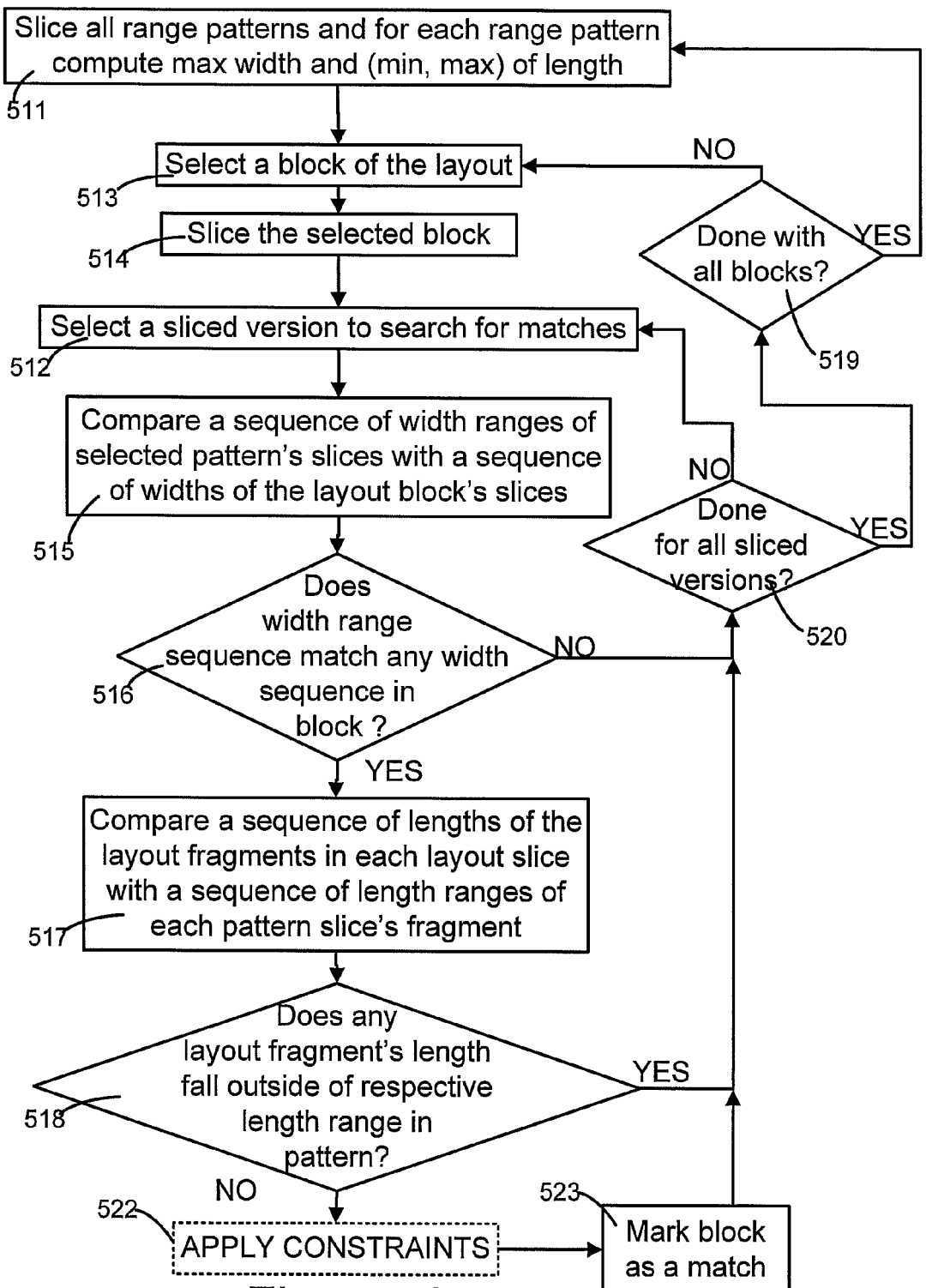
FIG. 5I illustrates the flow chart of FIG. 5H that is used in an alternative embodiment also in accordance with the invention.

Next, in act 515, a computer which implements the method of FIG. 5H compares the sequence of width ranges of the selected pattern's slices with a sequence of widths of the layout block's slices. Thereafter, in act 516, the computer checks if the width range sequence matches any width sequence in the block. If there is no match, the computer of several embodiments goes to act 519 to check if all the blocks have been compared to the currently selected pattern and if not compared then the computer returns to act 513 (described above). If all the blocks have been compared, the computer goes to act 520 and checks if all of the sliced versions for a currently-selected pattern have been compared, and if not the computer goes to act 512 (described above). In act 520, if all sliced versions have been checked, the computer goes to act 511 (described above). An alternative embodiment improves the speed of performance (and run time efficiency) by performing the acts 511-515 not in the sequence shown in FIG. 5H but in the sequence shown in FIG. 5I wherein acts 511, 513 and 514 are performed prior to act 512 (i.e. in this embodiment act 512 follows act 514). Note that the specific order of acts can be different in different embodiments, depending on tradeoffs such as memory and/or processing speed.

In act 516, if there is a match between the width range sequence and any width sequence in the block, then the "yes" branch is taken to act 517. Hence, act 517 is entered when the slices in the block are similar to slices in the range pattern, and therefore in act 517 a slice-by-slice comparison is performed, to confirm that each of the fragments within a slice of the layout block match corresponding fragments in the corresponding slices in the range pattern. Specifically, in act 517 the computer of many embodiments is programmed to compare the sequence of lengths of the fragments in each layout slice in the block with the respective sequence of length ranges of each slice's fragments in the range pattern. Then, in act 518, the computer checks if any of the layout fragments' length falls outside of the respective fragment length range in the pattern, and if so then there is no match and the "yes" branch is taken to act 519 (described above).

In act 518, if the slice-by-slice comparison finds that every fragment of the layout matches the corresponding range in the pattern, then the "no" branch is taken to act 522. Note that act 522 is an optional act in which one or more constraints (of the type described above) are applied in some embodiments of the computer. If the constraints are satisfied in act 522, then act 523 is performed to mark the block as a match, and thereafter the computer returns to act 519 (described above). If the constraints are not satisfied in act 522, then the computer goes directly to act 519. Moreover, if act 522 is not performed, then the computer goes directly to act 523 to mark the block as a match and then goes to act 519 from act 523. Moreover, if the "yes" branch is taken from act 518, then the computer goes directly to act 519.

Figure 6B:
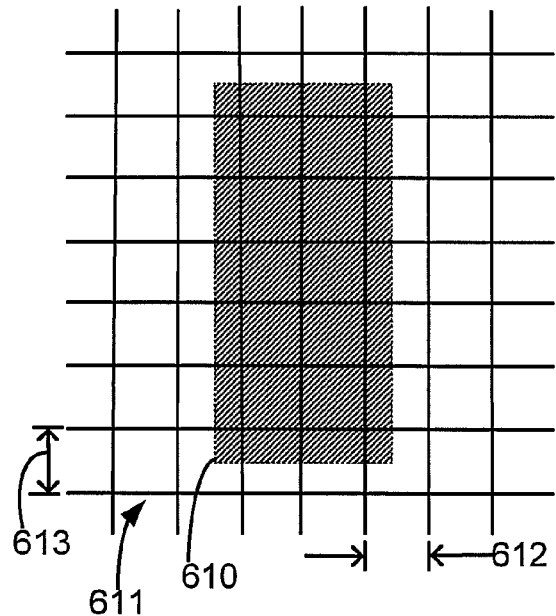
FIGS. 6B and 6C illustrate digitization of a block of a layout by use of a grid that is performed in many embodiments of the invention.

The above-described acts illustrated in FIG. 5H are performed hierarchically, in some embodiments of the invention. Specifically, the method of FIG. 5H is first performed (as illustrated in FIG. 6A) on digitized data of the range pattern and of the layout block generated by using a grid of a predetermined size ("coarse grid") that is selected to be sufficiently large to identify potential matches (including one or more false matches as well as true matches). Next, the method of FIG. 5H is repeated on the potential matches (as illustrated in FIG. 6F) using data obtained from digitization with a grid ("fine grid") that is finer than the coarse grid. The fine grid is designed to have a sufficiently small size to remove false matches from among potential matches identified by use of the coarse grid. For this reason, hierarchical matching refers to use of the two grids of different sizes as described herein.

Before outputting the matched locations at the end of applying the fine grid (e.g. by saving to computer memory or to non-volatile storage medium, such as a hard disk) one or more constraints on relative locations of line segments in the range pattern are also checked, as described above in reference to optional act 522. In two examples of checks performed prior to identifying the matched locations of a layout as hotspots, digitized data at the boundary of the layout block is checked to ensure that no material is present, either all around the boundary ("strict check") or at least at one location on one or more sides of the boundary ("loose check"). Several embodiments solicit user input to enable/disable checks and/or to obtain data used in such boundary checks. A third example of such checks is illustrated by an overlap constraint Omax on the boundaries of two traces 221 and 223 between which is located a middle trace 222 that can get pinched due to overlap, as described above in reference to FIG. 2I.

FIG. 6A illustrates, in a flow chart, matching of a block of a layout to a library of range patterns in some embodiments of the invention using a coarse grid. Initially, a layout that has been output by a routing tool, such as layout 601 is provided as input to an act 602. In act 602, a window of a predetermined size and shape, such as a square window of width w is initialized, at a predetermined location relative to the layout, to select a portion of the layout for comparison with sliced versions of range patterns in a library 605 (located in computer memory). In an illustrative example, the window is selected to be 1000 times grid size, wherein a layout is of size 2 mm×2 mm is digitized using a coarse grid of size (i.e. pitch) selected to be 50 nm (as discussed below), so the window is selected to be 50 µm×50 µm.

In some embodiments, such a window is aligned to the left side of the layout, and depending on the embodiment, the window can be located at the top left corner or the bottom left corner of the IC layout. Note that the window may be alternatively positioned at any location in the layout, such as the top right corner or the bottom right corner of the IC layout. The window is eventually panned across the IC layout, to cover the entire layout, by repeating the acts described below. Although a specific size, a specific initial location of the window and a specific movement of the window across the layout are described herein for illustration, other embodiments use other sizes, initial positions and movements.

Figure 6C:
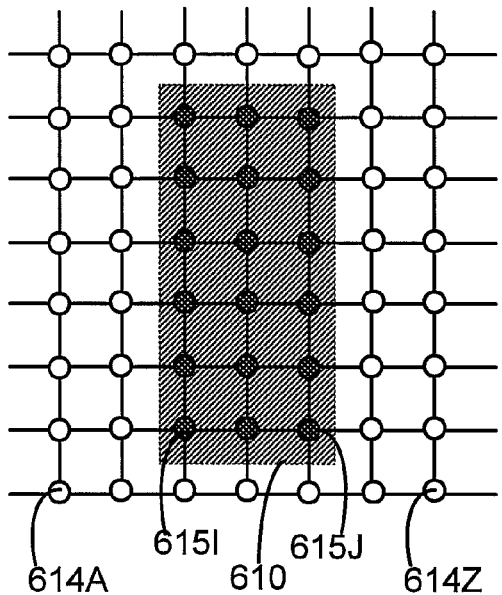

Next, in act 603, presence or absence of material 610 (FIG. 6B) in the portion of layout 601 that is located within the current window is used to generate a matrix for the layout, by representing the presence by a binary value "1", and representing the absence as a binary value "0". Digitization of the layout into a matrix is performed in some embodiments, using a grid 611 formed by a number of vertical lines spaced apart by distance 612 (FIG. 6B) overlaid by a number of horizontal lines spaced apart by distance 613. Intersections of the grid wherein the material is present, e.g. at 615I and 615J (FIG. 6C) are represented by the value "1" and other intersections of the grid where material is absent, e.g. at 614A and 614Z are represented by the value "0". The horizontal and vertical separation distances 612 and 613 of the lines in grid 611 are selected to be identical to one another (called "grid size" or pitch) and the value thereof is greater than a minimum limit. The just-identified minimum limit is selected in some embodiments to be manufacturing grid of a process to be used in fabricating the integrated circuit. Hence, the grid size is selected to be e.g. greater than 5 nanometers.

A larger grid size (than the 50 nm size described above for a coarse grid) is chosen in some embodiments to improve runtime efficiency. However, the larger the grid size (see distance 612, 613 in FIG. 6B) the more likely that different features appear to be the same, from loss of resolution due to digitization. Therefore, digitization results in false positives in potential matches 609 (output by act 604), and the number of false positives in turn depends on the grid size. For this reason, a grid size for grid 611 (FIG. 6B) is selected, in most embodiments, to be at least smaller than a minimum feature size, which is typically specified by a fabrication facility (such as TSMC), e.g. in design rule check (DRC) rules. In several embodiments, to reduce the number of false positives to a sufficiently small number, the grid size (or pitch) is selected to be smaller than half of the minimum feature size. For example, in a 65 nanometer design, if the minimum feature size is 90 nanometers, grid 611 is selected to have a grid size of 45 nanometers.

In the example where a coarse grid size of 45 nm is selected, three grid points are located at the following distances from the bottom left corner of the window, i.e. 45 nm*2=90 nm, 45 nm*3=135 nm, and 45 nm*4=180 nm. So any feature that is of dimension 90 nm to 135 nm appears only as two grid points on the 45 nm grid. Any feature that is of dimension 136 nm to 180 nm appears only as three grid points on the 45 nm grid. If a range pattern in library 605 specifies a range which includes a dimension between 90 nm and 150 nm, and if the resolution jumps from 135 nm to 180 nm, then pattern matching on a layout matrix obtained by digitizing (as per act 604 in FIG. 6A) identifies as potential matches 609 several features which are not truly hotspots but happen to have dimensions greater than 150 nm and less than 180 nm (in addition to truly hotspot features having dimensions from 90 nm to 150 nm).

In several embodiments of the invention, one or more such false positives are removed from potential matches 609, by repeating the matching in regions of the layout 601 containing the potential matches 609, using a second grid of a smaller grid size (as per FIG. 6F; described below) which maintains sufficient resolution in the digitized data to distinguish between a shape that is at 130 nm dimension and another that is at 160 nm dimension. Note that in the following description, the grid (and its size/pitch) used in act 603 in FIG. 6A is referred to as a "coarse grid" (and "coarse grid size"), whereas the corresponding grid (and its size/pitch) used in act 623 in FIG. 6F is referred to as a "fine grid" (and "fine grid size").

Implementation of act 604 (FIG. 6A) to match a submatrix in the layout matrix of window size (output by act 603) to a range pattern in library 605, depends on the specific embodiment. Some embodiments perform matching in act 604 by implementing a method of the type illustrated in FIG. 5H (discussed above). Note, however, that any matching algorithm well known to a skilled artisan may be used to identify within the layout matrix, each submatrix that matches a pattern covered by a selected range pattern from library 605. Such a matching algorithm is performed repeatedly in act 604, for each range pattern in library 605.

Once all potential matches to all range patterns within the current window are identified in act 605, the computer performs act 606 to check if the entire layout has been panned by the above-described window (which was used to digitize a region of the layout in act 603), and if not then the computer proceeds to act 608 to identify a new window's coordinates (e.g. by panning the window), and thereafter returns to act 603 (described above). In act 606, if the entire layout has been covered, the computer proceeds to act 607 to verify potential matches 609 (to screen out one or more false positives) by performing the acts shown in FIG. 6F (described below).

Figure 6D:
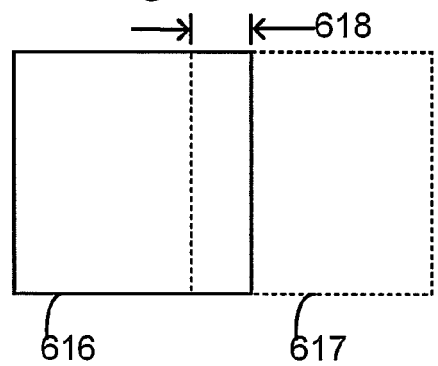
FIGS. 6D and 6E illustrate, in a graph, a window shifting strategy used in some embodiments of the invention to ensure that consecutive windows overlap to avoid missing matches of range patterns to layout regions.

In some embodiments of the invention, in act 608, the window is panned horizontally in incremental movements that maintain a horizontal overlap 618 between a current window 616 (shown by a solid line in FIG. 6D) and the next window 617 (shown by a dashed line in FIG. 6D). Such an overlap 618 is selected to be sufficiently large to ensure that a pattern in the layout 601 (FIG. 6A) that spans from within the window 616 to within the window 617 is not missed (i.e. the location is identified as matched to a library pattern in one of the two windows). Therefore, in some embodiments, a maximum dimension of a range pattern in library 605 is determined (e.g. prior to act 602 in FIG. 6A) and this value is used to set the value of horizontal overlap 618. For example, if the maximum length of a range pattern is m1, the overlap 618 is set to m1+1 in some embodiments.

Figure 6E:
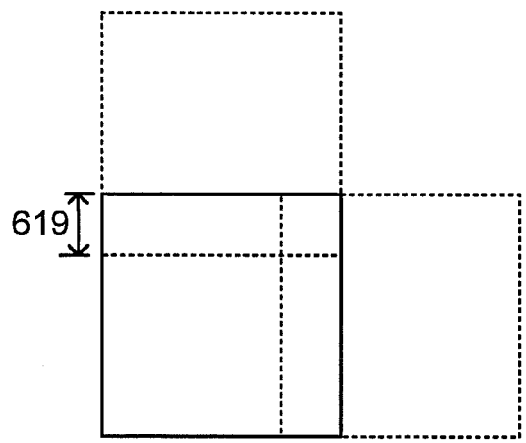

After panning the window in the horizontal direction in this manner across the entire length of the IC layout 601, the horizontal panning of the window is repeated after moving the window vertically up by a distance which is selected to maintain an overlap distance 619 (FIG. 6E) in the vertical direction. Hence, in a manner similar to that described above for the horizontal overlap, if the maximum height of a range pattern is m2, the vertical overlap distance 619 is set to m2+1 in some embodiments.

Although in some embodiments ("horizontal-scanning embodiments"), the computer is programmed to first move the window horizontally, and on traversing through the length of the layout then to move the window up one step in the vertical direction and repeat the horizontal movement, certain embodiments ("vertical-scanning embodiments") of the computer perform such movements in the inverse order, i.e. move the window vertically first across the entire layout followed by one step in the horizontal direction followed by repeating the vertical movement. Still other embodiments may perform such window movement in any order as long as all the window regions that are explored in a horizontal-scanning embodiment (or a vertical-scanning embodiment) are also explored in such other embodiments. Hence, the specific order of movement is not a critical aspect of most embodiments In some embodiments of the invention, the computer is programmed to implement a lower level of hierarchical matching, by performing a method of the type illustrated in FIG. 6F. Specifically, in act 621, the computer inputs potential matches including false positives that were generated in the method of FIG. 6A, from nonvolatile memory or other storage media in which potential matches 609 are stored by the top level of hierarchical matching. Next, in act 622, the computer checks if it has finished checking all of the matches in set 609 of potential matches. If not finished, then the computer goes to act 623 and generates the layout matrix using a fine grid size as discussed above, for a potential match.

Next, in act 624, the computer again implements a matching algorithm of the type described above, for example in reference to FIG. 5F, although the comparison is now done using data obtained by digitizing the layout using the fine grid. In act 624, it is not necessary to compare the layout matrix with each and every range pattern in the library. Instead a range pattern that matched in act 604 to the layout, is stored in memory with each potential match 609, and in act 624 each potential match is compared to its corresponding range pattern from coarse level matching (described above in reference to FIG. 6A).

After act 624 is performed, the computer returns to act 622 (described above). In act 622 if all potential matches identified in set 609 have been checked at the fine level, then the computer goes to act 625. In act 625, the computer outputs into memory as hotspots (which need to be re-routed), all locations in the layout that match a range pattern at the fine level (in act 624), assuming constraints (if any specified) are met, as described elsewhere herein.

Some embodiments of the invention apply the method of FIG. 5H to a window of digitized data, by using blocks of varying sizes as illustrated in FIG. 6G. In some embodiments, a block (of the type shown in FIG. 7) is selected to have a width which is same as the window's width, and to initially have a height same as the minimum height minR of a range pattern which is being compared to the layout. The block's height is varied between minR (just described) and maxR which is the maximum height of the range pattern in increments of one row, and furthermore the block is moved in the vertical direction, to span the entire height of the window. In some embodiments, a block which has the height minR is incremented one row at a time until the maximum height maxR is reached, followed by moving the block up by one row, followed by decrementing one row at a time until the minimum height minR is again reached and this process is repeated. In some embodiments, only a discrete number of blocks between minR and maxR are enumerated, and the enumeration can be done in any order, such as from maxR to minR or vice versa. One such embodiment shortens each subsequent block (in the sequence of enumeration) whereas another such embodiment elongates each subsequent block.

In an example illustrated in FIG. 6G, block 631 is incremented by one row to obtain block 632, and thereafter block 632 is further incremented by one row to obtain block 633 which has the maximum height maxR. Thereafter, once the height maxR has been reached, block 633 is moved up by one row to obtain block 634. Next, the block 634 which is of maximum height maxR is decremented in size by one row to obtain block 635, followed by decrementing once again to obtain block 636. Thereafter, block 636 is moved up by one row to obtain block 637. Block 637 is thereafter incremented by one row to obtain block 638 which in turn is incremented once again to obtain block 639, followed by moving the block up by one row to obtain block 643 which has the maximum height maxR.

Hence, a worm-like movement and re-sizing of the block is performed to span the entire window, when comparing the layout to the range pattern in some embodiments. During such movement, the digitizing of each new block reuses most of the work done in digitizing a previous block. Specifically, during the worm-like movement, in each pair of adjacent blocks, only one row is changed, either at the top or at the bottom of the block and therefore most of the work in digitizing the remaining rows is reused between the two adjacent blocks. For example, in FIG. 7, when bottom row 777 is dropped, and a new top row (not shown) is added, the boundaries of slices 700-712 (shown by dashed lines) may remain the same, although within each slice the boundaries of fragments therein may (or may not) change.

In some embodiments of the invention, a sequence of bits that represent the presence or absence of matter in an IC layout is encoded into a single value for each slice as follows. Specifically, the computer encodes each slice by appending a bit "1" as the most significant bit in the sequence, to distinguish between the sequence "01" (which denotes the absence of matter and the very bottom followed by presence of matter) and the sequence "1" (which denotes the presence of matter at the very bottom). For example, a sequence for slice 551 (FIG. 5E) which contains a single fragment F00 of binary value 1 when prepended with another binary value 1, result in the encoded binary value "11", which has the decimal value 3.

Similarly, a sequence for slice 552 (FIG. 5E) which includes fragments F10 and F11 of respective binary values 0 and 1, when prepended with the binary value 1 results in the encoded binary value "101" which has the decimal value 5. The just-described encoded binary value for slice 552 is obtained as follows: 1 (msb), 0 (F10) and 1(F11). Furthermore, a sequence for slice 553 which includes the fragments F20, F21 and F22 of the respective binary values 1, 0 and 1 when prepended with the binary value 1 results in the encoded binary value "1101", which has the decimal value 13. Slices 554 and 555 when similarly encoded have also the decimal values 5 and 3, similar to slices 552 and 551 described above. Therefore, the mountain pattern illustrated in FIG. 5G is encoded into the one dimensional string 3, 5, 13, 5, 3.

The above-described encoding method for each slice is applied not only to a range pattern as described above but also to a layout block of the type illustrated in FIG. 7. Specifically, slices 700-712 of FIG. 7 when encoded have the decimal values 2, 10, 10, 2, 3, 5, 13, 5, 3, 2, 10, 10, 2. After such encoding, when the just-described one dimensional string of decimal values for the block in FIG. 7 is compared with a corresponding string of decimal values for the range pattern illustrated in FIG. 5E, notice that there is an exact match starting with slice 704. As described elsewhere herein, such comparison is performed in some embodiments of an appropriately programmed computer, by use of any exact string matching method. An alternative encoding scheme for a slice of some embodiments represents a fragment as a 1 or 0 in the manner described above, and then counts the number of 1s in the slice (and this number is denoted as "n"). In this alternative encoding scheme, if the first fragment of slice is 1, this entire slice is represented as +n (i.e. a positive number), else this slice is represented as −n (i.e. as a negative number). This alternative encoding scheme also replaces each slice with a number (see acts 1113 in FIG. 1B and FIG. 18, see act 1133 in FIG. 11D, see act 1307 in FIG. 13A and see act 1309 in FIG. 19). Hence, in the alternative encoding scheme as well, both the range pattern and the layout are represented as a string of numbers and thereafter a matching of the range pattern to the layout is performed as described above.

In some embodiments of the invention, library 605 of range patterns initially contains data on each range pattern in a format as provided by the user, e.g. relative positions of edges of rectangles in the range pattern, such as R1.l (left edge of first rectangle), R1.r (right edge of first rectangle), R1.b (bottom edge of first rectangle) and R1.t (top edge of first rectangle). Such a library of range pattern is processed in such embodiments as illustrated by the method in FIG. 8A. Specifically, in act 801, the computer is programmed to select a range pattern from library 605. Next, in act 802, the computer sets up an adjacency matrix which identifies the distance (or range) between parallel edges of the selected range pattern, based on the user input data (described above). For example, if a range pattern that is selected in act 801 is the staircase pattern illustrated in FIG. 2I, then in act 802 the computer sets up a square matrix of size 6 to identify the distances (or ranges) between all horizontal edges, because there are six horizontal edges whose distance from one another is specified in the range pattern in library 605. Note that an adjacency matrix contains as its elements, the dimensions (or limits thereon) of a range pattern in a specific direction, such as horizontal direction or vertical direction.

Examples of the adjacency matrices for horizontal distances and vertical distances in the staircase range pattern are illustrated in FIGS. 8C and 8D respectively. An element [1][2] in such an adjacency matrix (i.e. located at row 1, column 2) in FIG. 8C defines a distance (or range) between bottom edge R1.b (edge 223B in FIG. 2I) and top edge R1.t (edge 223T in FIG. 2I), i.e. the width (or width range) of rectangle 223, e.g. the range (90, 150) nanometers. An element of the adjacency matrix that is at a complementary location relative to another element in the matrix typically has values that are opposite. For example, an element in the adjacency matrix of FIG. 8C at the complementary location [2][1] has the range (−150, −90), which is negation of the range (90, 150) for element [1] [2]. Such opposite ranges are required to ensure consistency. Each element in the adjacency matrix of several embodiments has a pair of values representing the minimum and maximum limits of the range as illustrated in FIG. 8C. However, in some embodiments, each element further includes (in addition to the two limits of the range), an optimal value for use in scoring (and prioritizing) a hotspot in the layout that matches the range pattern. In such embodiments, each element in the matrix has three values: minimum, maximum and optimal.

Next, in act 803, the computer automatically computes one or more ranges between edges of the selected range pattern which are uninitialized. Typically, a user may not initialize ranges between non-adjacent edges, such as a range on an overall dimension of the range pattern. In the example shown in FIG. 2I, while a range between edges 222B and 222T is initialized in act 802, the range between edges 223B and 222B, and the range between edges 223B and 222T is computed in act 803. The range between edges 223B and 222B is computed in some embodiments as the sum of the width range and the spacing range. During such computation, the minimum limits of two (or more) ranges are added to obtained the minimum limit of a combined range, and the maximum limits of the ranges are added to obtain the maximum limit of the combined range. For example, if a range for trace width in range pattern 220 has been specified to be (90 nm, 90 nm) and if the spacing between adjacent traces is specified to be (90 nm, 130 nm), then the range (Hmin, Hmax) on the overall height of range pattern 220 is automatically computed by the computer to be (450 nm, 530 nm).

Figure 8A:
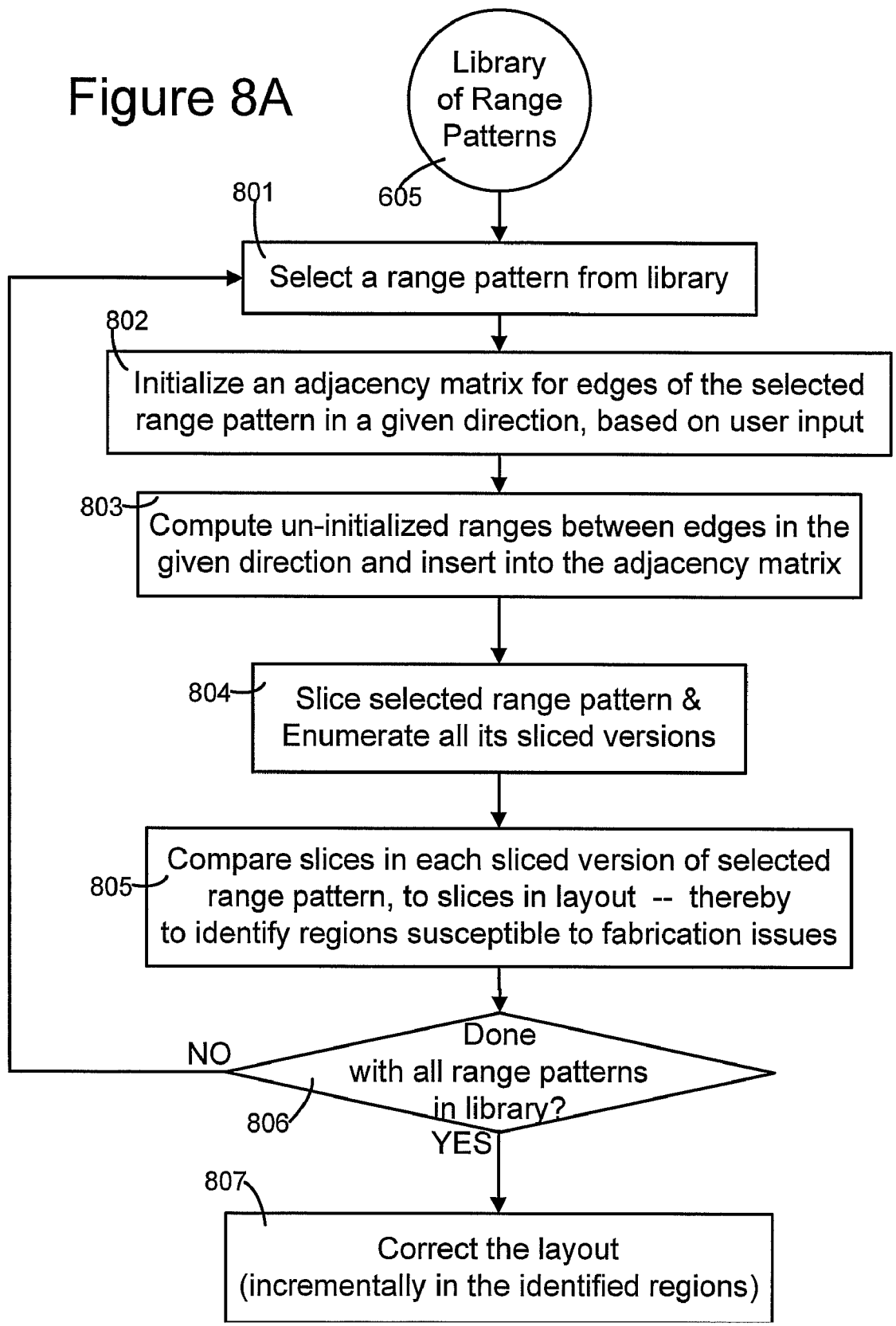
FIG. 8A illustrates, in a flow chart, acts performed in accordance with the invention, to slice a range pattern, followed by comparison of the pattern slices resulting therefrom, with a sliced version of the block of the layout.

In act 803 of several embodiments, the computer computes a range for each relative distance between every pair of non-adjacent edges in every range pattern in a library to be used for detecting hotspots. After such computation, some embodiments of the computer automatically correct (if appropriate) a previously initialized value for a range, if such value differs from a corresponding value obtained by such computation. The values may differ, for example, due to user error in inputting the data. Note that such errors are detected only in those embodiments which compute such ranges even if already initialized. Thereafter, in act 804, the computer automatically slices the selected range pattern, and uses the adjacency matrix to enumerate all sliced versions of the range pattern. A range pattern may be sliced by the computer in any direction, e.g. in the longitudinal direction of traces, depending on the embodiment. In some embodiments, the direction of slicing is selected by performing a method described below in reference to FIG. 8D. Note that acts 801-804 in FIG. 8A are merely an illustrative implementation of act 511 in FIG. 5H which may be implemented differently in other embodiments. Each range pattern's sliced version(s) that have been enumerated are stored in computer memory, e.g. in a library, for future use in comparison with an IC layout. An example of a data structure for storing a range pattern's sliced version is illustrated in FIG. 8B.

Figure 8B:
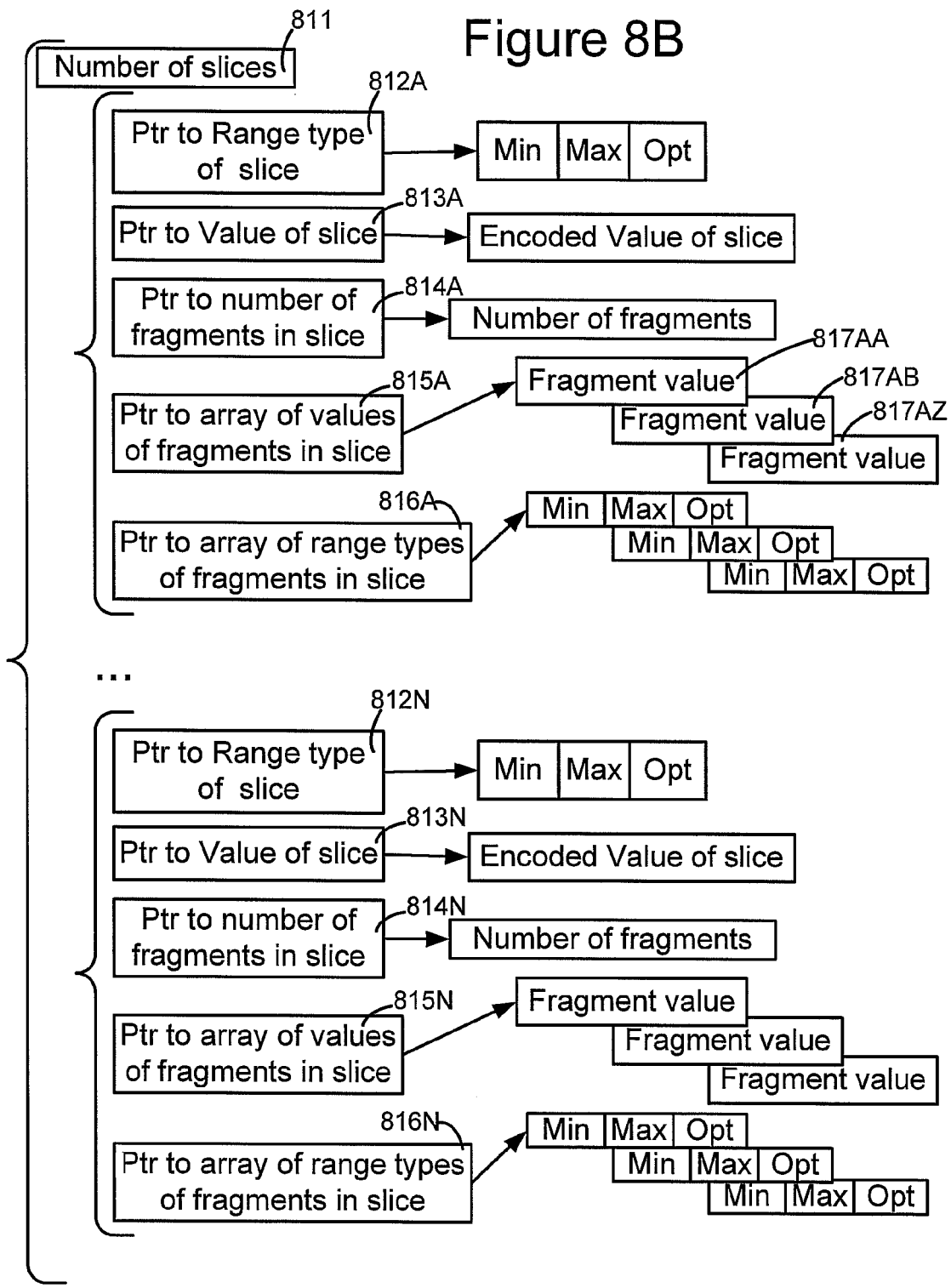
FIG. 8B illustrates, in a block diagram, a data structure for a sliced version of a range pattern in a computer memory in accordance with the invention.

The sliced pattern data structure of the example illustrated in FIG. 8B is as follows: Integer sliceNum (Number of slices—see field 811 in FIG. 8B); RangeType *sliceRange (Pointer to Range information of each slice—see fields 812A-812N); Integer *sval; (Pointer to encoded value of each slice—see fields 813A-813N); Integer *fNum; (Pointer to number of fragments in each slice—see fields 814A-814N); Integer fVal; (Pointer to an array of values of each fragment in each slice—see fields 815A-815N); and RangeType fRanges; (Pointer to array of range information of each fragment—see fields 816A-816N). Note that RangeType is a datastructure with 3 integer fields: min, max and opt.

Note that act 804 determines the slice widths and fragment lengths which information is subsequently used, as described above in reference to acts 515 and 517 described above. Next, in act 805, the computer compares slices in each sliced version of a selected range pattern to slices in the layout, to find one or more locations in the layout that are susceptible to fabrication issues. Thereafter, the computer checks in act 806 to see if all of the range patterns in the library have been sliced and used in comparison with the layout. If so, the computer proceeds to act 807 to change routing in those locations in the layout that have been flagged as hot spots in act 805. In act 806, if all of the range patterns in the library 605 have not yet been processed, then the computer returns to act 801 (described above).

In some embodiments of the invention, acts 802 and 803 and a modified version of act 804 of FIG. 8A are performed twice, once for slicing in the horizontal direction and another time for slicing in the vertical direction, as illustrated by acts 802A, 803A and 804A for vertical slicing, and acts 802B, 803B and 804B in FIG. 8D. Note that act 804 of FIG. 8A is modified in FIG. 8E by counting the number of sliced versions, instead of enumerating them in acts 804A and 804B. Thereafter, in act 811, the computer is programmed to check if the number of sliced versions in the vertical direction is less than the number of sliced versions in the horizontal direction. If so, the computer goes to act 812A to identify all of the vertically sliced versions that are needed to adequately represent the range pattern (as described above in reference to FIGS. 5C and 5D), and also to identify individual slices and fragments and their ranges in each of the sliced versions. If in act 811, the answer is no, then the computer proceeds to act 812B, which is similar to act 812A except for identification of horizontally sliced versions and the slices therein. Therefore, the method of FIG. 8E minimizes the number of sliced versions of a range pattern that are matched to a layout.

In several embodiments of the invention, acts 803A and 803B are implemented by performance of a method in an appropriately programmed computer to automatically compute uninitialized ranges between edges of the range pattern, in the respective directions. Specifically, at the beginning of this method, all ranges that are uninitialized (by the user) in the adjacency matrix are automatically initialized to (−∞, +∞), followed by automatically checking for the smallest upper bound and the largest lower bound on each range. Note that in FIGS. 8C and 8D (described below) MN denotes −∞ and MX denotes +∞. Some embodiments use a graph traversal method on a graph in which each node represents an edge in the range pattern, and each arc in the graph represents a distance between two edges in the range pattern. Note that an adjacency matrix represents such a graph, wherein presence of a value at location [i][j] in the matrix represents an arc in the graph. Each arc in the graph is associated with a weight, which may be one of the limits of the range, either the minimum limit or the maximum limit.

Note that the weights for such a graph are based on the ranges that the user provides, and any range that is not provided by the user is initialized to (−infinity, +infinity), and this pair of initialized values is overwritten with a corresponding pair computed using the Floyd Warshal algorithm as described below.

The Floyd Warshall algorithm is used in some embodiments of a computer that is programmed to perform acts illustrated in FIG. 9A to find the shortest path between any two nodes in the graph (i.e. edges of the range pattern). Specifically, two graphs are traversed by use of the Floyd Warshall algorithm in FIG. 9A, one graph contains maximum limits and is traversed in act 904 and the other graph contains minimum limits and is traversed in act 906 as discussed next.

In act 904, the computer checks to see if there is a path (formed of arcs of the graph) between nodes [I] and [J], via a node [K] whose maximum value is less than the maximum value of a direct path between nodes [I] and [J]. If so, the computer goes to act 905 and replaces the maximum value for the direct path between nodes [I] and [J], with the newly-found value maximum value via node [K]. In act 904, if the answer is no, the computer proceeds to act 906. The computer also enters act 906, on completion of act 905. Note that some embodiments perform an act (not shown) prior to performance of act 904, wherein the computer checks to make sure that the value of I is not equal to the value of J, and the value of I is not equal to the value of K, and the value of J is not equal to the value of K, thereby to avoid diagonal elements of the adjacency matrix (which are null and should remain null).

In act 906, the computer checks to see if there is a path between nodes [I] and [J] via node [K] is whose minimum value is greater than the minimum value of a direct path between nodes [I] and [J], and if so the computer goes to act 907 to update the minimum value, and otherwise proceeds to act 908. The computer also proceeds to act 908 after completion of act 907. In act 908 the computer checks if the value of J has run through the number of rows in the adjacency matrix, and if not returns to act 903 which increments J and proceeds to act 904. In a similar manner, the computer loops over I in acts 909 and 902, and over K in acts 910 and 901. Performance of such a method on the adjacency matrix in FIG. 8C, yields the matrix illustrated in FIG. 9B.

A computer-implemented method of the type illustrated in FIG. 9A (with or without use of the Floyd Warshall algorithm) is useful when multiple potential paths exist between any two parallel edges of a range pattern (e.g. between the topmost edge and bottommost edge of the range pattern). Multiple paths between two graph nodes (i.e. edges in a range pattern) are common in complex patterns, e.g. if the staircase pattern was modified by adding a fourth rectangle adjacent to the middle rectangle, such a modified staircase has two paths which take into account, among other dimensions, the widths of the two middle rectangles which could be different. In such a case, the method of FIG. 9A identifies the tightest range for an overall dimension of the range pattern, i.e. the lowest maximum limit and the largest minimum limit.

In many embodiments, a method of the type illustrated in FIG. 9A is performed twice, respectively for two adjacency matrices which in turn respectively contain distances between edges oriented in horizontal and vertical directions. Note that the range data-structure of some embodiments has at least the following three integer fields: min, opt and max. So a check is performed in the appropriately programmed computer to ensure legal values thereof, e.g. by testing if min <0 or =0 or >0. Similar check is performed for legal values of max. Illegal optimal values can arise as a result of incorrect user specification. Hence, the check for legal values is done twice in many embodiments: once to determine validity of user input and secondly to count and enumerate number of cutting slices. The user input is valid if and only if allowable range between adjacent line segments is greater than zero. Optimal values for edge (i,j) can only be computed for an uninitialized range if there is an alternate path between (i,j) where all the edges have optimal values. In some embodiments, if the optimal value is illegal the matching process does not abort, as the optimal value is not very critical.

Figure 10A:
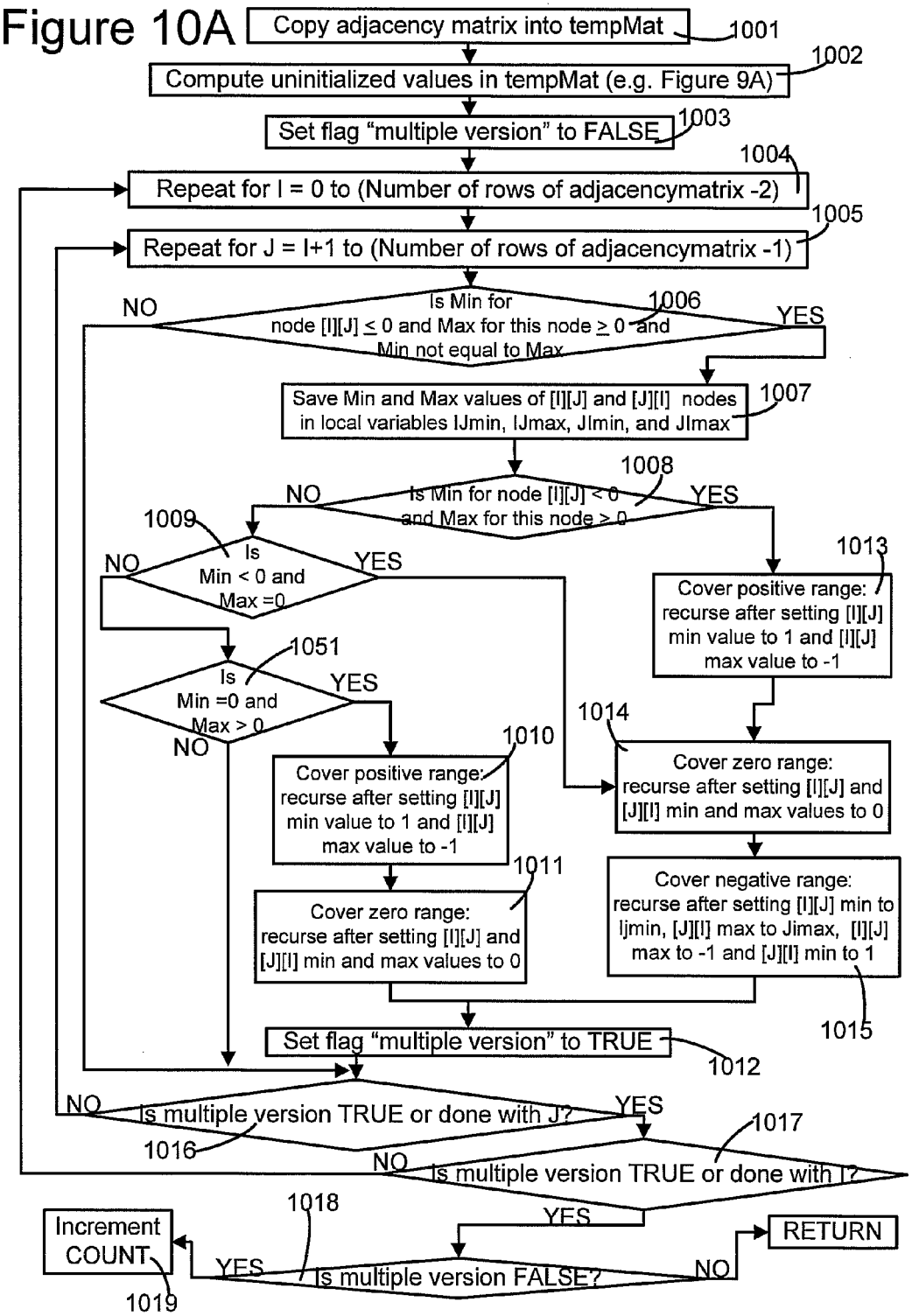

In some embodiments of the invention, the number of sliced versions that are required to represent a range pattern as described above in reference to acts 804A (vertical slicing) and 804B (horizontal slicing) are identified by programming a computer to perform a method of the type illustrated in FIG. 10A. Typically, such a method checks if a range (for a dimension in the range pattern) spans across the zero value, e.g. whether the maximum limit is greater than or equal to zero, and/or the minimum limit is less than or equal to zero and accordingly identifies the number of sliced versions that are required. Specifically, in act 1001, the computer copies an adjacency matrix into a temporary matrix "tempmat".

Next, in act 1002, the computer performs a method of the type described above in reference to FIG. 9A, to compute any uninitialized dimensions in the matrix. Thereafter, the computer goes to act 1003 and sets a flag called "multiple version" to FALSE. This flag indicates whether or not the current range pattern can be represented by a single version thereof when sliced. Next, in acts 1004 and 1005, the computer initializes the respective variables I and J. Specifically, I is set to a value between 0 and (number of rows of the adjacency matrix-2). Note that this embodiment only evaluates an upper triangular matrix, and so the formula for the upper limit on variable I's value is sufficient. Similarly, variable J is set to a value between I+1 and (number of rows of the adjacency matrix-1).

Next, the computer checks, in act 1006, if the minimum limit for node[I] [J] is less than or equal to zero and the maximum limit for node[I] [J] is greater than or equal to zero, and moreover if the minimum limit is not equal to the maximum limit. Whether or not the conditions of act 1006 are met depend on the range pattern's geometric arrangement of edges therein and on the dimensions thereof, e.g. dimension Omax of the staircase range pattern (FIG. 2I) may have a minimum limit which is negative for the range pattern to cover a pattern wherein the rectangle 221 does not overlap rectangle 223 in the vertical direction, and a maximum limit which is positive for the range pattern to cover a pattern wherein the rectangle 221 does overlap rectangle 223. In the staircase range pattern (FIG. 2I), the dimension Omax may have both limits negative if the range pattern only covers patterns wherein rectangle 221 always does not overlap rectangle 223. Similarly, the dimension Omax may have both limits positive if the range pattern only covers patterns wherein rectangle 221 always overlaps rectangle 223.

If the conditions are met in act 1006, the computer proceeds to act 1007, and alternatively if the conditions are not met the computer proceeds to act 1016 without changing the flag. In act 1007, the computer saves the minimum and maximum limits of node[I][J] and node[J][I] in the local variables IJmin, JImin, IJmax, JImax (i.e. makes copies thereof) and subsequently (as discussed next), the method calls itself recursively for each of two or three subranges that are present within the current range. Specifically, the computer goes to act 1008 and checks if the minimum limit for the node[I][J] is less than zero and the maximum limit for this node[I] [J] is greater than zero, i.e. the range contains subranges for positive values, zero and negative values. As discussed above, in the staircase range pattern (FIG. 2I), the dimension Omax having a positive subrange covers rectangle 221 overlapping rectangle 223, a negative subrange covers rectangle 221 not overlapping rectangle 223, and the zero subrange covers rectangle 221 touching rectangle 223 (in the vertical direction only—not physically).

If so, the computer goes to act 1013 and covers the positive range by recursing the method of FIG. 10A after setting the minimum limit of node[I][J] to the value 1 and the maximum limit of node[I][J] to the value −1. On returning from recursing in act 1013, the computer goes to act 1014 to cover the zero range, by recursing the method of FIG. 10A after setting the minimum and maximum limits for node[I][J] and node[J][I] to the value 0. On returning from recursing in act 1014, the computer goes to act 1015 to cover the negative range, by recursing the method of FIG. 10A after setting the minimum limit of node[I][J] to the value IJmin, the maximum limit of node[J] [I] to the value JImax, the maximum limit of node[I] [J] to −1 and the minimum limit of node[J][1] to 1. On completion of recursing in act 1015, the computer goes to act 1012 to set the flag "multiple version" to TRUE, and thereafter goes to act 1016.

In act 1016, the computer checks if the flag "multiple version" is TRUE, or if iteration on variable J is completed and if not the computer returns to act 1005 (described above). If the answer in act 1016 is yes, then the computer proceeds to act 1017 and checks if the "multiple version" flag is TRUE or if the looping on variable I has been completed and if both conditions are not met the computer returns to act 1004 (described above). If the answer in act 1017 is yes, the computer proceeds to act 1018 to check if the "multiple version" flag is FALSE and if so goes to act 1019 wherein the computer increments a counter for the number of sliced versions, and thereafter returns. If the answer in act 1018 is no, the computer returns without incrementing the number of sliced versions.

In act 1008, if the answer is no, the computer proceeds to act 1009 to check if the minimum limit is less than zero and the maximum limit is equal to 0 for the node[I] [J]. If the answer is yes in act 1009, then the computer goes to act 1014 (described above). If the answer in act 1009 is no, the computer proceeds to act 1050 to check if the minimum limit is equal to zero and the maximum limit is greater than 0 for the node[I][J]. If the answer in act 1050 is yes, the computer proceeds to act 1010 to cover the positive range. Specifically, in act 1010, the computer sets the minimum limit of node[I] [J] to 1 and the maximum limit of node[I][J] to −1 and thereafter recurses by performing the same method illustrated in FIG. 10A. After completion of recursion in act 1010, the computer proceeds to act 1011 to cover the zero range. Specifically, in act 1011, the computer sets the minimum limit and the maximum limit for the node[I] [J] and for the node[J] [I] to the value zero, and thereafter recursively performs the method shown in FIG. 10A. On completion of recursing in act 1011, the computer proceeds to act 1012 (described above). Note that in act 1050 if the answer is no, then the computer proceeds to act 1016 (described above).

In some embodiments of the invention, acts 812A and 812B (described above in reference to FIG. 8D) are performed in a manner similar or identical to that described above in reference to FIG. 10A, except that act 1019 is replaced with another act 1020 as illustrated in FIG. 10B. Specifically, in act 1020, the computer generates each of one or more sliced versions of the range pattern, by traversing the range pattern from one end to the other end (transverse to slicing direction), and identifying each slice in the sliced version. In some embodiments, the computer checks if there is a change in an element of a row relative to its previous row, and starts a new slice if a change is found. Note that in FIG. 10C acts 1021 or 1022 are implicitly defining slice boundaries. In other embodiments, the computer performs other acts to identify boundaries between slices, e.g. by use of each pair of adjacent edges in a given direction (e.g. horizontal) to define a slice. For example, if R1.*t* and R1.*b* are used as the pair of adjacent edges, the computer may be further programmed to use R1.*t*-R1.*b* to define the slice's width range.

Exemplary acts which are performed by the computer in some embodiments of the invention are illustrated in FIG. 10C, described next. Specifically, in some embodiments of the invention, the computer is programmed to sort all of the vertical edges horizontally and the horizontal edges vertically, in the respective topological orders, in acts 1021 and 1022 respectively. Thereafter, in act 1023, the computer checks if the direction of slicing of the sliced range pattern is in the horizontal direction, and if so the computer goes to act 1026. In act 1026, the computer scans the horizontal edges vertically, to determine the boundary of each horizontal slice, and thereby to compute a range for the height of each horizontal slice.

Next, in act 1027 the computer scans vertical edges horizontally to compute, for a given horizontal slice, the range of each fragment's width range (i.e. the minimum limit and the maximum limit). Thereafter, the computer loops on this act 1027 until each horizontal slice is processed, i.e. all fragments have been identified. Next, in act 1028, the computer converts the distance is between two or more non-adjacent edges of the range pattern into additional constraints. Thereafter, in act 1029, the computer stores in computer memory, the slices, fragments and constraints which have been generated for a current sliced version of a current range pattern.

In act 1023 if the answer is no, i.e. the slicing direction is vertical, and therefore the computer goes to act 1024, which is similar to act 1026 (described above), except that vertical edges are now scanned horizontally, to compute a range for the width of each vertical slice. Next, in act 1025, which is similar to act 1027, the computer scans the horizontal edges vertically to compute a range for each fragment's height. Act 1025 is performed repeatedly for each vertical slice that was identified in act 1024, and on completion thereof the computer goes to act 1028 (described above).

In some embodiments of the invention, the computer is programmed to use sliced versions of the range patterns (which are held in a library in the computer memory) to identify one or more locations in a layout that are likely to be poorly printed, i.e. result in hot spots during fabrication, as illustrated in FIG. 11A. Specifically, in such embodiments, the computer performs an act 1101 in which a coarse grid is used to identify any blocks of an IC layout that match a range pattern in the library. Act 1101 uses a coarse grid to quickly screen out large portions of the IC layout that are unlikely to match a range pattern. Thereafter, in act 1102, the computer uses a fine grid to identify shapes in the IC layout that match range patterns in the library, from among layout blocks that matched a range pattern at the coarse level in act 1101.

Next, in act 1103, the computer automatically eliminates one or more matches (also called "occurrences") of the range patterns that are redundant with one another, i.e. duplicates, e.g. by checking if their layout locations are within a predetermined distance from one another. The predetermined distance may be less than, for example, minimum feature size in the IC layout (or a fraction thereof) in some embodiments, while in other embodiments the predetermined distance may be specified based on a manufacturing grid or a minimum resolution of the process to be used in fabricating the IC layout. After act 1103, the computer goes to act 1104 and checks if all the range patterns have been checked in all directions, and if so the computer returns with the matches that have been found so far.

In redundancy checking of some embodiments, only matches with overlapping boundaries in both horizontal and vertical directions are checked. Otherwise, they are all regarded as different matches in such embodiments. A simple method for checking redundant matches compares each pair of matches to one another, to see if they refer to the same occurrence, although it is time-consuming. Some embodiments adopt a more computationally efficient solution by sorting the bottom left corner of the matches first in horizontal direction and then sorting matches, whose bottom left corners are standing on the same vertical line, in the vertical direction. In that way, these embodiments only compare adjacent matches in a sorted queue.

In act 1104, if all four orientations of each range pattern (oriented East, West, North, South) relative to the IC layout have not been checked for matches, and then the computer goes to act 1105, wherein the range patterns are rotated by 180 degrees (assuming a specific direction for the range patterns was not specified) and thereafter the computer returns to act 1101. One or more directions for each range pattern may be specified, for example, by a fabrication facility ("fab"), or by the user when defining the range pattern, in which case occurrences of patterns in the IC layout are checked for coverage by the range pattern only the specified direction(s).

Figure 11B:
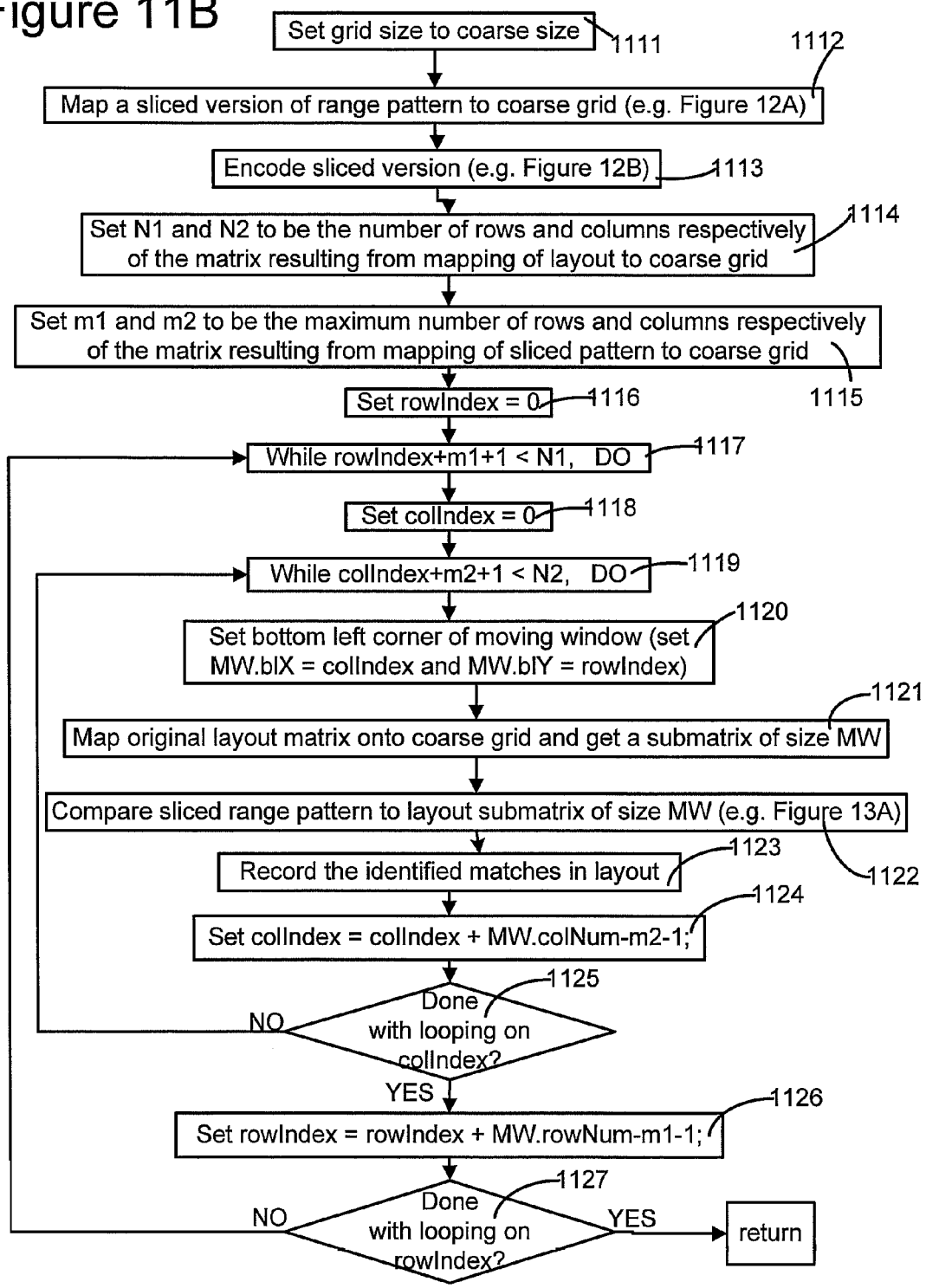
FIGS. 11B and 11D illustrate, in flow charts, methods for matching a sliced version of the range pattern to a block in a layout that are digitized using a coarse grid and a fine grid respectively.
Figure 11C:
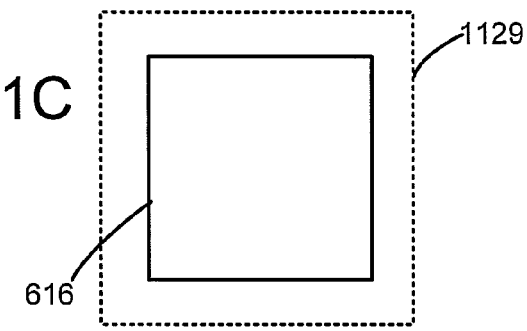
FIG. 11C illustrates, in program, two different block sizes that are used in the flowcharts of FIGS. 11B and 11D.
Figure 11D:
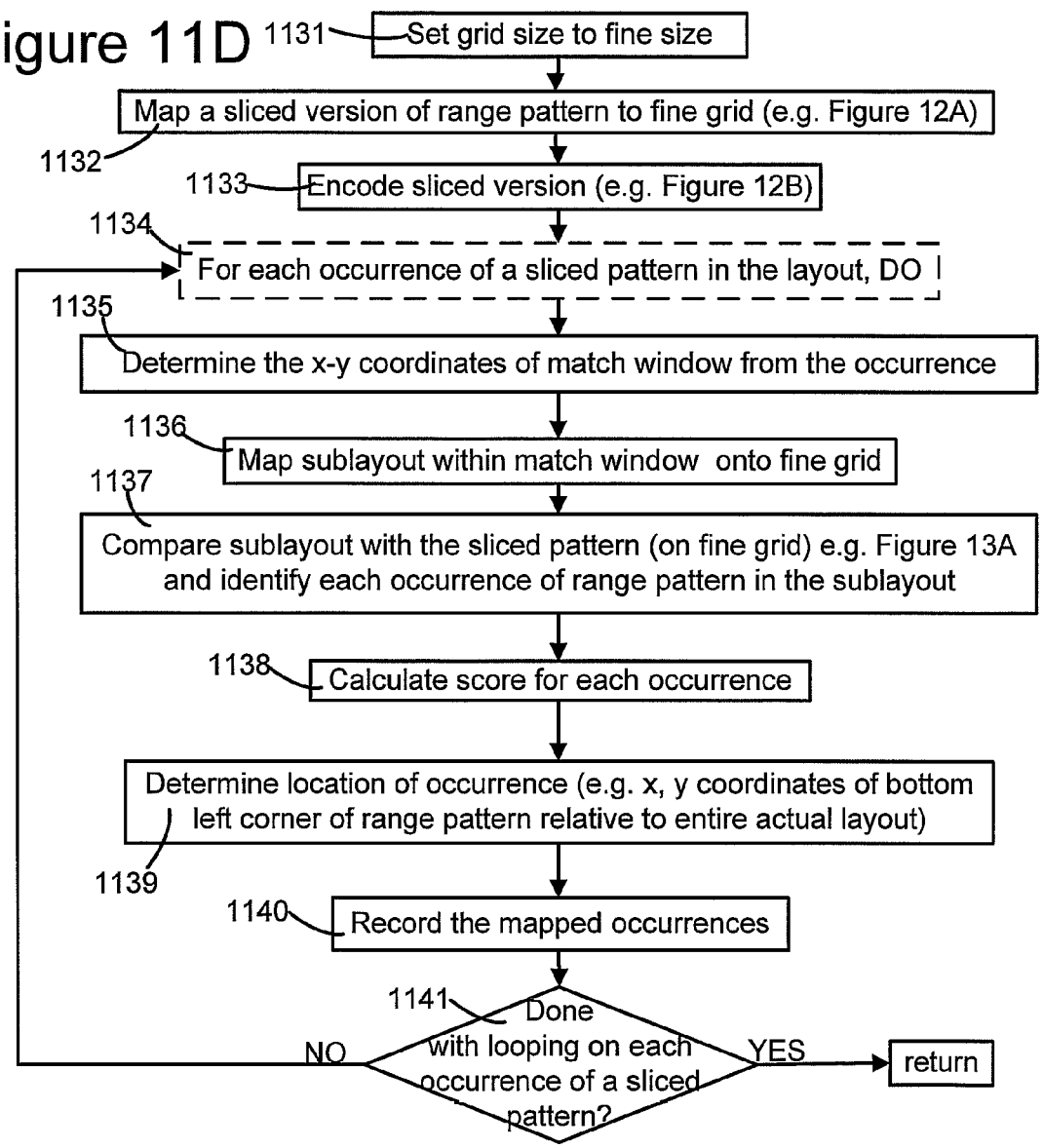

In some embodiments of the invention, a computer is programmed to perform the method of FIG. 11B, to identify one or more locations in a layout that match a range pattern in a library of the computer's memory. Specifically, in act 1111, the computer sets the grid size for a coarse stage (to be performed by the method in FIG. 11B), e.g. the value 50 nm is typically used. The grid size may be selected to be sufficiently small so that each rectangle in the layout is larger in its smallest dimension than the selected grid size. If the minimum width of a trace in the layout is 90 nm, then the grid size for the coarse grid may be selected to be less than 45 nm. The specific value chosen for the grid size typically involves a tradeoff between the amount of CPU time and resources required to perform the method of FIG. 11B (which increases as the grid size is reduced) and the number of false positives that are likely to be identified (which increases with larger grid size). Note that an increase in the number of false positives increases the amount of work to be done by another stage that uses a fine grid (described below) to screen out the false positives, e.g. as illustrated in FIG. 11C.

Next, in act 1112, the computer digitizes the sliced version of a range pattern, specifically by mapping the sliced version to the coarse grid, for example as described below in reference to FIG. 12A. Note that the digitization can be performed in any manner as will be apparent to the skilled artisan, in view of one specific embodiment illustrated in FIG. 12A. Next, in act 1113, the computer encodes the sliced version, e.g. by converting bits in a sequence that represent the presence and absence of material in a slice into an encoded value for the slice. Encoding of slices can be performed as illustrated in one embodiment in FIG. 12B.

Thereafter, in act 1114, the computer sets N1 and N2 to be the number of rows and columns respectively of the matrix resulting from mapping of the IC layout onto a coarse grid. In a typical IC layout, note that N1 and N2 will be in the range of a million. Next, in act 1115, the computer sets m1 and m2 to be the maximum number of rows and columns respectively of the matrix resulting from mapping of the sliced version of the range pattern to the coarse grid. Note that the values for m1 and m2 are typically in the range of 1 μm, which translates into 15 to 20 grid units depending on the grid size. Thereafter, in act 1116, the computer sets the row index zero. Next, the computer goes to act 1117 and checks if the sum (rowIndex+m1+1) is less than N1, and if so the computer performs acts 1118-1127, which are described next. Note that the overlap is "m1+1" and not just m1 to round up (instead of round down) the overlap distance when expressed in grid units.

Specifically, in act 1118, the computer sets the column index to zero, and then proceeds to act 1119. In act 1119, the computer checks if (colIndex+m2+1) is less than N2, and if so the computer performs the following acts 1120-1125. Specifically, in act 1120, the computer initializes a bottom left corner of a moving window (e.g. window 616 illustrated in FIG. 6D). In one embodiment, the computer holds in memory a data structure for the moving window which includes the following fields: blX, blY, colNum, and rowNum. The fields blX, blY indicate the x coordinate and the y coordinate respectively of the bottom left corner of the moving window, while the fields colNum, and rowNum indicate the height and width of the moving window respectively. The fields colNum, and rowNum are typically both set to 1000, although a smaller or larger window may be used in other embodiments. Note that to avoid missing patterns in the layout that are covered by a range pattern, the moving window's dimensions should be at least as large as the largest dimensions in the range pattern.

In one embodiment, the field blX is set to colIndex, and the field blY is set to rowIndex in an act 1120. Next, in act 1121, the computer maps the original layout matrix to the coarse grid, and obtains therefrom, a submatrix of size equal to the moving window. In some embodiments, the entire layout is not first mapped onto the coarse grid as indicated by act 1121 in FIGS. 11B and 18. Instead, in these embodiments, the layout is mapped to the coarse grid incrementally, for example in some embodiments only the layout contained in the moving window is mapped to the coarse grid.

While the submatrix may be obtained from any location in the original layout matrix, in some embodiments the location is selected to be the bottom left corner of the layout matrix, and the location is changed by movement of the window in the manner described above in reference to FIGS. 6D and 6E. Next, in act 1122, the computer compares a sliced version of the range pattern to the submatrix of the layout, and in act 1123 records any matches that have been identified during such comparison. Typically, the computer records in its computer memory the boundaries of each region covered by location of a moving window 616 (FIG. 6D) in which a match was found ("coarsely matched region") and also an identity of the sliced version of the range pattern which matched the layout within moving window 616. The comparison in act 1121 is performed in any manner, as described above in reference to act 805 in FIG. 8A. Such comparison may involve, for example, moving a block within the moving window in the manner illustrated in FIG. 6G (described above).

Next, in act 1124, the computer increments colIndex by colNum−(m2+1), so as to maintain an overlap between two adjacent moving windows, of at least m2+1 as described above in reference to FIG. 6D. As noted above, colNum and rowNum are both typically of value 1000 for a square shaped moving window of size 1000. Next, in act 1125, the computer checks if the looping on colIndex has been completed and if not returns to act 1119. If the looping has been completed on colIndex in act 1125, the computer proceeds to act 1126. In act 1126, the computer increments rowIndex by rowNum−(m1+1). Thereafter, the computer goes to act 1127 and checks if looping on rowIndex has been completed and if completed then the computer returns from performing the method in FIG. 11B, and otherwise if not completed the computer returns to act 1117 (described above).

Matches that have been recorded in act 1121 are verified in some embodiments, using a finer grid size than the grid size used in the method of FIG. 11B. Specifically, the "coarse matched region" in which a match was recorded in act 1123 (FIG. 11B) is enlarged in some embodiments to another window 1129 (FIG. 11C). Window 1129, also referred to as a matching window is obtained by expanding the "coarse-matched region" by a predetermined amount in all directions, e.g. by one row or one column (i.e. one grid unit) on each of four sides but centered at the same center as window 616. Although in this example, the matching window 1129 is obtained by expanding the boundaries of a coarse matched region by just one grid unit, in other examples other number of grid units may be used, for example 8 grid units are used in some embodiments to obtain a matching window from the coarse matched region.

Expansion of the window as illustrated in FIG. 11C enables the computer, for example, to check that boundary values around a pattern in the layout are in fact zero (confirming that the layout's pattern matches the range pattern even at the boundaries, and such a check is also called "strict check"). Such a matching window 1129 is used in some embodiments, by a method of the type illustrated in FIG. 11C, to verify by use of a fine grid size the presence of a pattern in the IC layout which matches the range pattern identified in act of 1123. Specifically, in act 1131, the computer sets the grid size to a fine grid size, which is typically selected based on the size of a manufacturing grid. In some embodiments the fine grid has the same grid size as the manufacturing grid, e.g. 5 nm.

Next, a sliced version of range pattern that is identified in act 1123 is mapped to the fine grain, i.e. digitized. Thereafter, in act 1133, the computer encodes the digitized sliced version of the range pattern (based on a sequence of bits representing the presence and absence of material, as described elsewhere herein), and then goes to act 1134. As noted above, each slice of a sliced version of the range pattern includes a number of fragments, and each fragment is a matrix of 0s or a matrix of 1s. During encoding in act 1113, the computer of some embodiments replaces each matrix of 0s by a single 0 and also replaces each matrix of 1s by a single 1. The computer of these embodiments further replaces each slice by a string of alternating 0s and 1s. The number of bits (i.e. 0s and 1s) in each slice's encoded value depends on the number of fragments therein. As noted above, in some embodiments, an additional bit 1 is encoded as the most significant bit of such an encoded value.

Next, in act 1134 (or in a subsequent act 1141) the computer checks for conditions to loop over acts 1135-1140, for example checks if the looping has been performed for each occurrence of the sliced version of the range pattern saved to computer memory in act 1123. As will be apparent to the skilled artisan, in most programming languages, either one of the two acts 1134 and 1141 are required, but not both. After entering the loop, in act 1135, the computer determines from computer memory the x coordinate and the y coordinate of the matching window which was saved in act 1123 as identifying the occurrence of the pattern in the layout. Next, in act 1136, the computer maps a sublayout within the matching window on to the fine grid.

Thereafter, in act 1137, the computer searches this sublayout using the encoded values of slices in the sliced version (which were encoded in act 1133). If during this searching in act 1137, a match is found, then in some embodiments the computer is programmed to further calculate a score for the matching occurrence in act 1138, using optimal value(s) and scoring function(s) which are also stored in the computer memory as described above in reference to FIG. 2J. In some embodiments, the closer the dimensions of the matching pattern in the layout to optimal values of the range pattern, the higher the score, although an inverse of such a scoring function may be used in other embodiments.

In act 1139, the computer determines a match location in actual layout. Next, in act 1141, the computer checks if each match saved in act 1123 has been verified using the fine grid as just described, and if so this method of FIG. 11C is completed and the computer returns. If in act 1141, the answer is no, the computer proceeds to act 1134 (described above).

Figure 12A:
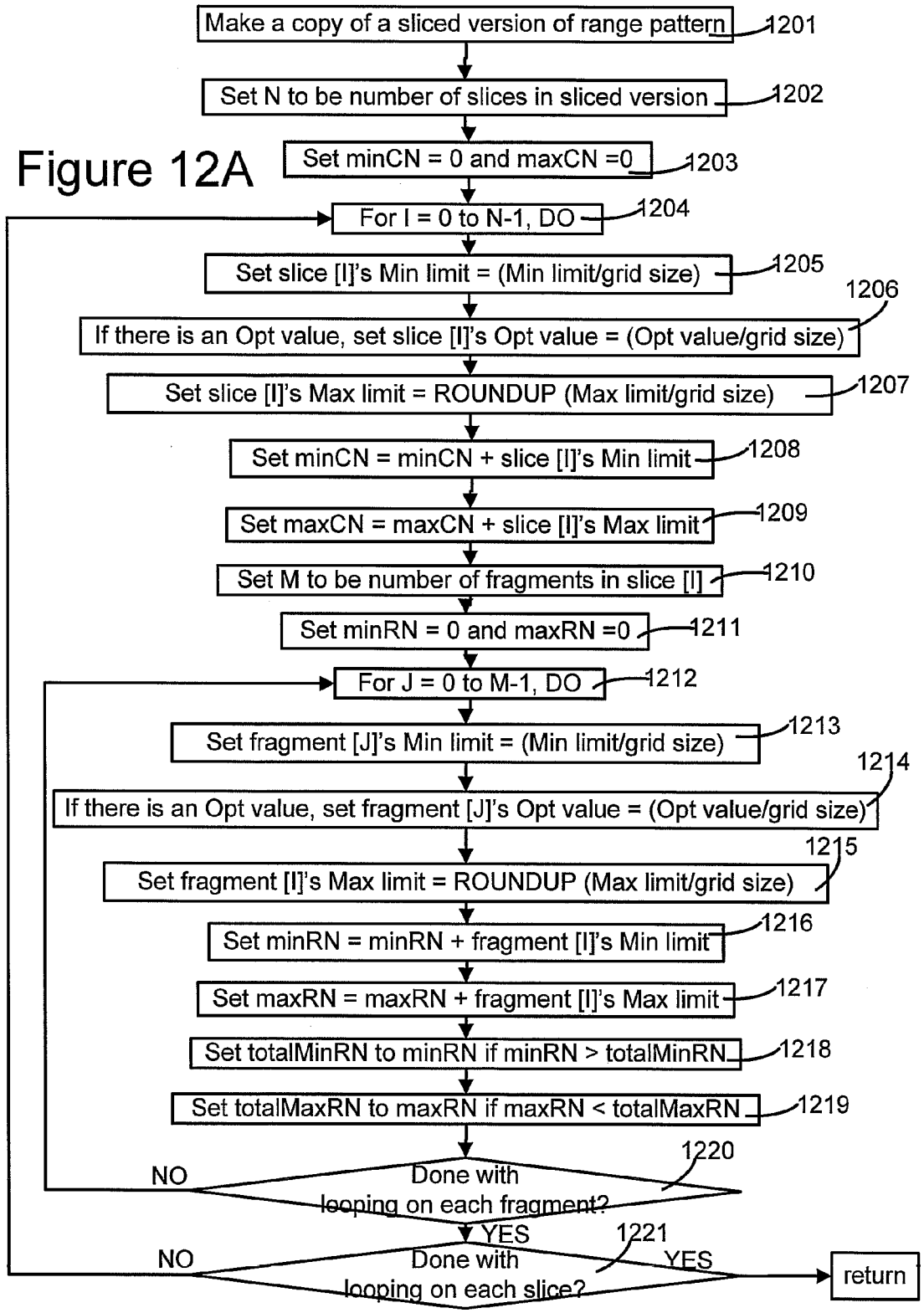
FIG. 12A illustrates, in a flow chart, a method for mapping a cutting slice on to a grid of a specified size, in some embodiments of the invention.

In some embodiments of the invention, acts 1132 and 1112 described above are implemented, to convert the dimensions in a sliced version of the range pattern into grid units (i.e. wherein grid size constitutes a grid unit), as illustrated in FIG. 12A. Specifically, in act 1201, the computer makes a copy of a sliced version of the range pattern, and thereafter goes to act 1202. In act 1202, the computer initializes a variable N to be equal to the number of slices in the sliced version. Next, in act 1203, the computer initializes two variables minCN and maxCN to the value 0. These two variables respectively represent the minimum limit and the maximum limit on the width of the range pattern, expressed in number of columns. Then the computer goes to act 1204 wherein a loop variable I is set (initially to zero and incremented to N-1) for looping over acts 1205-1221. Then, in act 1205, the computer sets slice [I]'s minimum limit for its width to be equal to (minimum limit/grid size). Note that the grid size can be different depending on whether a coarse grid or a fine grid is in use when this method is invoked.

Next in act 1206 the computer checks if there is an optimum value in the current slice's width, and if so sets slice [I]'s optimum value for width=(optimum value/grid size). Then in act 1207, the computer sets slice [I]'s maximum limit for width=ROUNDUP (maximum limit/grid size). Note that the function ROUNDUP performs a rounding up of a number's fraction value to the next whole number. Thereafter in acts 1208 and 1209, the computer increments minCN by the slice [I]'s minimum limit for width, and similarly increments maxCN by slice [I]'s maximum limit for width. Next, in act 1210, the computer initializes another variable M to be number of fragments in slice [I]. Then in act 1211, the computer initializes two variables minRN and maxRN to zero. These two variables respectively represent the minimum limit and the maximum limit on the length of slice [I], expressed in number of rows.

Then, the computer proceeds to act 1212 to set up the looping variable J (initially to zero and incremented to M-1) for looping over acts 1213-1220. Acts 1213-1217 convert the dimensions of fragments in a manner similar to the above-described acts 1205-1209. Specifically, in act 1213, the computer sets fragment [J]'s minimum limit for its length to be equal to (minimum limit/grid size). Next in act 1214 the computer checks if there is an optimum value in the current fragment's length, and if so sets fragment [J]'s optimum value for length=(optimum value/grid size). Then in act 1207, the computer sets fragment [J]'s maximum limit for length=ROUNDUP (maximum limit/grid size). Next, in acts 1216 and 1217, the computer increments the respective variables minRN and maxRN in the above-described manner, but now using the corresponding values of the fragment's limits.

Next, in acts 1218 and 1219, the computer sets two variables totalMinRN and totalMaxRN to corresponding values minRN and maxRN if these corresponding values are greater. Note that variables totalMinRN and totalMaxRN are initialized (not shown in FIG. 12A) to the respective values minRN and maxRN for the very first slice, i.e. when I is zero. Variables totalMinRN and totalMaxRN represent the overall limits for the range pattern as a whole, across all slices. Then the computer proceeds to act 1220 to check if it's done with looping on each fragment and if not, returns to act 1212 and if done then it goes to act 1221. In act 1221, the computer checks if it is done with looping on each slice, and if not returns to act 1204, and if done then this method (of FIG. 12A) is completed and the computer returns, to an appropriate one of acts 1132 and 1112 from which this method was invoked.

In some embodiments of the invention, encoding of a sliced version of the range pattern as described above in reference to FIGS. 11B and 11C, in the respective acts and 1113 and 1133 is performed as described next in reference to FIG. 12B. Specifically, in act 1231, the computer sets N to be the number of slices in the sliced version, and thereafter goes to act 1232. In act 1232, the computer sets a loop variable J to a value in the range 0 to N-1. Next, in act 1233, the computer sets the encoded value of slice [J] to be the value 1 which will form the prepended bit "1" in the final encoded value on completion of this method. Specifically, as noted above in reference to FIG. 5E, a bit "1" is prepended to be the most significant bit in some embodiments, in order to distinguish between bit sequences with a leading 0 and sequences with a leading 1 (obtained from digitized data).

Next, in act 1234, the computer sets M to be the number of fragments in slice [J]. Then the computer goes to act 1235 and sets the looping variable I to have a value in the range 0 and M-1. In several embodiments, the computer actually counts down, i.e. starts with M-1 as an initial value for the looping variable I, followed by decrementing this value in the next iteration. Next, in act 1236, the computer shifts the previously encoded value to the left by one bit, and then adds the current value. Specifically, the computer sets the encoded value of slice [J] to be equal to (previously encoded value times two)+ the current value of fragment [I] in slice [J]. Note that the resulting value will be thereafter shifted to the left once again in the next iteration and the next fragment's value is added herein.

Hence, an encoded value for a current slice is assembled, one fragment at a time. Note that acts 1235 and 1236 together replace each matrix (of 0s or 1s) for a fragment, by a single value (of 0 or 1) for that fragment, to implement a modified form of run length compression. The just-described encoding differs from traditional run length compression because the length of each bit (0 or 1) is not present within this encoded value. Instead, in such embodiments, the length of each fragment is maintained separately, in a field in the computer memory accessed by a data structure for the range pattern as illustrated in FIG. 8B.

Use of such an encoded value speeds up comparison of a slice in the layout to a slice in the range pattern, although a false positive can be identified by such comparison because specific dimensions are not compared when just the encoded values are compared. After act 1236, the computer goes to act 1237 and checks if looping on each of the fragments of the current slice has been completed and if not returns to act 1235. If looping has been completed in act 1237, the computer goes to act 1238. In act 1238 the computer checks if the looping has been completed on each slice in the sliced version, and if so returns to whichever step invoked this method and if the looping has not been completed then the computer returns to act 1232.

Figure 13A:
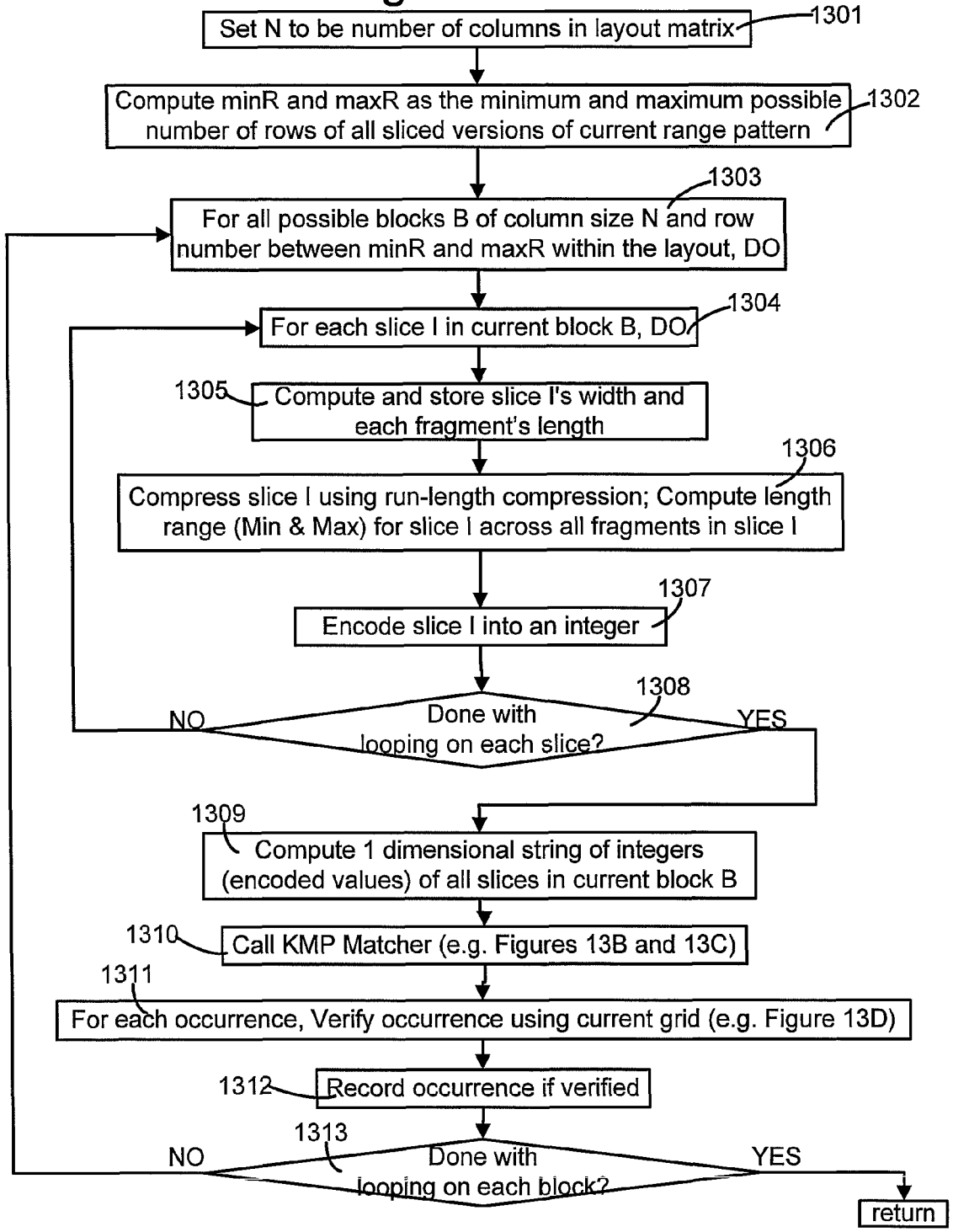
FIG. 13A illustrates, in a flow chart, a method of matching a range pattern to a layout, at the slice level, in some embodiments of the invention.

In some embodiments of the invention, comparison acts 1122 (FIG. 11B) and 1137 (FIG. 11C) are performed by implementing acts 1301-1310 as illustrated in FIG. 13A. Note that "VerifyOccurrence" is called in "WindowRPM" regardless of whether "WindowRPM" is invoked by "CoarseGridFilter" OR "FineGridVerifier". Specifically "VerifyOccurrence" is required at each stage to perform the checks on slice widths and fragment lengths and checks on other additional constraints.

Specifically, in act 1301, the computer sets N to be the number of columns in the layout matrix. Next, in act 1302, the computer computes minR and maxR as the minimum and maximum possible number of rows of all sliced versions of the range pattern which is been currently selected. Next, in act 1303, the computer initializes looping variables for acts 1304-1313. Specifically, the computer loops over all possible blocks B of columns size N and a row number between minR and maxR within the layout. While in some embodiments of act 1303, the computer is programmed to perform worm-like movement of a block as illustrated in FIG. 6G (described above), in other embodiments the computer is programmed to simply enumerate the blocks. The simple enumeration is performed, by starting with a block whose length is equal to the length of the matching window and whose height is equal to minR followed by increasing the height to maxR in an incremental manner, one row at a time, and when the block is of size maxR, the computer shifts the whole block up by one row (which represents one unit of grid size).

Next, the computer goes to act 1304 and initializes another looping variable I for looping over each slice in the current block B. Thereafter, the computer performs act 1305 to compute the width for slice [I] (e.g. by detecting a change in adjacent columns) and stores this value. Specifically, in some embodiments, the computer uses a block in the layout whose length is equal to the length of the matching window, and whose height is equal to minR and thereafter slices this layout block in the vertical direction by moving from left to right and checking if each successive column is same as the previous column and if not a slice is deemed to be completed (i.e. a slice boundary is detected), and a new slice is begun. In this manner, the boundary of a current slice [I] is identified and stored into computer memory. In act 1305, the computer also computes the length of each fragment within a slice. Next, the computer goes to act 1306 and compresses slice [I] using a modified run length compression as discussed above in reference to acts 1235 and 1236 in FIG. 12B. Next, in act 1307, the computer encodes the sequence of bits for slice [I] into an integer as described above, i.e. after prepending the bit "1" as its most significant bit, and stores the integer as the slice's encoded value. Thereafter, the computer goes to act 1308 and checks if looping on each slice has been completed and if not returns to act 1304.

In act 1308, if the looping has been completed on all of the slices, as identified by traversing the length of the block of the computer proceeds to act 1309. In act 1309, the computer computes a one dimensional string of integers (encoded values) of all of the slices in the current block. Thereafter, the computer goes to act 1310 and invokes a string matching method for comparing the one dimensional string from act 1309 to a corresponding string for encoded values of slices in the range pattern.

Figure 13B:
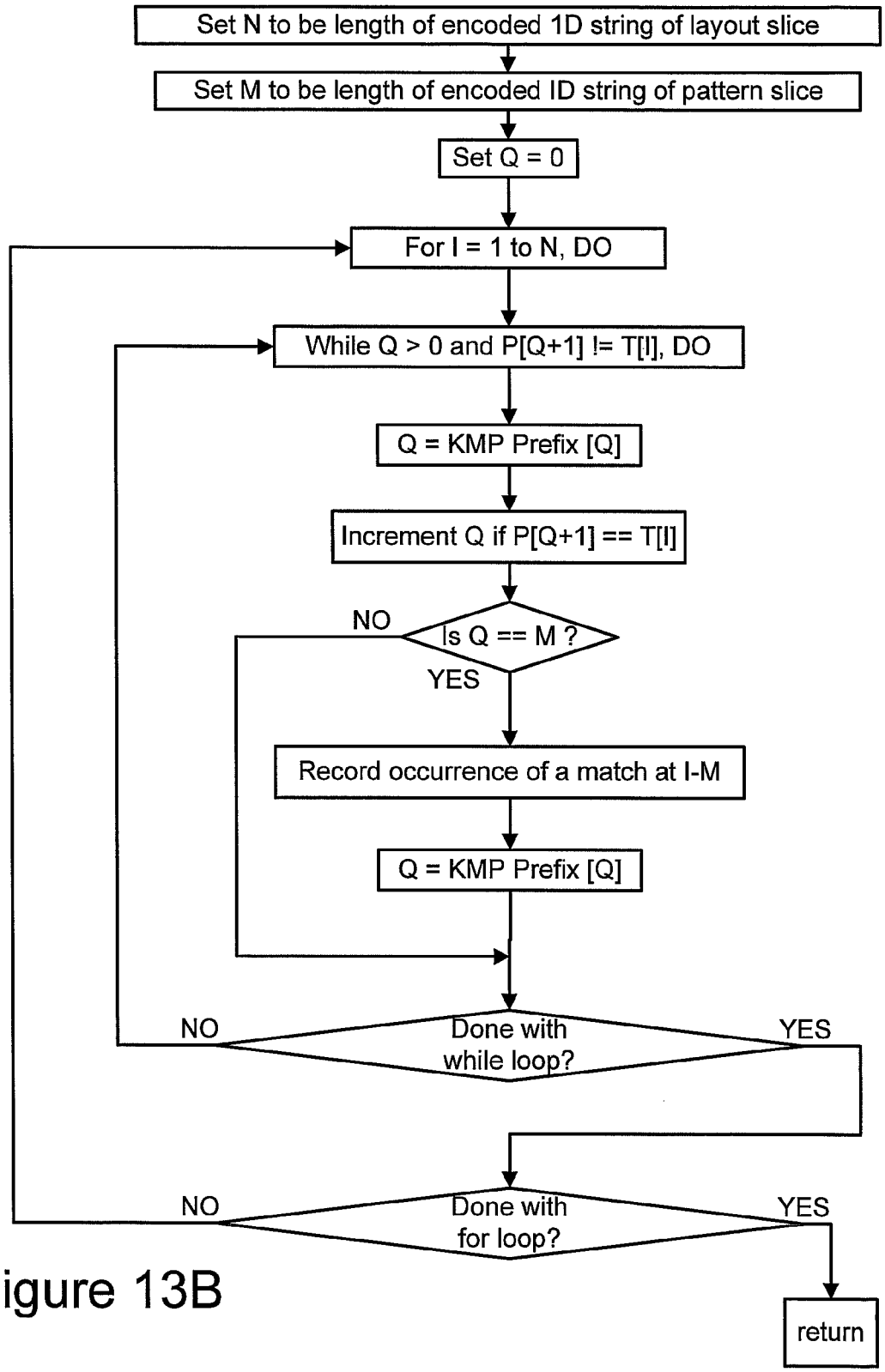
FIGS. 13B and 13C illustrate, in flow charts, a method of comparing two one dimensional strings, by applying the KMP string matching algorithm to encoded strings of slices of a layout and of a range pattern, in some embodiments of the invention.
Figure 13C:
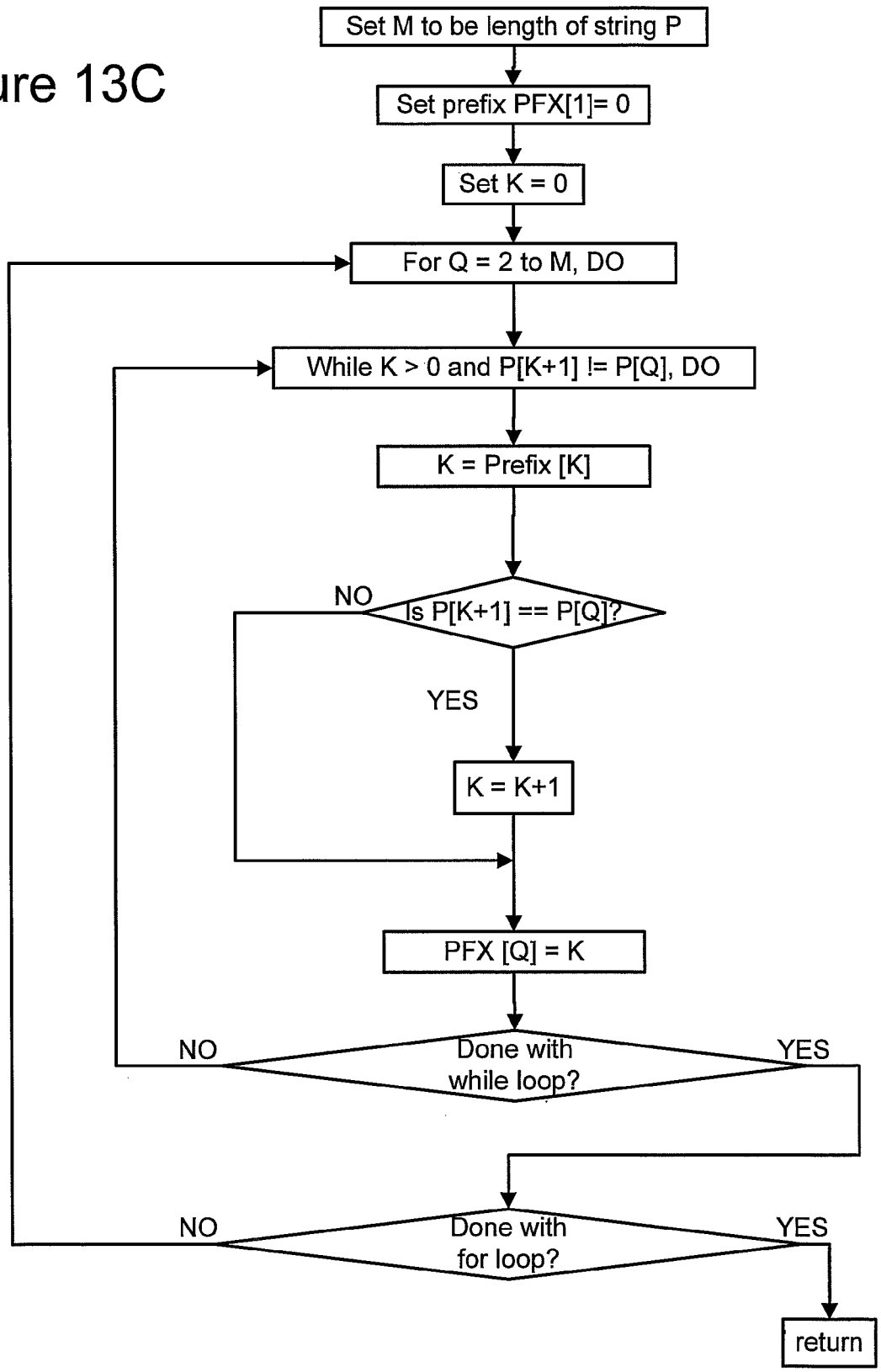

While any string matching method may be used, one illustrative embodiment uses a specific method called "Knuth-Morris-Pratt algorithm" shown in FIG. 13B (abbreviated as KMP method). The method of FIG. 13B uses a prefix function PFX[q], which is the length of the longest prefix of the string P that is also a proper suffix of the string Pq. Computation of the prefix function is shown in FIG. 13C. Note that the KMP algorithm (as used in text string matching) is well known in the art, and hence it is not described any further herein.

Next, in act 1311, the computer checks, for each occurrence of a potential match from act 1310, as to whether or not the potential match is confirmed by use of the current grid (coarse grid or fine grid depending on the current stage of processing). Next, the computer goes to act 1312 and records the occurrence of a verified match, if verification is successful in act 1311 and if verification is not successful the match is screened out. Next, the computer goes to act 1313 and checks if looping is completed on each block in the window and if not returns to act 1303, to perform the same acts for a new block. If looping has been completed on all blocks, i.e. the window has been completely traversed by block enumeration, then the computer returns from the method in FIG. 13A to whichever act invoked this method.

Figure 13D:
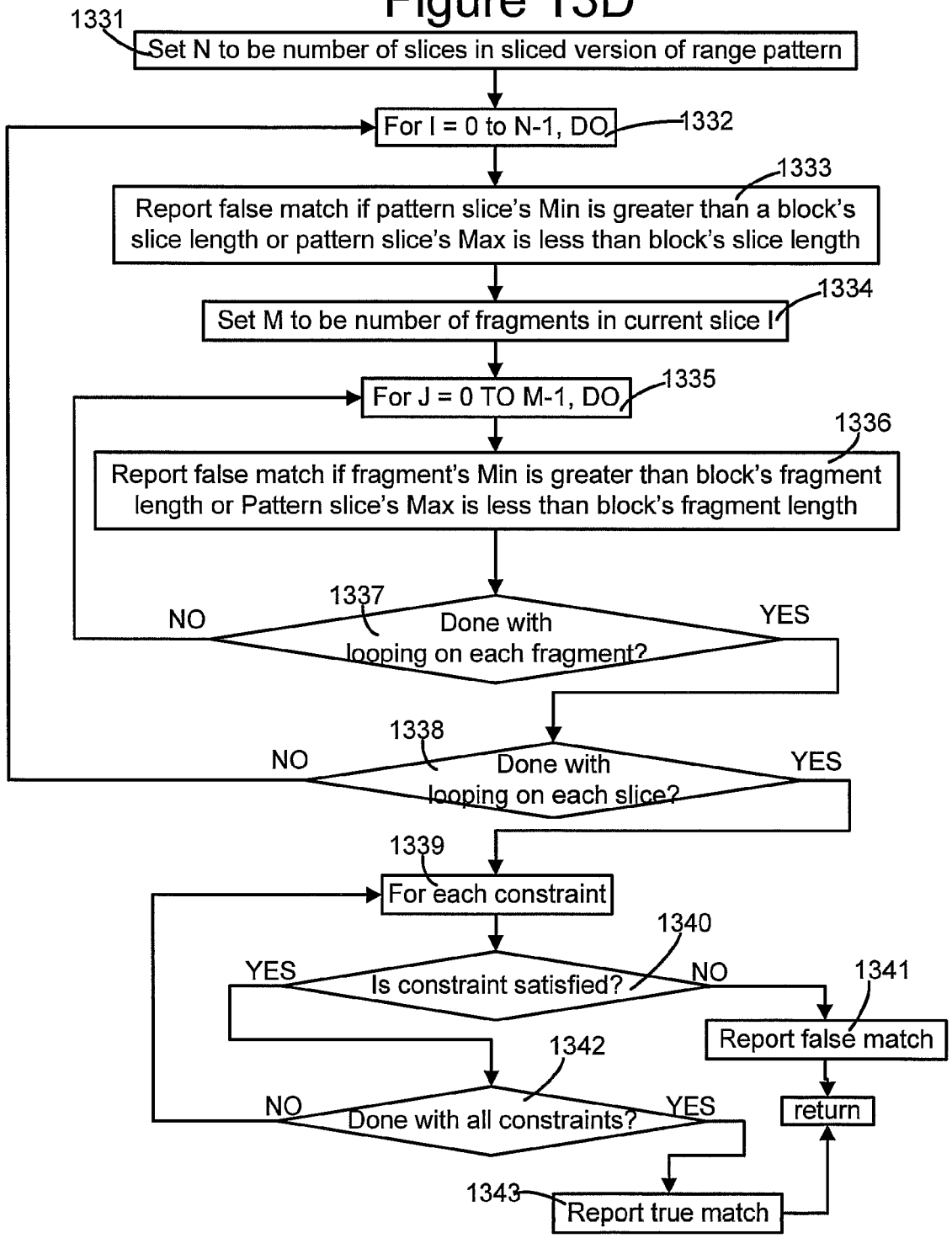
FIG. 13D illustrates, in a flow chart, a method of verifying at the fine level, a potential match of a range pattern to a block in the layout that has been identified by use of a coarse grid, in some embodiments of the invention.

Act 1311 of FIG. 13A is performed in some embodiments by the method illustrated in FIG. 13D. Specifically, in act 1331, the computer sets N to be the number of slices in the sliced version of the range pattern, and thereafter goes to act 1332 to set the value of a loop variable I to be in the range 0 to N−1. Thereafter the computer goes to act 1333 to report a false match if the slice in the range pattern has a minimum limit greater than the length of the slice in the block of the layout, or if the maximum limit of the slice of the range pattern is less than the block's slice length.

Thereafter, the computer repeats the above-described act 1333, to check on the dimensions of fragments in each slice [I]. Specifically, in act 1334, the computer sets M to be the number of fragments in current slice [I]. Thereafter the computer goes to act 1335 and sets the loop variable J to be a value in the range 0 to M−1. Then the computer goes to act 1336 to report a false match if the fragment [J] in the slice [I] has a minimum limit greater than the length of the fragment in the slice in the block of the layout, or if the maximum limit of the fragment in the range pattern is less than the block's fragment's length.

Next, the computer goes to act 1337 to check if looping has been completed on each fragment of a current slice [I] and if not the computer returns to act 1335. If looping has been completed in act 1337, the computer goes to act 1338 to check if looping has been completed on each slice of the range pattern, and if not the computer returns to act 1332. If looping has been completed on each slice, the computer goes to act 1339, to determine whether all constraints of the range pattern are satisfied. Specifically, in act 1339, the computer initializes any looping parameter (e.g. specified in the range pattern's data structure as the total number of constraints therein), and thereafter goes to act 1340 to check if a constraint that is specified in the range pattern is satisfied. If so, the computer goes to act 1342 to determine whether all constraints have been checked. If not checked, the computer returns to act 1339. When act 1342 determines that all constraints have been checked, the computer goes to act 1343 and reports a true match, and thereafter returns from performance of the current method (shown in FIG. 13D). In act 1340, if the constraint is not satisfied, the computer goes to act 1341 to report a false match, followed by returning from the current method.

Figure 14A:
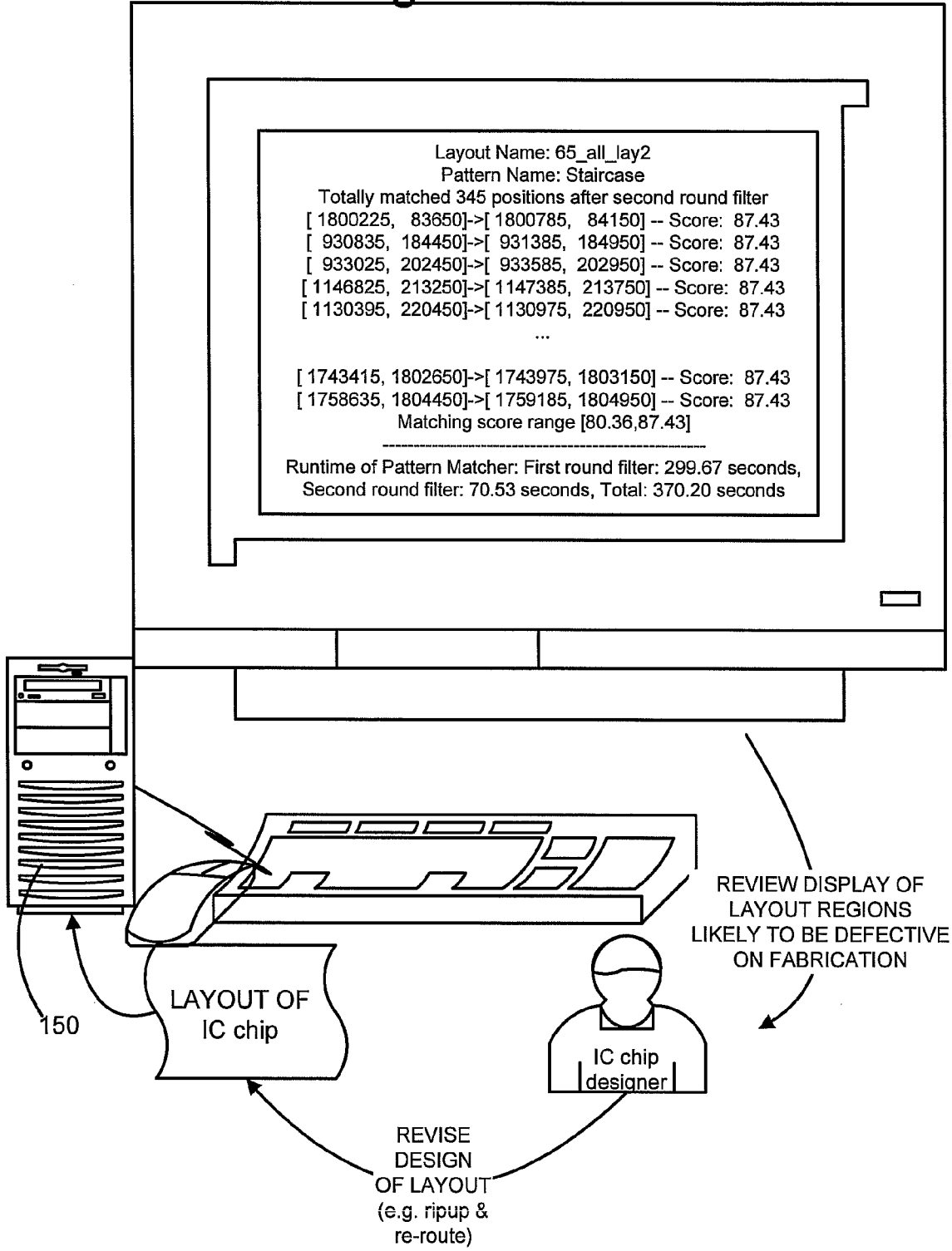
FIG. 14A illustrates, in a block diagram, optional software that may be included in a computer that has been programmed with a range pattern matcher and hotspot display software in some embodiments of the invention.
Figure 14B:
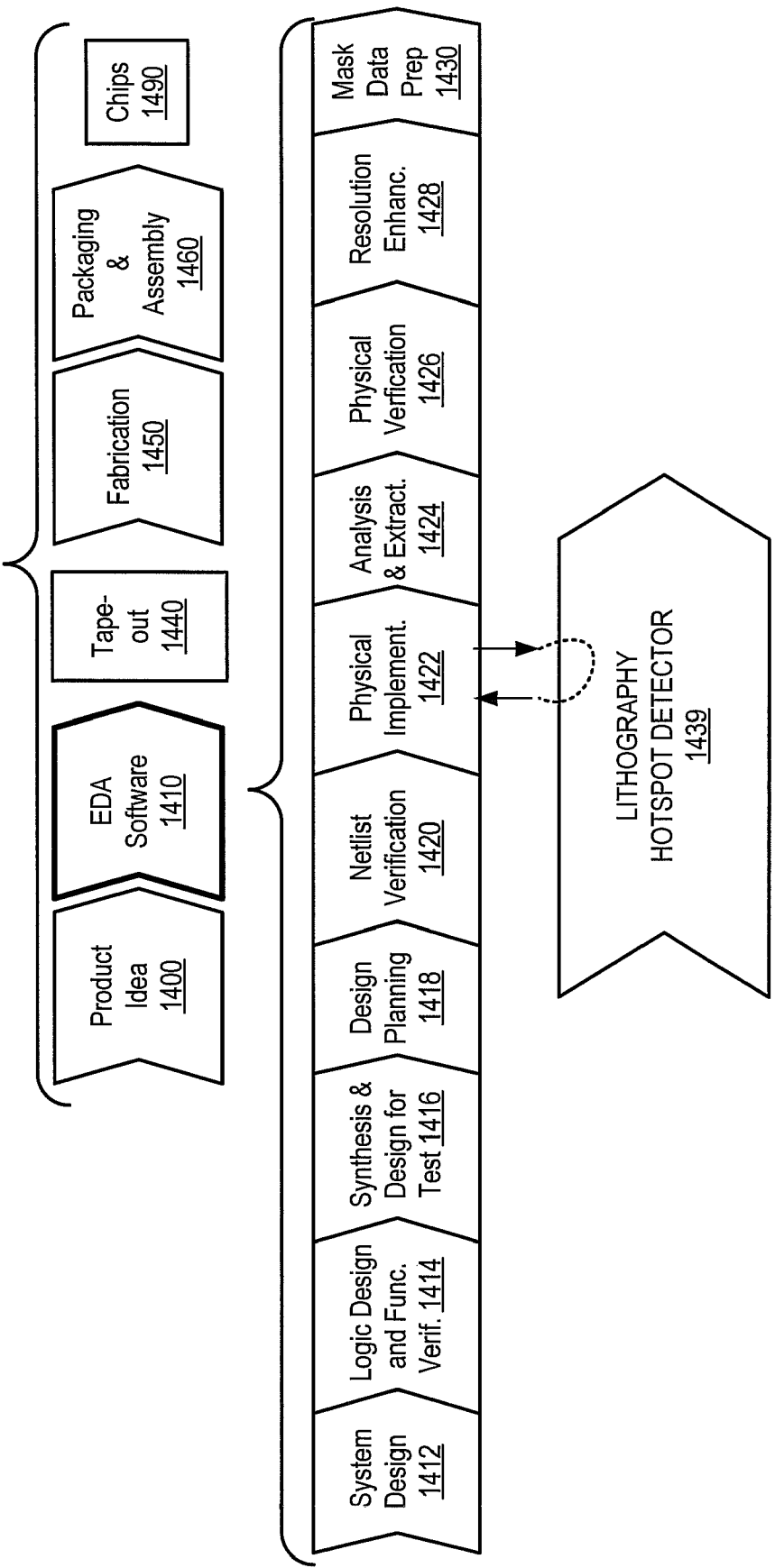
FIG. 14B illustrates, a simplified representation of an exemplary digital ASIC design flow in accordance with the invention.

Any lithography hotspot detection method of the type described above may be used in a digital ASIC design flow, which is illustrated in FIG. 14B in a simplified exemplary representation. At a high level, the process of designing a chip starts with the product idea (1400) and is realized in a EDA software design process (1410). When the design is finalized, it can be taped-out (event 1440). After tape out, the fabrication process (1450) and packaging and assembly processes (1460) occur resulting, ultimately, in finished chips (result 14140).

The EDA software design process (1410) is actually composed of a number of stages 1412-1430, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 1410) will now be provided.

System design (stage 1412): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 1414): At this stage, the VHDL or Verilog code for modules in the system is written and the design (which may be of mixed clock domains) is checked for functional accuracy. More specifically, the design is checked to ensure that it produces the correct outputs. Exemplary EDA software products from Synopsys, Inc. that can be used at this stage include VCS, VERA, DesignWare®, Magellan, Formality, ESP and LEDA products.

Synthesis and design for test (stage 1416): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products.

Design planning (stage 1418): Here, an overall floorplan for the chip is constructed and analyzed for timing and top-level routing. Exemplary EDA software products from Synopsys, Inc. that can be used at this stage include Jupiter and Flooplan Compiler products.

Netlist verification (stage 1420): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products.

Physical implementation (stage 1422): The placement (positioning of circuit elements) and routing (connection of the same) occurs at this step. Exemplary EDA software products from Synopsys, Inc. that can be used at this stage include the Astro product. Note that the output of this stage 1422 may be used in lithography hotspot detector 1439 as shown in FIG. 14B. Various embodiments of a lithography hotspot detector 1439 have been illustrated and described above in reference to FIG. 2A et seq. After reviewing the results displayed by lithography hotspot detector 1439, if not satisfied, a chip designer (FIG. 14A) may go back to stage 1422 to rip up and re-route portions of the layout as described above.

Although circuitry and portions thereof (such as rectangles) may be thought of at this stage as if they exist in the real world, it is to be understood that at this stage only a layout exists in a computer 150 (FIG. 14A) which has been programmed to implement a lithography hotspot detector 1439. The actual circuitry in the real world is created after this stage as discussed below.

Analysis and extraction (stage 1424): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 1426): At this stage various checking functions are performed to ensure correctness for: manufacturing, electrical issues, lithographic issues, and circuitry. Exemplary EDA software products from Synopsys, Inc. that can be used at this include the Hercules product.

Resolution enhancement (stage 1428): This involves geometric manipulations of the layout to improve manufacturability of the design. Exemplary EDA software products from Synopsys, Inc. that can be used at this include iN-Phase, Proteus, and AFGen products.

Mask data preparation (stage 1430): This provides the "tape-out" data for production of masks for lithographic use to produce finished chips. Exemplary EDA software products from Synopsys, Inc. that can be used at this include the CATS(R) family of products. Note that lithography hotspot detector 1439 may also be used with the output of this stage 1430, in some embodiments in accordance with the invention. Actual circuitry in the real world is created after this stage, in a wafer fabrication facility (also called "fab").

The data structures and/or software code for implementing one or more acts described in this detailed description can be encoded into a computer-readable medium, which may be any article of manufacture, such as a storage medium and/or a transmission medium that can hold code and/or data for use by a computer. Hence one article of manufacture in accordance with the invention can be any storage medium includes, but is not limited to, magnetic and optical storage devices such as disk drives containing one or more hard disk(s) or floppy disk(s), tape drives containing one or more magnetic tape(s), optical drives containing one or more CDs (compact discs) and/or DVDs (digital versatile discs). Moreover, another article of manufacture in accordance with the invention can be any transmission medium (with or without a carrier wave upon which the signals are modulated) which includes but is not limited to a wired or wireless communications network, such as the Internet.

In one embodiment, the article of manufacture includes computer instruction signals for carrying out one or more acts performed by methods illustrated in FIG. 3A et seq, and the computer instruction signals are present in a storage medium and/or a transmission medium. In another embodiment, such an article of manufacture includes computer data signals representing a range pattern, as illustrated in FIG. 2A et seq, with or without computer instruction signals that use the range pattern.

Note that a computer system 150 used in some embodiments to implement a hotspot detector 1439 of the type described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet).

FIGS. 15A and 15B illustrates data provided in a pattern format file in some embodiments of the invention, to specify a pattern in the cutting slice representation. Specifically, in FIG. 15A, the following four types of range constraints are specified. W for width. V for fragment height. U represents a unique value for a dimension (e.g. width or height) in the layout, which can be greater than or equal to specified value. The value U is only to be used for boundary values, and it means the value of the dimension is no less than the specified value. For non-boundary values of a dimension, instead of value U, the range flag R is to be used, as described below. Note that U values smaller than the coarse grid size are typically eliminated to avoid loss of matches. Whenever a dimension's boundary value is no more than the coarse grid size, the value is set as U to avoid missing matches.

In FIGS. 15A and 15B, R stands for range (slice width or fragment height in layout should be within specified range, and if the range is on the boundary, the computer must check outside the boundary of the matched area to make sure the dimension is really within the range). O and R stand for optimal value with a range (similar to just range R but with the addition of an optimal value O, which is used to calculate the matching score). D for don't care (any non-zero value for the dimension). The D symbol specifies a value for a dimension that is not constrained. However in one implementation, the computer simply counts the dimension's D value as 1. Therefore, a good practice is to avoid using D values too much so that the range of the number of rows or columns cannot be computed as the real pattern specification. Sometimes the user may use R to specify a range though there is no range constraint on the original pattern. Enforcing a redundant range constraint on a value does not cause the loss of any matches.

In these FIGS. 15A-15B, the following symbols are specified. C represents the length of repetition of the value in the vertical direction (e.g. C 2,1 1 refers to repetition length of $C_{2,1}$). S is the width of the slice (e.g. S 3 refers to width of slice $S_3$). The last value in V C 2,1 1 is the coefficient of the item. The combination of all such items forms a polynomial expression. After the value section of the polynomial, there is a section for the right hand values, with four types of values as follows. R represents range formed by the two right hand values. G represents greater than or equal to. L represents less than or equal to. E represents equal to. Equations are typically constructed using the right hand values, to specify constraints between slices.

Numerous modifications and adaptations of the embodiments described herein will become apparent to the skilled artisan in view of this disclosure. For example, the data structure illustrated in FIG. 2D can be used to represent patterns composed of any shapes (such as shapes used for optical proximity correction), although many embodiments are limited to patterns of only rectangles as illustrated in FIG. 2A ("drill" pattern), 2I ("staircase" pattern), 5B ("door" pattern) and 5G ("mountain" pattern).

Although left boundary and bottom boundary of a range pattern are used in some embodiments as known locations (as described above in reference to FIGS. 2H and 2I), other embodiments may use other boundaries such as a left boundary and a top boundary in which case one or more left edges of rectangle(s) located at the left boundary and one or more top edges of rectangle(s) located at the top boundary are identified in the respective storage locations 214A and 214B as illustrated in FIG. 2J.

Moreover, although in some embodiments, for certain sequence of acts are performed as illustrated in the attached figures and described herein, other embodiments perform such acts in a different order relative to the order of that has been shown. For example, in FIG. 10C act 1022 is performed after act 1021 in some embodiments, although in other embodiments act 1022 is performed before act 1021. Furthermore, in each of acts 1021 and 1022, sorting can be performed either on the maximum limits or on the minimum limits depending on the embodiment.

Note also that methods of the type described herein are highly parallelizable, in the sense that matching of each range pattern in a library can be performed independently by a corresponding number of processes (and/or processors) each of which has a copy of the IC layout.

As another example, although in some embodiments the KMP algorithm is used, other embodiments use other string matching algorithms. Examples of other string matching algorithms are well known in the art, and are described in, for example: (1) a book entitled "EXACT STRING MATCHING ALGORITHMS" by Christian Charras and Thierry Lecroq, Laboratoire d'Informatique de Rouen, Universite de Rouen, Faculté des Sciences et des Techniques, 76821 Mont-Saint-Aignan Cedex, FRANCE (2) an article entitled "A fast string matching algorithm" by R S Boyer and J S Moore, published in Communications of ACM, vol. 20, pp. 262-272, 1977 and (3) an article entitled "A Simple Fast Hybrid Pattern-Matching Algorithm" by Frantisek Franek, Christopher G. Jennings and W. F. Smyth, Algorithms Research Group, Department of Computing & Software, McMaster University, Hamilton ON L8S 4K1, Canada, by Editors A. Apostolico, M. Crochemore, and K. Park in Sixteenth Annual Symposium on Combinatorial Pattern Matching (CPM 2005), Lecture Notes in Computer Science, Vol. 3537, pp. 288-297, 2005 Springer-Verlag Berlin Heidelberg 2005. The just-described three documents are incorporated by reference herein in their entirety, to illustrate alternative embodiments that use string matching algorithms different from the KMP algorithm.

For example, several embodiments of the invention are used after optical proximity correction (OPC) in the resolution enhancement stage 1428 (see FIG. 14B), and work as described above in reference to FIG. 5H. Note that such embodiments do not use two grids as illustrated by acts 1101 and 1102 in FIG. 11A and instead all matching is done on a single grid, which uses as its pitch the same distance as (or smaller distance than) a size of the manufacturing grid.

Hence, if the manufacturing grid size is 5 nm for a given IC fabrication process, a single-grid embodiment may perform act 332 of the type illustrated in FIG. 3C in a post-OPC activity, using a grid of pitch 1 nm.

Figure 16:
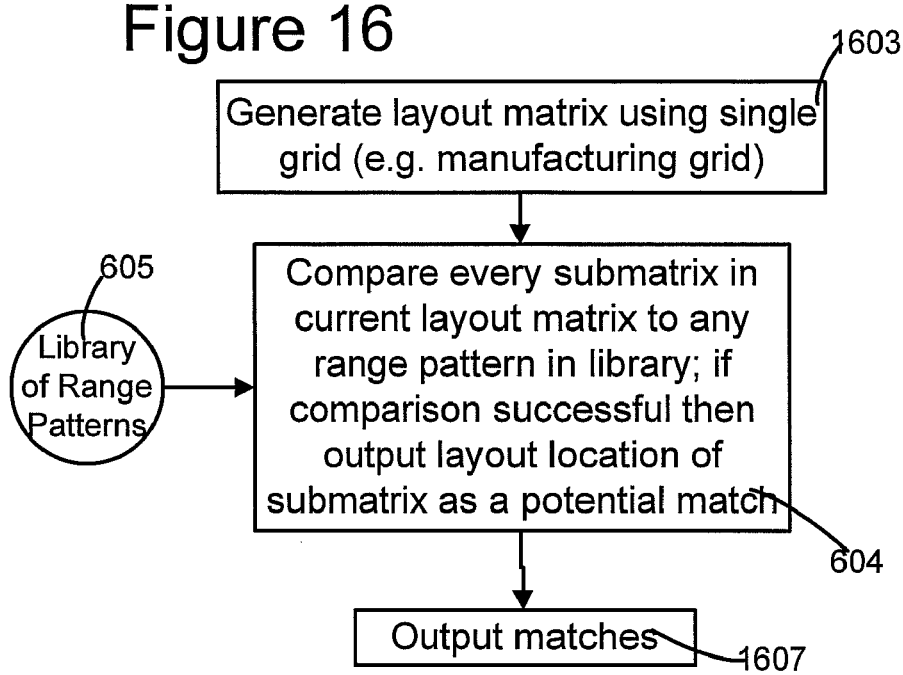

A single-grid method of some embodiments performs many of the same acts or similar acts as described above for two grid methods, except for the following differences. The single-grid method performs acts 1603, 604 and 1607 as illustrated in FIG. 16. FIG. 16 is derived from FIG. 6A by removing therefrom the acts that are not performed in the single-grid method. Act 1603 in FIG. 16 is similar to act 603 except that the layout matrix is generated using the single grid. Moreover act 1607 is similar to act 607 except that matches are output in act 1607.

Figure 17:
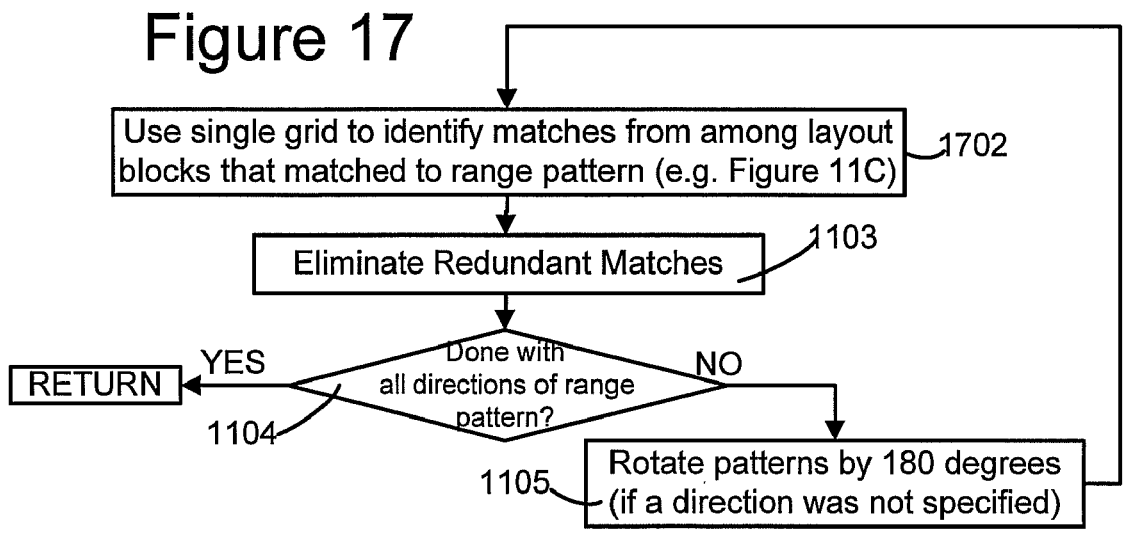

Similarly, FIG. 17 for a single grid method is derived from FIG. 11A, and act 1702 in FIG. 17 is similar to act 1102 in FIG. 11A, as it is applied to a single grid. Moreover, FIG. 18 for a single grid method is derived from FIG. 1B, and acts 1811, 1814, 1815 and 1821 in FIG. 18 are similar to corresponding acts 1111, 1114, 1115 and 1121 in FIG. 11B as applied to a single grid. Furthermore in FIG. 18, as shown in the dotted box, acts 1838-1840 are performed between acts 1122 and 1124, and these acts 1838-1840 are similar to corresponding acts 1138-1140 in FIG. 11D as applied to a single grid. Finally, FIG. 19 for a single grid method is derived from FIG. 13A, and act 1911 in FIG. 19 is similar to act 1311 in FIG. 13A, as it is applied to a single grid. Numerous such modifications to apply the various acts described herein to a single grid method will be apparent to the skilled artisan in view of this disclosure.

In several embodiments that use a single-grid method, the region of a layout within each window is supplied to one of several processors so that one or more acts of the type described herein are performed in parallel (to one another). As another example, parallel processing is not used in some embodiments wherein all regions of a layout are checked by a single processor because speed is not a constraint, e.g. when the activity is in the mask data preparation stage 1430 (FIG. 14B). As still another example, parallel processing is not used for layouts that fit within a single window, e.g. layouts for standard cells of a library for a given technology.

As will be apparent to the skilled artisan, the just-described standard cell library normally contains a number of cells which have both a logical and a physical representation. The logical representation describes behavior of the cell and can be represented by a truth-table or boolean algebra equation. The physical representation is the implementation of the logical description first as a netlist, which at its lowest level is a nodal description of transistor connections (commonly SPICE). After a transistor level netlist is created, a designer's chip design can "layed-out" by synthesis, place and route electronic design automation (EDA) tools to create actual physical representations of the transistors and connections in a format that can be manufactured (GDSII). The standard cell library is normally supplied to a chip designer, by a fabrication facility such as TSMC (Taiwan Semiconductor Manufacturing Company Ltd.).

As another example, instead of scoring defective locations as described above in reference to the formula f for the scoring function, an alternative embodiment performs range relaxation as follows. Specifically, this alternative embodiment starts by initially checking a layout by using a set of range patterns that have a large score (i.e. highest yield impact), which identifies defective locations of highest priority. The alternative embodiment follows this initial checking, by further checking with successive sets of range patterns that have intermediate scores (which identifies defective locations of intermediate priority), until reaching the set of range patterns that correspond to the smallest score (which yield the lowest priority defective locations). The just-described range relaxation is done systematically, by changing the minimum and maximum limits on the range of legal values for each dimension that can vary in a range pattern, to ensure that patterns in the layout that would otherwise match a range pattern are not missed.

Furthermore, as will be apparent to the skilled artisan, several embodiments of the type described herein result in re-routing of at least a portion of the layout including a block that matches a range pattern if at least the lengths of all layout fragments fall within the respective length ranges of the corresponding pattern fragments. Many such embodiments perform such re-routing in a prioritized sequence, based scores of respective blocks. After the re-routing is completed, some embodiments use the resulting modified layout to repeat the matching process all over again to find any additional defective locations that may now have arisen in view of the re-routing. If in such repetition, the same blocks are again targeted, the user is informed so that excessive looping (to optimize the same block again and again) is avoided.

Moreover, as noted above, some embodiments use two or more disjoint ranges for a given dimension of a range pattern. For example, the range pattern shown in FIG. 2A may have two ranges for the dimension "S" namely a first range of 90-120 nm and a second range of 180-210 nm. In this example, the first range covers patterns that are known to result in defective regions, due to minimum spacing requirements whereas the second range covers patterns that are poorly realized after fabrication with sub-resolution assist features (SRAF) due to use of pitches that are forbidden for use with SRAF (commonly known as "forbidden pitches"). Use of the two disjoint ranges in this example has eliminated the need to define two range patterns that are identical to one another except for the difference in the ranges for the given dimension. Also, note that some embodiments of range patterns include at least one rectangle that has two ranges, namely a width range and a length range.

Numerous modifications and adaptations of the embodiments described herein are encompassed by the scope of the invention.

What is claimed is:

1. A non-transitory computer-readable storage medium storing instructions that when executed by a processor, cause the processor to:

retrieve data including a plurality of positions of a corresponding plurality of line segments in a range pattern for modeling a defect in a first integrated circuit (IC) chip, the range pattern specifying at least one set of values comprising a maximum limit and a minimum limit of said defect relative to one of said line segments and a constraint on position of at least two of said line segments, wherein said defect in said first IC chip is a portion of a layout in said first IC chip satisfying said constraint and comprising an additional line segment at a position between the maximum limit and the minimum limit;

determine a match between said range pattern and a plurality of traces formed by material in a portion of a layout of a second IC chip based on said additional line segment, said match indicative of said defect; and mark said layout of the second IC chip as being selected for re-design in said portion to avoid said defect in fabrication of said plurality of traces based on said match.

2. The non-transitory computer-readable storage medium of claim 1, wherein said data further comprises:

a scoring formula representing a change in yield from fabrication of said second IC chip, as a function of a corresponding change in said position of said additional line segment relative to said maximum limit and said minimum limit.

3. The non-transitory computer-readable storage medium of claim 2, wherein:
said set of values comprises a value for a distance between said maximum limit and said minimum limit;
wherein a score is increased as said position of said additional line segment approaches said distance.

4. The non-transitory computer-readable storage medium of claim 1, wherein:
a plurality of ranges conform to design rule checking (DRC) rules of said fabrication.

5. The non-transitory computer-readable storage medium of claim 1, wherein:
at least four line segments in said range pattern are oriented relative to one another to form a rectangle; and
said set of values comprises an additional maximum limit and an additional minimum limit on a spacing between said rectangle and an additional rectangle in said range pattern.

6. The non-transitory computer-readable storage medium of claim 1, wherein:
said maximum limit and said minimum limit are represented by a boundary between two fragments within a slice of said range pattern obtained by slicing said range pattern, each slice in said range pattern is oriented parallel to another slice adjacent to said slice, and
a first fragment in said slice represents presence of a material in said first IC chip and a second fragment within said slice represents absence of said material, and said second fragment is adjacent to said first fragment.

7. The non-transitory computer-readable storage medium of claim 6, wherein:
said another slice has a third fragment; and
dimensions of said third fragment differ from dimensions of each of said first fragment and said second fragment.

8. The non-transitory computer-readable storage medium of claim 1, wherein:
said maximum limit and said minimum limit are represented by a width of a slice of said range pattern obtained by slicing said range pattern; and
each slice in said range pattern is oriented parallel to another slice adjacent thereto.

9. A non-transitory computer-readable storage medium storing instructions that when executed by a processor, cause the processor to:
retrieve data including a plurality of positions of a corresponding plurality of line segments in a range pattern for modeling a defect in a first integrated circuit (IC) chip, the range pattern specifying at least one set of values comprising a maximum limit and a minimum limit of said defect relative to one of said line segments and a constraint on position of at least two of said line segments, wherein said defect in said first IC chip is a portion of a layout in said first IC chip satisfying said constraint and comprising an additional line segment of a dimension between the maximum limit and the minimum limit; and
determine a match between said range pattern and a plurality of traces formed by material in a portion of a layout of a second IC chip based on said additional line segment, and to mark said layout of the second IC chip as being selected for redesign in said portion to avoid said defect in fabrication of said plurality of traces based on said match.

10. The non-transitory computer-readable storage medium of claim 9, wherein said data further comprises:
a scoring formula representing a change in yield from fabrication of said second IC chip, as a function of a corresponding change in said position of said additional line segment relative to said maximum limit and said minimum limit.

11. The non-transitory computer-readable storage medium of claim 10, wherein:
said set of values comprises a value for a distance between said maximum limit and said minimum limit;
wherein a score is increased as said position of said additional line segment approaches said distance.

12. The non-transitory computer-readable storage medium of claim 9, wherein:
a plurality of ranges conform to design rule checking (DRC) rules of said fabrication.

13. The non-transitory computer-readable storage medium of claim 9, wherein:
at least four line segments in said range pattern are oriented relative to one another to form a rectangle; and
said set of values comprises an additional maximum limit and an additional minimum limit on a spacing between said rectangle and an additional rectangle in said range pattern.

14. The non-transitory computer-readable storage medium of claim 9, wherein:
said maximum limit and said minimum limit are represented by a boundary between two fragments within a slice of said range pattern obtained by slicing said range pattern,
each slice in said range pattern is oriented parallel to another slice adjacent to said slice, and
a first fragment in said slice represents presence of a material in said first IC chip and a second fragment within said slice represents absence of said material, and said second fragment is adjacent to said first fragment.

15. The non-transitory computer-readable storage medium of claim 14, wherein:
said another slice has a third fragment; and
dimensions of said third fragment differ from dimensions of each of said first fragment and said second fragment.

16. The non-transitory computer-readable storage medium of claim 9, wherein:
said maximum limit and said minimum limit are represented by a width of a slice of said range pattern obtained by slicing said range pattern; and
each slice in said range pattern is oriented parallel to another slice adjacent thereto.

17. An integrated circuit (IC) fabricated by a method comprising:
by a computing processor, retrieving data including a plurality of positions of a corresponding plurality of line segments in a range pattern for modeling a defect in a first IC chip, the range pattern specifying a maximum limit and a minimum limit of said defect relative to one of said line segments, and a constraint on position of at least two of said line segments, wherein said defect in said first IC chip is a portion of a layout in said first IC chip satisfying said constraint and comprising an additional line segment at a position between the maximum limit and the minimum limit;
determining a match between said range pattern and a plurality of traces formed by material in a portion of a layout of an IC design based on said additional line segment, said match indicative of said defect; and identifying said layout of the said IC design as being selected for re-design in said portion to avoid said defect in fabrication of said plurality of traces based on said match.

18. The integrated circuit of claim 17, wherein said data further comprises a scoring formula representing a change in yield from fabrication of said IC design, as a function of a corresponding change in said position of said additional line segment relative to said maximum limit and said minimum limit.

19. An integrated circuit (IC) fabricated by a method comprising:

by a computing processor, retrieving a range pattern for modeling a defect in a first IC chip, the range pattern specifying for said defect a maximum limit and a minimum limit relative to one of said line segments and a constraint on position of at least two of said line segments, wherein said defect in said first IC chip is a portion of a layout in said first IC chip satisfying said constraint and comprising an additional line segment at a position between the maximum limit and the minimum limit;

determining a match between said range pattern and a plurality of traces formed by material in a portion of a layout of an IC design based on said additional line segment, said match indicative of said defect; and identifying said layout of the said IC design as being selected for re-design in said portion to avoid said defect in fabrication of said plurality of traces based on said match.

20. The integrated circuit of claim 19, wherein said data further comprises a scoring formula representing a change in yield from fabrication of said IC design, as a function of a corresponding change in said position of said additional line segment relative to said maximum limit and said minimum limit.

21. A method of matching a range pattern to a block of a layout of a material in a layer in an integrated circuit (IC) chip, the method comprising:

by a computing processor, retrieving a range pattern for modeling a defect in a first IC chip, the range pattern specifying for said defect a maximum limit and a minimum limit relative to one of said line segments and a constraint on position of at least two of said line segments, wherein said defect in said first IC chip is a portion of a layout in said first IC chip satisfying said constraint and comprising an additional line segment at a position between the maximum limit and the minimum limit;

determining a match between said range pattern and a plurality of traces formed by material in a portion of a layout of an IC design based on said additional line segment, said match indicative of said defect; and identifying said layout of the said IC design as being selected for re-design in said portion to avoid said defect in fabrication of said plurality of traces based on said match.

22. The method of claim 21, wherein a plurality of ranges of said range pattern conform to design rule checking (DRC) rules of said fabrication.

* * * * *